(12) United States Patent
Takeda et al.

(10) Patent No.: US 9,496,503 B2
(45) Date of Patent: Nov. 15, 2016

(54) ORGANIC COMPOUND, LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Kyoko Takeda, Kanagawa (JP); Satoshi Seo, Kanagawa (JP); Hiromi Seo, Kanagawa (JP); Tatsuyoshi Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 266 days.

(21) Appl. No.: 14/220,398

(22) Filed: Mar. 20, 2014

(65) Prior Publication Data

US 2014/0284578 A1 Sep. 25, 2014

(30) Foreign Application Priority Data

Mar. 25, 2013 (JP) ................................. 2013-062142

(51) Int. Cl.
*H01L 51/50* (2006.01)
*H01L 51/00* (2006.01)

(52) U.S. Cl.
CPC ......... *H01L 51/006* (2013.01); *H01L 51/0052* (2013.01); *H01L 51/0061* (2013.01); *H01L 51/0073* (2013.01); *H01L 51/0074* (2013.01); *H01L 51/5016* (2013.01)

(58) Field of Classification Search
None
See application file for complete search history.

(56) References Cited

U.S. PATENT DOCUMENTS

2007/0141387 A1 6/2007 Nakano et al.
2009/0160323 A1 6/2009 Nomura et al.
(Continued)

FOREIGN PATENT DOCUMENTS

JP 2009-298767 A 12/2009
WO WO 2011/021520 A1 2/2011

OTHER PUBLICATIONS

Goushi, K. et al., "Efficient Organic Light-Emitting Diodes Through Up-Conversion from Triplet to Singlet Excited States of Exciplexes," Applied Physics Letters, Jul. 12, 2012, vol. 101, No. 2, pp. 023306-1-023306-4.

*Primary Examiner* — Gregory Clark
(74) *Attorney, Agent, or Firm* — Husch Blackwell LLP

(57) ABSTRACT

An organic compound having a low HOMO level and a high hole-transport property is provided. The organic compound is represented by Formula (G1), where $Ar^1$ represents a substituted or unsubstituted fluorenyl group, $Ar^2$ represents a substituted or unsubstituted aryl group having 6 to 13 carbon atoms, and $A^1$ represents any one of a substituted or unsubstituted dibenzofuranyl group and a substituted or unsubstituted dibenzothiophenyl group. The low HOMO level and the high hole-transport property of the organic compound allow the formation of an exciplex with another organic compound, which leads to a highly efficient light-emitting element in the presence of a phosphorescent compound due to the effective overlapping between the emission of the exciplex and the longest absorption band of the phosphorescent compound.

(G1)

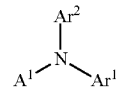

19 Claims, 20 Drawing Sheets

(56) References Cited

U.S. PATENT DOCUMENTS

| | | |
|---|---|---|
| 2011/0248246 A1 | 10/2011 | Ogita et al. |
| 2012/0146014 A1 | 6/2012 | Kato |
| 2012/0205632 A1 | 8/2012 | Shitagaki et al. |
| 2012/0205687 A1 | 8/2012 | Yamazaki et al. |
| 2014/0042412 A1* | 2/2014 | Ryu .................... H01L 51/0059 257/40 |
| 2014/0291643 A1 | 10/2014 | Ogita et al. |

* cited by examiner

ORGANIC COMPOUND, LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

One embodiment of the present invention relates to an organic compound. One embodiment of the present invention further relates to a light-emitting element, a light-emitting device, an electronic device, and a lighting device each of which uses the organic compound.

2. Description of the Related Art

In recent years, research and development have been extensively conducted on light-emitting elements using electroluminescence (EL). In a basic structure of a light-emitting element, a layer containing a light-emitting substance is interposed between a pair of electrodes. By voltage application to this element, light emission can be obtained from the light-emitting substance.

Such a light-emitting element is a self-luminous element and has advantages over liquid crystal displays, such as high visibility of pixels and no need of a backlight; thus, the light-emitting element is thought to be suitable as a flat panel display element. Besides, the light-emitting element has advantages in that it can be manufactured to be thin and lightweight, and has very fast response speed.

Furthermore, since the light-emitting element can be formed in a film form, it is possible to provide planar light emission; thus, a large-area element utilizing planar light emission can be easily formed. This feature is difficult to obtain with point light sources typified by incandescent lamps and LEDs or linear light sources typified by fluorescent lamps. Thus, the light-emitting element also has great potential as a planar light source applicable to lighting and the like.

Light-emitting elements utilizing electroluminescence can be broadly classified according to whether a light-emitting substance is an organic compound or an inorganic compound. In the case of an organic EL element in which a layer containing an organic compound used as a light-emitting substance is provided between a pair of electrodes, application of voltage to the light-emitting element causes injection of electrons from a cathode and holes from an anode into the layer containing the organic compound having a light-emitting property and thus current flows. The injected electrons and holes then lead the organic compound to its excited state, so that light emission is obtained from the excited organic compound.

The excited state formed by an organic compound can be a singlet excited state or a triplet excited state. Light emission from the singlet excited state (S*) is called fluorescence, and light emission from the triplet excited state (T*) is called phosphorescence.

In improving element characteristics of the light-emitting element, there are many problems which depend on a substance, and in order to solve the problems, improvement of an element structure, development of a substance, and the like have been carried out. For example, Patent Document 1 discloses a carbazole derivative having a high hole-transport property as an organic compound that can be used for forming a light-emitting element with high emission efficiency.

REFERENCE

Patent Document

[Patent Document 1] Japanese Published Patent Application No. 2009-298767

SUMMARY OF THE INVENTION

As described above, in improving the characteristics of a light-emitting element, it is of importance to develop an organic compound with characteristics suitable for a light-emitting element. In one embodiment of the present invention, a novel organic compound which has a low HOMO level and a hole-transport property is provided. In addition, a light-emitting element having high emission efficiency as well as a light-emitting element giving short-wavelength (approximately 450 nm to 550 nm) emission at high efficiency is provided by using a novel organic compound of one embodiment of the present invention.

One embodiment of the present invention is a novel organic compound which has a low HOMO level and a hole-transport property. Specifically, one embodiment of the present invention is an organic compound represented by General Formula (G1).

(G1)

In the formula, $Ar^1$ represents a substituted or unsubstituted fluorenyl group, $Ar^2$ represents a substituted or unsubstituted aryl group having 6 to 13 carbon atoms, and $A^1$ represents any one of a substituted or unsubstituted dibenzofuranyl group and a substituted or unsubstituted dibenzothiophenyl group. Note that when $Ar^1$, $Ar^2$, or $A^1$ has one or more substituents, the substituent is any one of an alkyl group having 1 to 4 carbon atoms and an aryl group having 6 to 13 carbon atoms. Note that the aryl group does not include a heteroaryl group. The substituents may be bonded to each other to form a ring.

Another embodiment of the present invention is an organic compound represented by General Formula (G2).

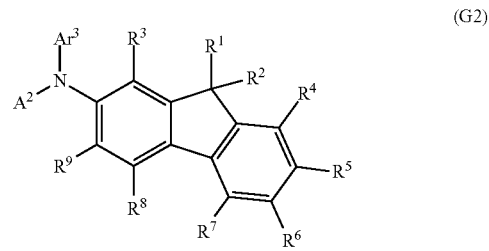

(G2)

In the formula, $Ar^3$ represents a substituted or unsubstituted aryl group having 6 to 13 carbon atoms, and $A^2$ represents any one of a substituted or unsubstituted dibenzofuranyl group and a substituted or unsubstituted dibenzothiophenyl group. $R^1$ to $R^9$ separately represent any one of hydrogen, an alkyl group having 1 to 4 carbon atoms, and an aryl group having 6 to 13 carbon atoms. When $Ar^3$ or $A^2$ has one or more substituents, the substituent of $Ar^3$ or $A^2$ is any one of an alkyl group having 1 to 4 carbon atoms and an aryl group having 6 to 13 carbon atoms. Note that the aryl group does not include a heteroaryl group. The substituents may be bonded to each other to form a ring.

A further embodiment of the present invention is an organic compound represented by General Formula (G3).

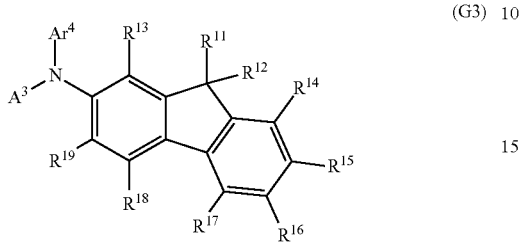

(G3)

In the formula, $Ar^4$ represents a substituted or unsubstituted biphenyl group, and $A^3$ represents any one of a substituted or unsubstituted dibenzofuranyl group and a substituted or unsubstituted dibenzothiophenyl group. $R^{11}$ to $R^{19}$ separately represent any one of hydrogen, an alkyl group having 1 to 4 carbon atoms, and an aryl group having 6 to 13 carbon atoms. When $Ar^4$ or $A^3$ has one or more substituents, the substituent of $Ar^4$ or $A^3$ is any one of an alkyl group having 1 to 4 carbon atoms and an aryl group having 6 to 13 carbon atoms. Note that the aryl group does not include a heteroaryl group. The substituents may be bonded to each other to form a ring.

A still further embodiment of the present invention is an organic compound represented by General Formula (G4).

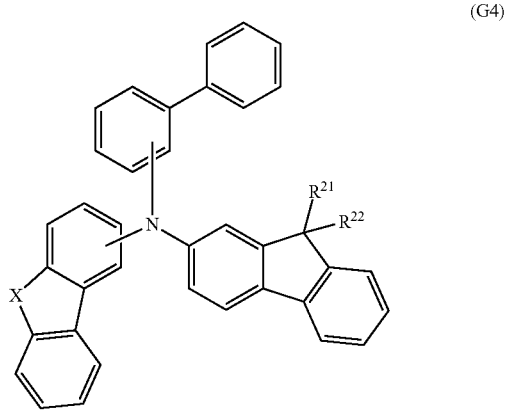

(G4)

In the formula, X represents any one of oxygen and sulfur, and $R^{21}$ and $R^{22}$ separately represent any one of hydrogen, an alkyl group having 1 to 4 carbon atoms, and an aryl group having 6 to 13 carbon atoms. Note that the aryl group does not include a heteroaryl group. In addition, $R^{21}$ and $R^{22}$ may be bonded to each other to form a ring.

A yet still further embodiment of the present invention is an organic compound represented by Structural Formula (100).

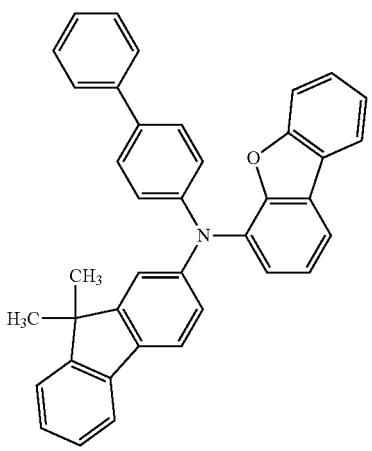

(100)

Each of the organic compounds of embodiments of the present invention which are represented by General Formulae (G1) to (G4) and Structural Formula (100) has a structure in which a substituted or unsubstituted dibenzofuranyl group or a substituted or unsubstituted dibenzothiophenyl group is directly bonded to an amine nitrogen. Because of this structure, the organic compound can have a low HOMO level and a high hole-transport property.

Note that the above organic compounds of embodiments of the present invention, which are novel organic compounds having a low HOMO level and a hole-transport property, can each form an exciplex (an excited complex) when combined with another organic compound. Additionally, the exciplex can have high energy as well as the high hole-transport property owing to the low HOMO level of the organic compound of one embodiment of the present invention. This is effective particularly when the exciplex is combined with a light-emitting substance (a guest material) which converts triplet excitation energy into light emission and which has a short emission wavelength (e.g., approximately 450 nm to 550 nm).

Thus, when an exciplex containing the organic compound of one embodiment of the present invention and a guest material which has a short emission wavelength (e.g., approximately 450 nm to 550 nm) are contained in a light-emitting layer of a light-emitting element, the light-emitting element can have high emission efficiency.

Other embodiments of the present invention are not only a light-emitting device including the light-emitting element but also an electronic device and a lighting device each including the light-emitting device. Therefore, the light-emitting device in this specification refers to an image display device and a light source (e.g., a lighting device). In addition, the light-emitting device includes, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

In one embodiment of the present invention, a novel organic compound which has a low HOMO level and a hole-transport property can be provided. In addition, a light-emitting element having high emission efficiency, especially a light-emitting element giving short-wavelength (approximately 450 nm to 550 nm) emission at high efficiency can be provided by using a novel organic compound of one embodiment of the present invention. Further, it is possible to provide a light-emitting element, a light-emitting device, an electronic device, or a lighting device with low power consumption.

DETAILED DESCRIPTION OF THE INVENTION

Figure 1:
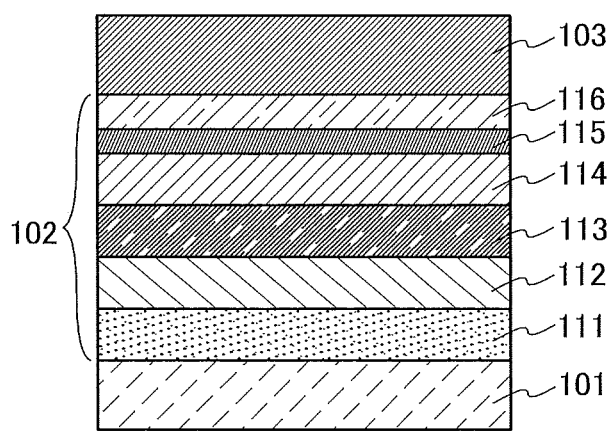
FIG. 1 illustrates a structure of a light-emitting element.

Hereinafter, embodiments of the present invention will be described with reference to the drawings. Note that the present invention is not limited to the following description, and modes and details thereof can be modified in various ways without departing from the spirit and scope of the invention. Thus, the present invention should not be construed as being limited to the description in the following embodiments and examples.

Embodiment 1

In this embodiment, organic compounds of embodiments of the present invention will be described.

An organic compound of one embodiment of the present invention is represented by General Formula (G1).

(G1)

In General Formula (G1), $Ar^1$ represents a substituted or unsubstituted fluorenyl group, $Ar^2$ represents a substituted or unsubstituted aryl group having 6 to 13 carbon atoms, and $A^1$ represents any one of a substituted or unsubstituted dibenzofuranyl group and a substituted or unsubstituted dibenzothiophenyl group. Note that when $Ar^1$, $Ar^2$, or $A^1$ has one or more substituents, the substituent is any one of an alkyl group having 1 to 4 carbon atoms and an aryl group having 6 to 13 carbon atoms. Note that the aryl group does not include a heteroaryl group. The substituents may be bonded to each other to form a ring.

An organic compound of one embodiment of the present invention is represented by General Formula (G2).

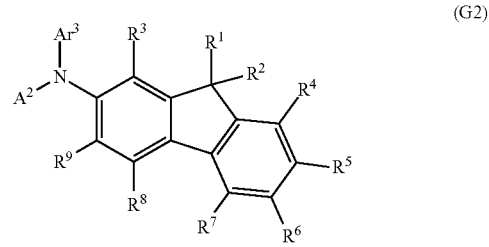

(G2)

In General Formula (G2), $Ar^3$ represents a substituted or unsubstituted aryl group having 6 to 13 carbon atoms, and $A^2$ represents any one of a substituted or unsubstituted dibenzofuranyl group and a substituted or unsubstituted dibenzothiophenyl group. $R^1$ to $R^9$ separately represent any one of hydrogen, an alkyl group having 1 to 4 carbon atoms, and an aryl group having 6 to 13 carbon atoms. When $Ar^3$ or $A^2$ has one or more substituents, the substituent of $Ar^3$ or $A^2$ is any one of an alkyl group having 1 to 4 carbon atoms and an aryl group having 6 to 13 carbon atoms. Note that the aryl group does not include a heteroaryl group. The substituents may be bonded to each other to form a ring.

An organic compound of one embodiment of the present invention is represented by General Formula (G3).

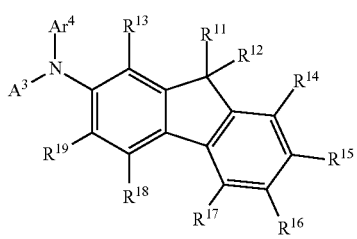
(G3)

In General Formula (G3), $Ar^4$ represents a substituted or unsubstituted biphenyl group, and $A^3$ represents any one of a substituted or unsubstituted dibenzofuranyl group and a substituted or unsubstituted dibenzothiophenyl group. $R^{11}$ to $R^{19}$ separately represent any one of hydrogen, an alkyl group having 1 to 4 carbon atoms, and an aryl group having 6 to 13 carbon atoms. When $Ar^4$ or $A^3$ has one or more substituents, the substituent of $Ar^4$ or $A^3$ is any one of an alkyl group having 1 to 4 carbon atoms and an aryl group having 6 to 13 carbon atoms. Note that the aryl group does not include a heteroaryl group. The substituents may be bonded to each other to form a ring.

An organic compound of one embodiment of the present invention is represented by General Formula (G4).

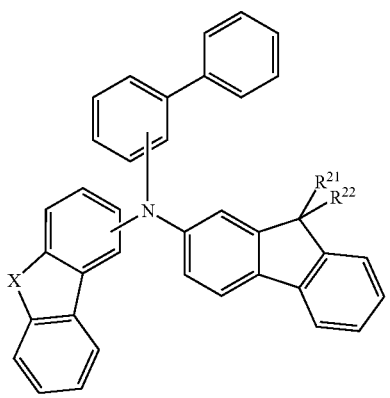
(G4)

In General Formula (G4), X represents any one of oxygen and sulfur, and $R^{21}$ and $R^{22}$ separately represent any one of hydrogen, an alkyl group having 1 to 4 carbon atoms, and an aryl group having 6 to 13 carbon atoms. Note that the aryl group does not include a heteroaryl group. In addition, $R^{21}$ and $R^{22}$ may be bonded to each other to form a ring.

The substituents available on $Ar^1$ and $Ar^2$ in General Formula (G1) and $Ar^3$ and $Ar^4$ in General Formulae (G2) and (G3), respectively, are an alkyl group having 1 to 4 carbon atoms and an aryl group having 6 to 13 carbon atoms. Specific examples of the alkyl group having 1 to 4 carbon atoms include a methyl group, an ethyl group, a propyl group, an isopropyl group, a butyl group, a sec-butyl group, an isobutyl group, and a tert-butyl group. Specific examples of the aryl group having 6 to 13 carbon atoms include a phenyl group, a tolyl group, a xylyl group, a mesityl group, a biphenyl group, a naphthyl group, and a fluorenyl group. Further, the substituents may be bonded to each other to form a ring; a spirofluorenyl group is regarded as a group having substituents which are bonded to each other to form a ring (that is, a spirofluorenyl group is a 9,9-diphenylfluorenyl group whose two phenyl groups are bonded to each other to form a ring).

Specific examples of $Ar^2$ in General Formula (G1) and $Ar^3$ in General Formula (G2) include substituents represented by Structural Formulae (1-1) to (1-11). Structural Formulae (1-7) to (1-11) show specific examples of $Ar^2$ and $Ar^3$ having a substituent. The structure represented by Structural Formula (1-10) is a case where the substituents are bonded to each other to form a ring.

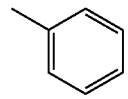
(1-1)

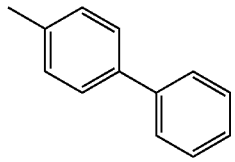
(1-2)

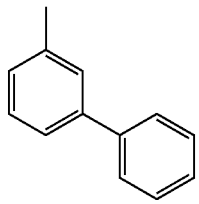
(1-3)

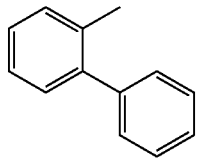
(1-4)

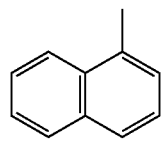
(1-5)

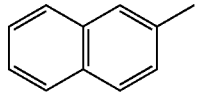
(1-6)

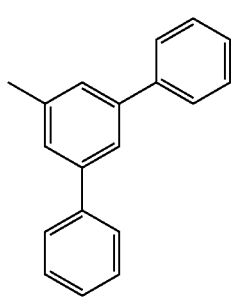
(1-7)

-continued (1-8)
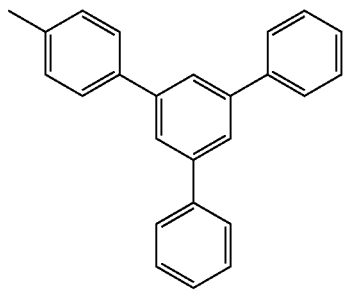

(1-9)
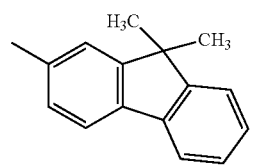

(1-10)
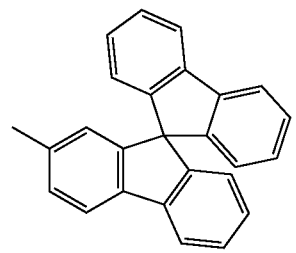

(1-11)
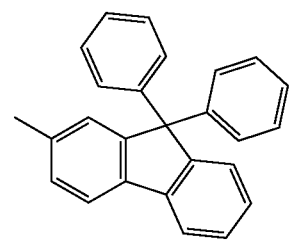

The substituents $R^1$ to $R^9$ in General Formula (G2), $R^{11}$ to $R^{19}$ in General Formula (G3), and $R^{21}$ and $R^{22}$ in General Formula (G4) are an alkyl group having 1 to 4 carbon atoms and an aryl group having 6 to 13 carbon atoms. Specific examples of the alkyl group having 1 to 4 carbon atoms include a methyl group, an ethyl group, a propyl group, an isopropyl group, a butyl group, a sec-butyl group, an isobutyl group, and a tert-butyl group. Specific examples of the aryl group having 6 to 13 carbon atoms include a phenyl group, a tolyl group, a xylyl group, a mesityl group, a biphenyl group, a naphthyl group, and a fluorenyl group. Further, the substituents may be bonded to each other to form a ring; a spirofluorenyl group is regarded as a group having substituents which are bonded to each other to form a ring (that is, a spirofluorenyl group is a 9,9-diphenylfluorenyl group whose two phenyl groups are bonded to each other to form a ring).

The substituents available on $A^1$ in General Formula (G1), $A^2$ in General Formula (G2), and $A^3$ in General Formula (G3) are an alkyl group having 1 to 4 carbon atoms and an aryl group having 6 to 13 carbon atoms. Specific examples of the alkyl group having 1 to 4 carbon atoms include a methyl group, an ethyl group, a propyl group, an isopropyl group, a butyl group, a sec-butyl group, an isobutyl group, and a tert-butyl group. Specific examples of the aryl group having 6 to 13 carbon atoms include a phenyl group, a tolyl group, a xylyl group, a mesityl group, a biphenyl group, a naphthyl group, and a fluorenyl group.

Note that in each of the organic compounds of embodiments of the present invention which are represented by General Formulae (G1) to (G4), a substituted or unsubstituted dibenzofuranyl group or a substituted or unsubstituted dibenzothiophenyl group is directly bonded to an amine nitrogen, and due to this structure, the organic compounds can each have a low HOMO level and a high hole-transport property.

Next, specific structural formulae of organic compounds of embodiments of the present invention are shown (Structural Formulae (100) to (161)). Note that the present invention is not limited to these examples.

(100)
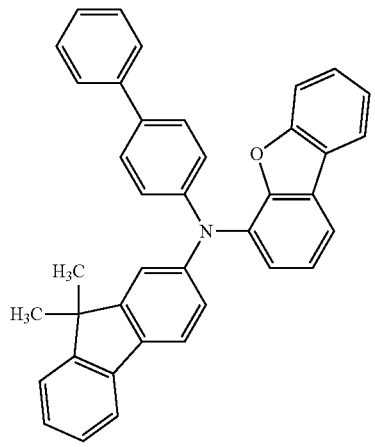

(101)
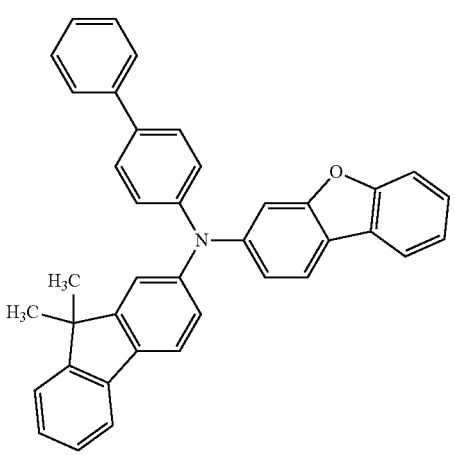

(102)
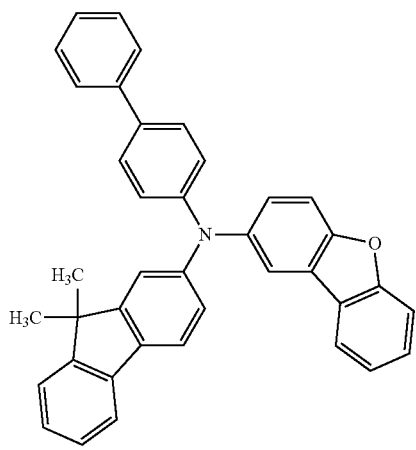
(103)
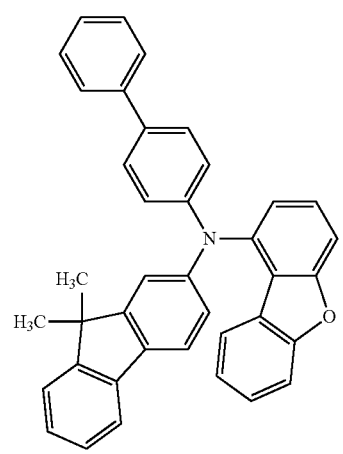
(104)
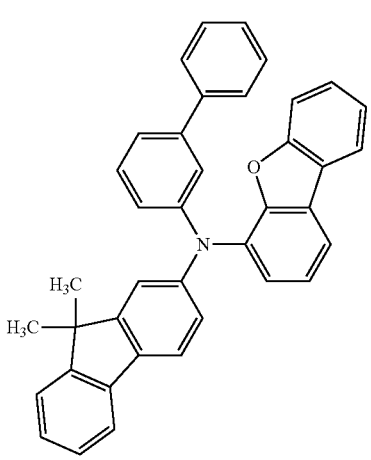
(105)
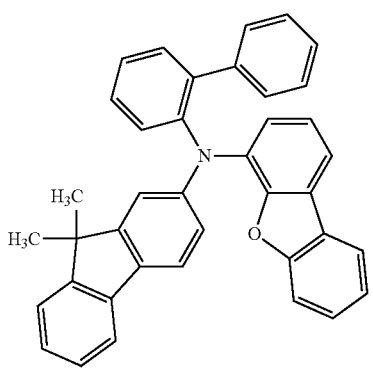
(106)
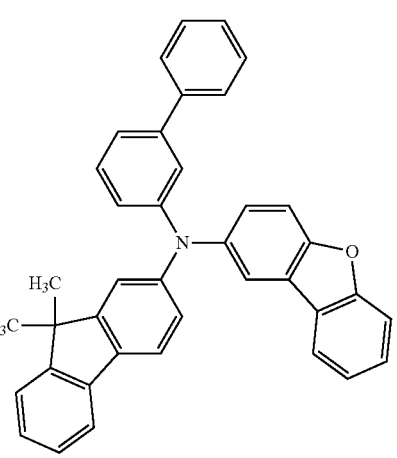
(107)
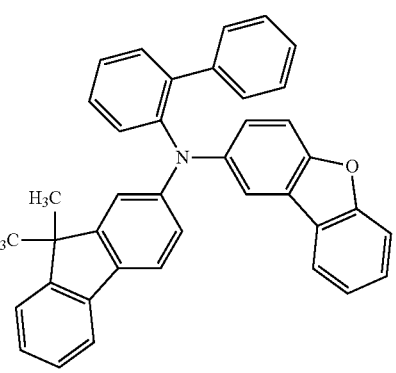
(108)
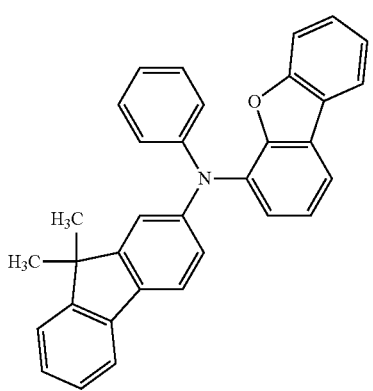

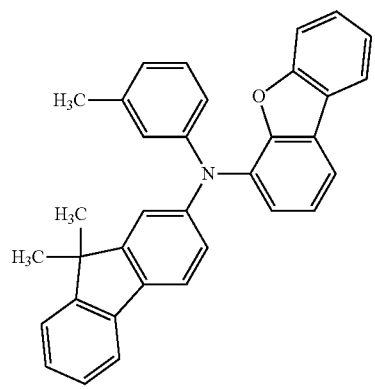
(109)
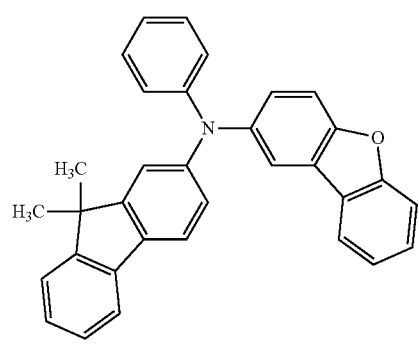
(110)
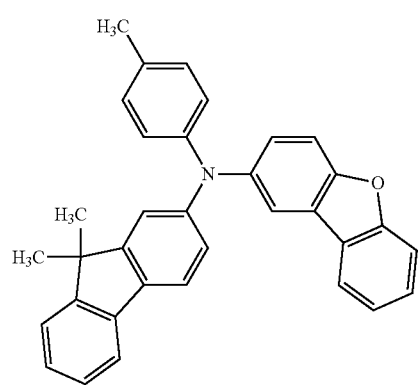
(111)
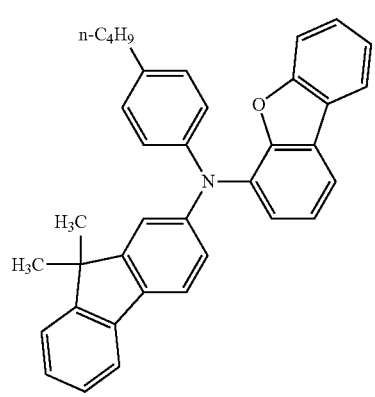
(112)
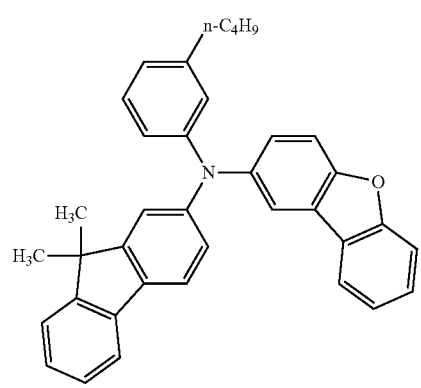
(113)
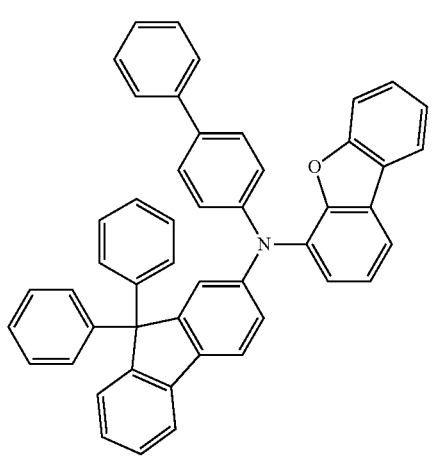
(114)
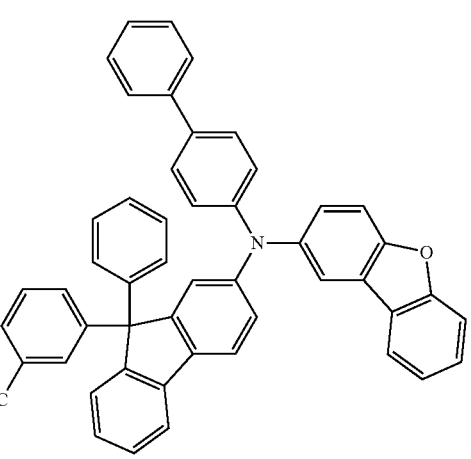
(115)

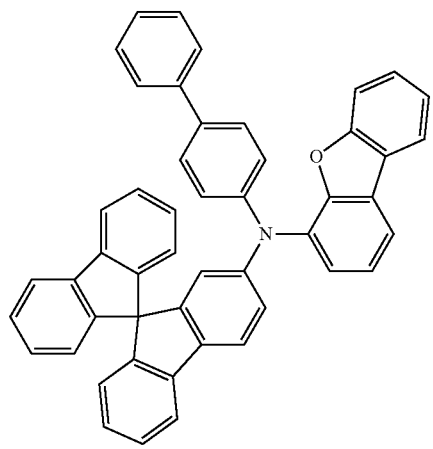
(116)
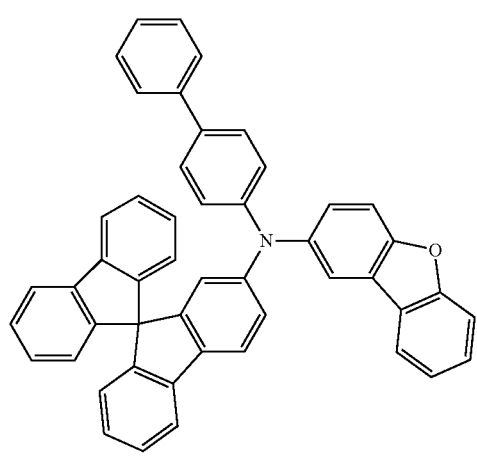
(117)
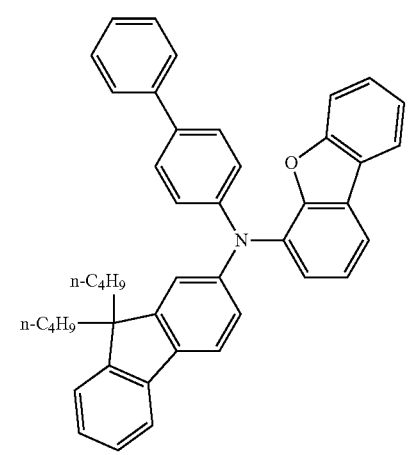
(118)
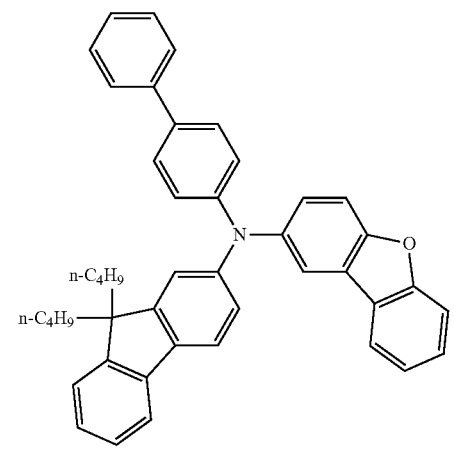
(119)
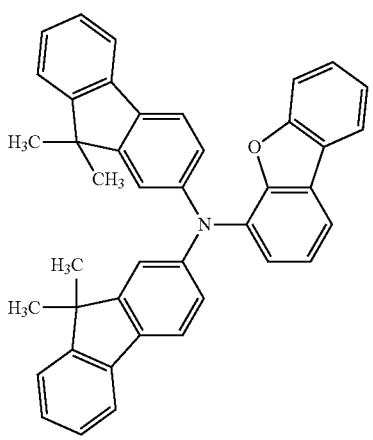
(120)
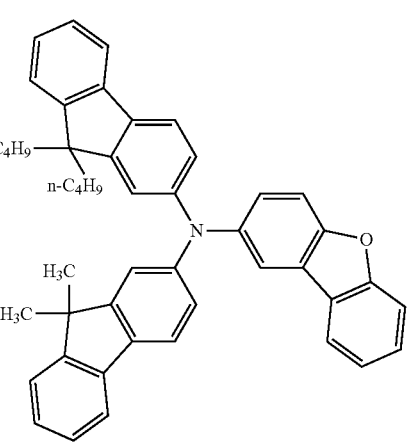
(121)

(122)
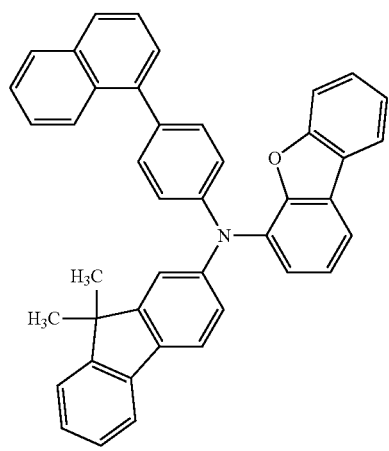
(123)
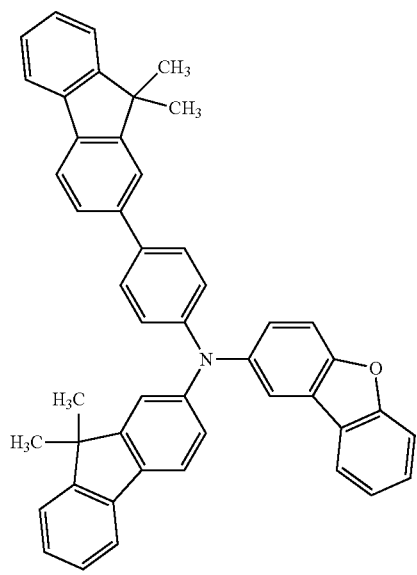
(124)
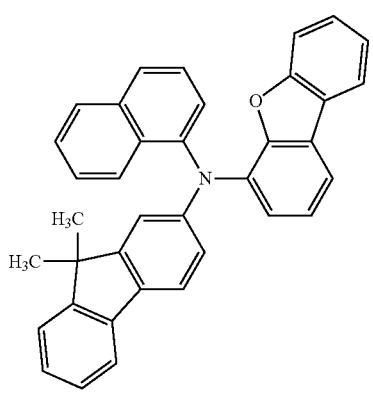
(125)
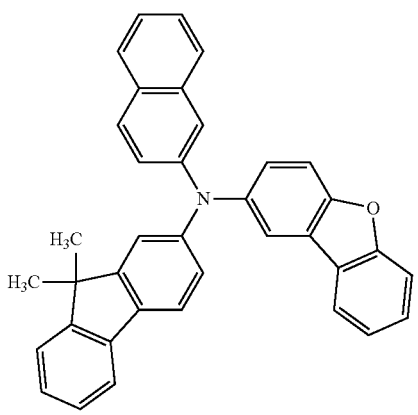
(126)
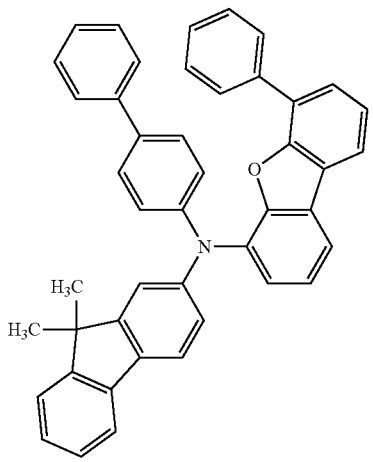
(127)
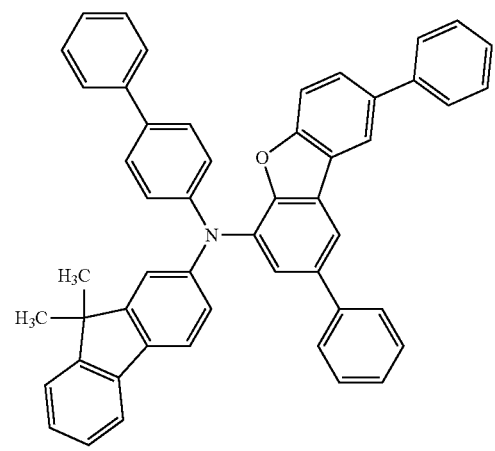

(128)
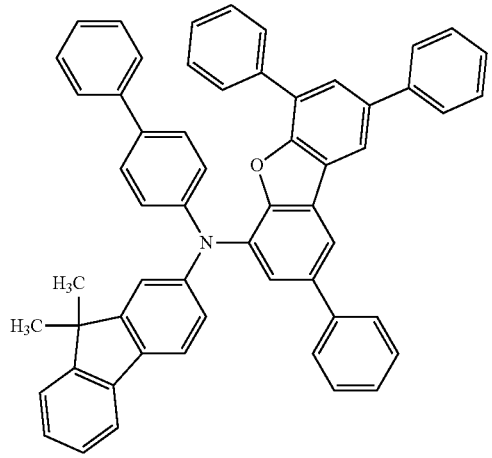
(129)
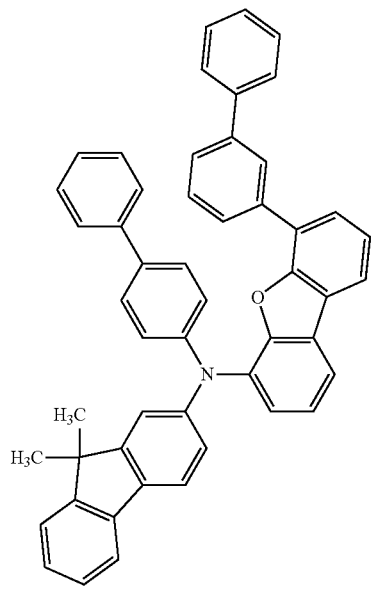
(130)
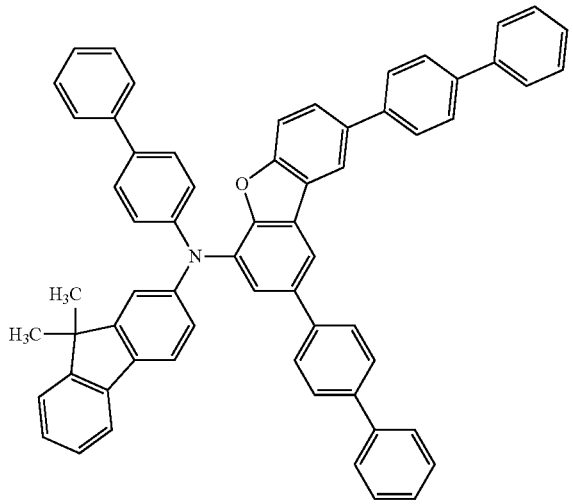
(131)
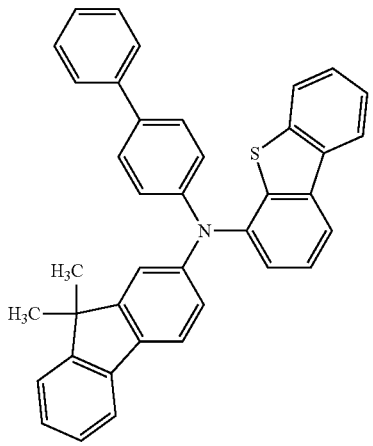
(132)
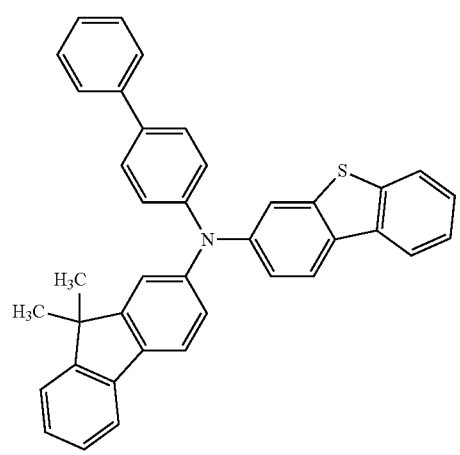
(133)
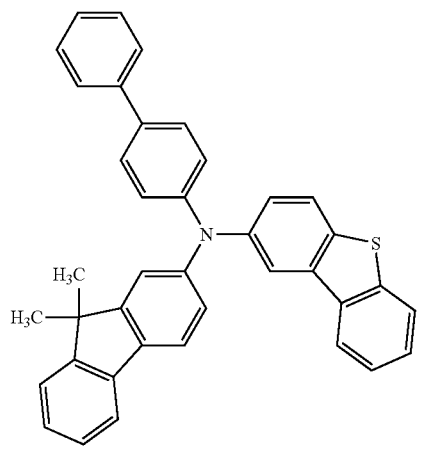

(134)
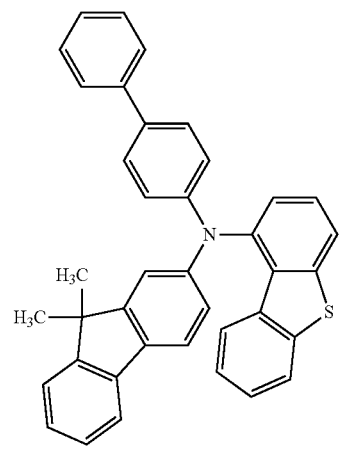
(135)
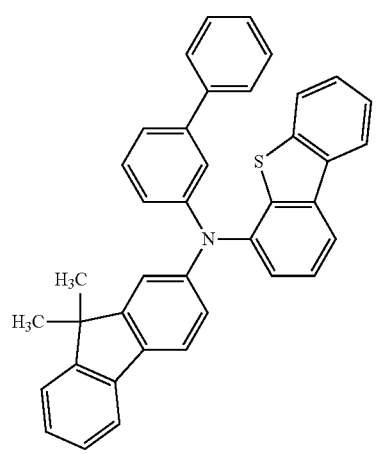
(136)
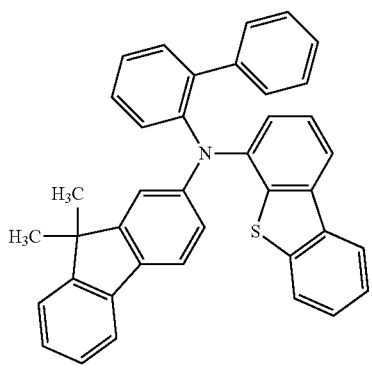
(137)
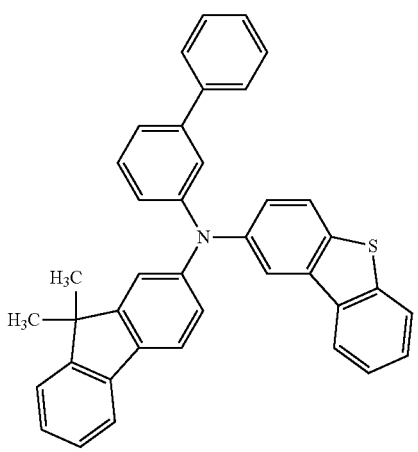
(138)
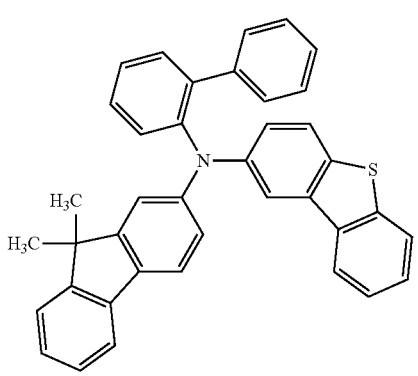
(139)
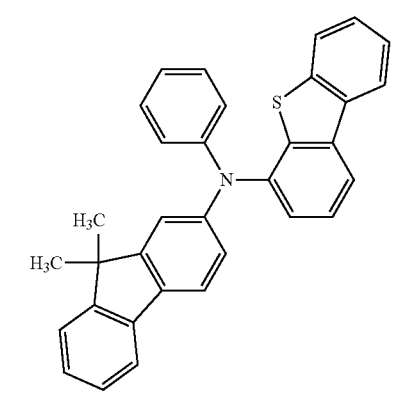
(140)
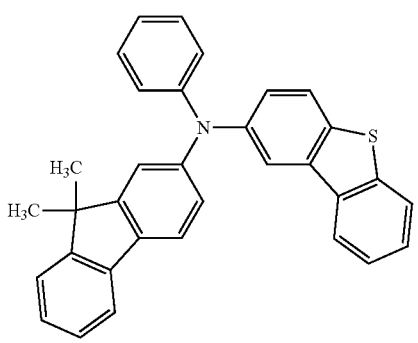

(141)
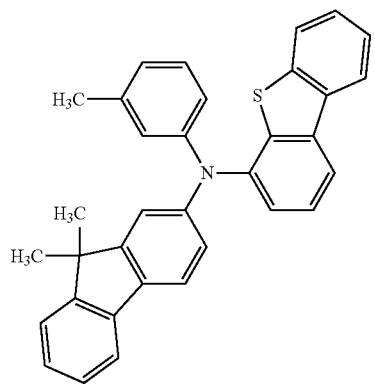
(142)
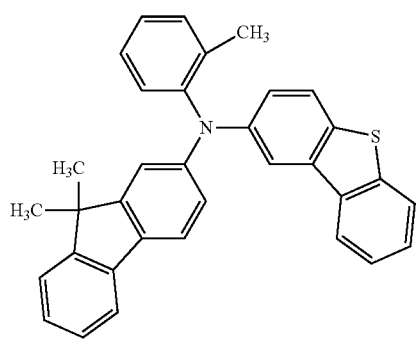
(143)
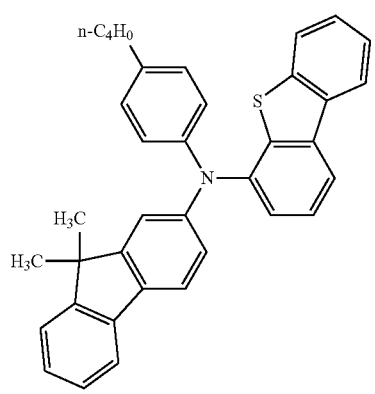
(144)
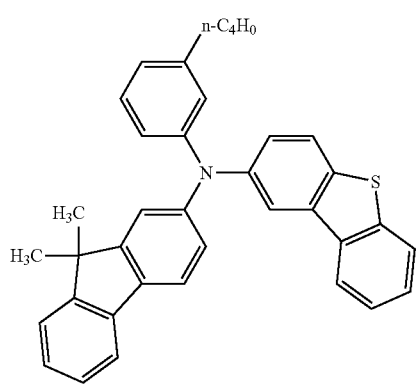
(145)
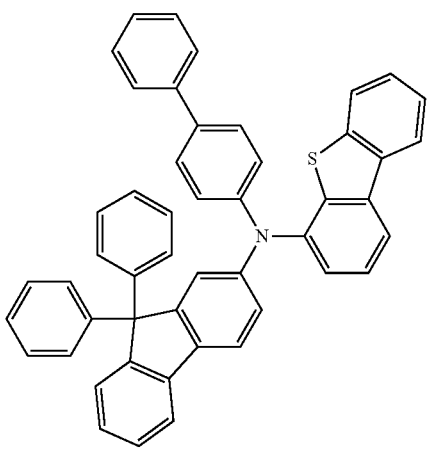
(146)
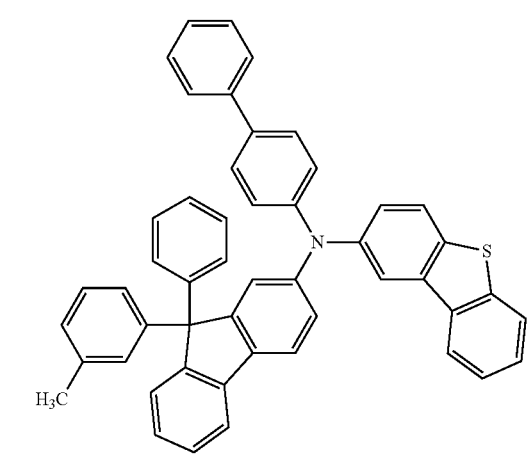
(147)
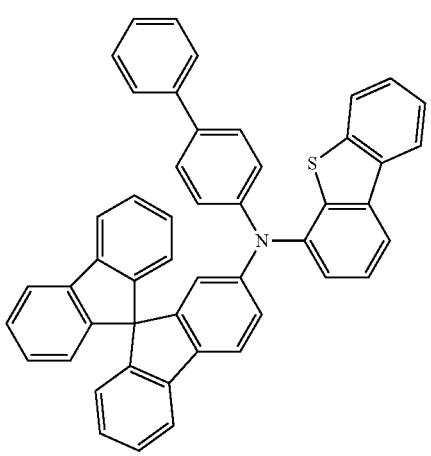

(148)
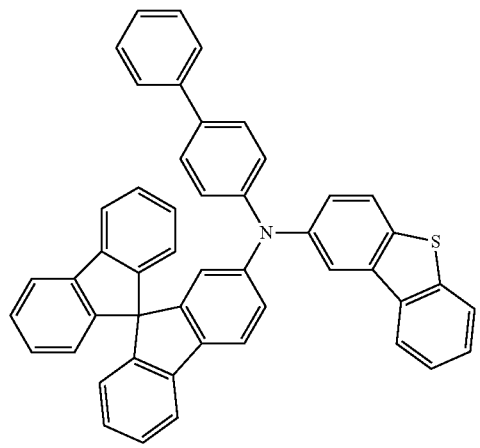
(149)
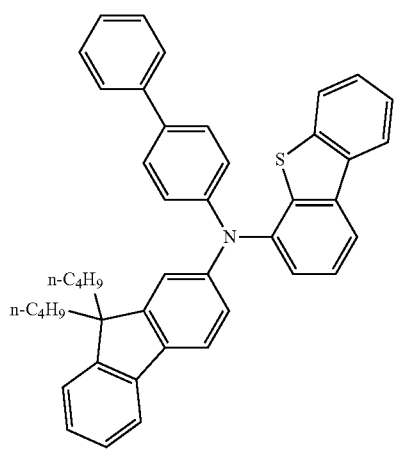
(150)
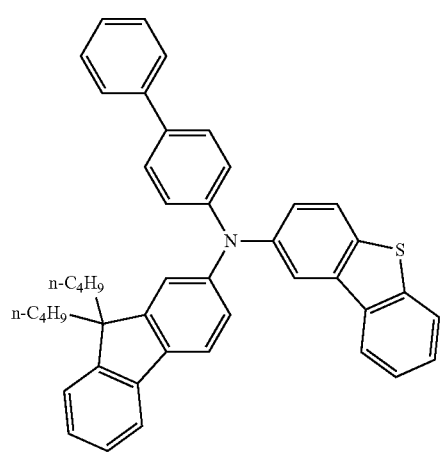
(151)
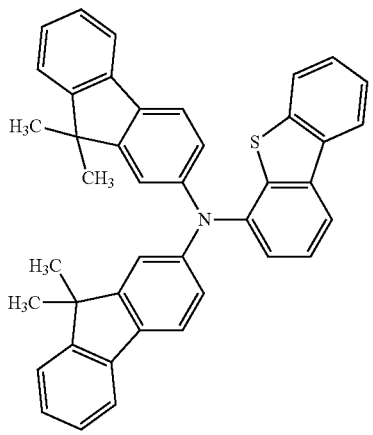
(152)
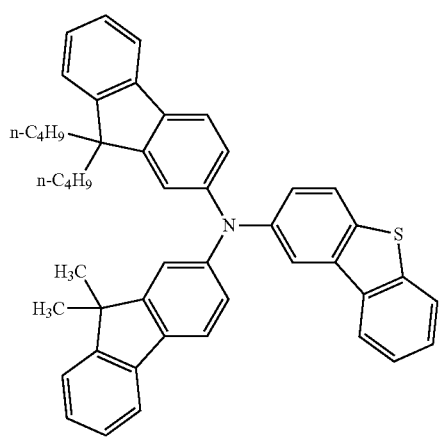
(153)
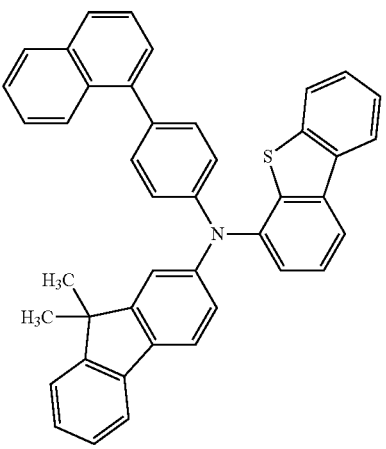

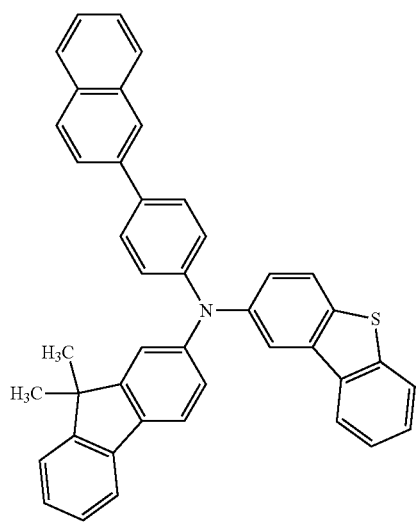
(154)
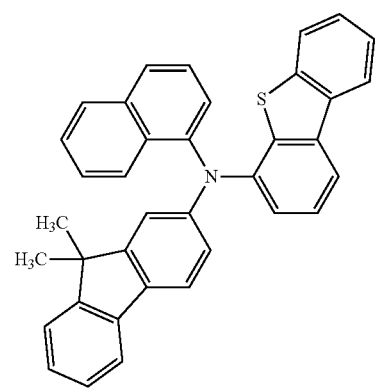
(155)
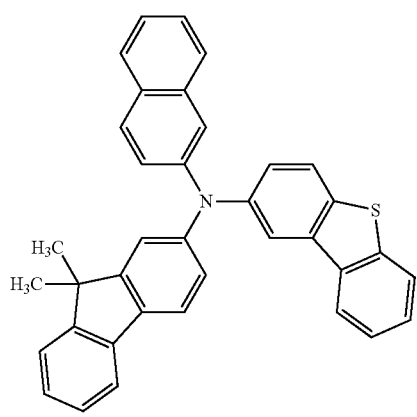
(156)
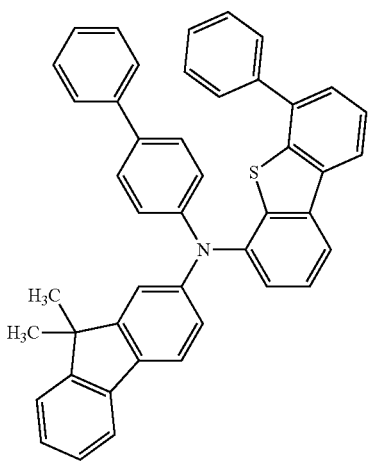
(157)
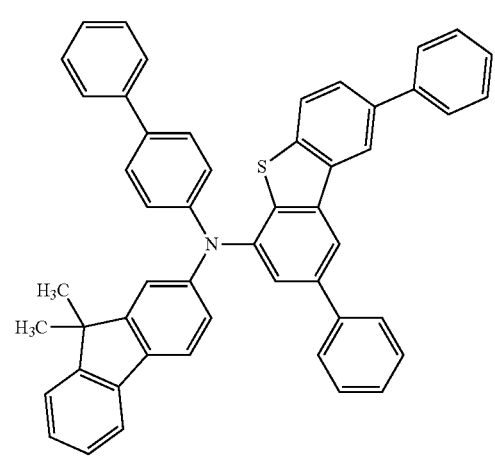
(158)
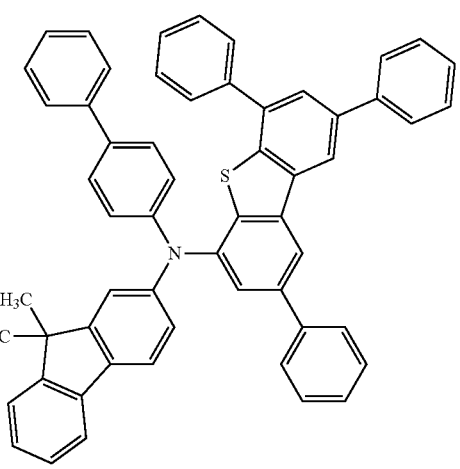
(159)

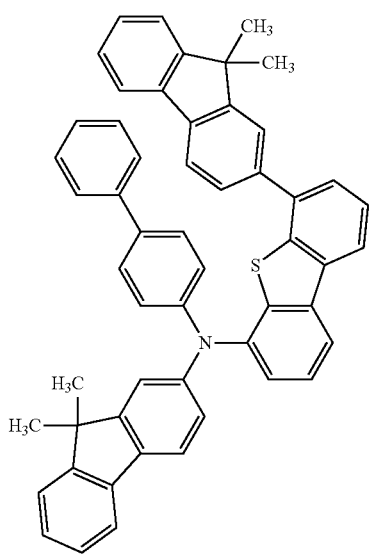

(160)

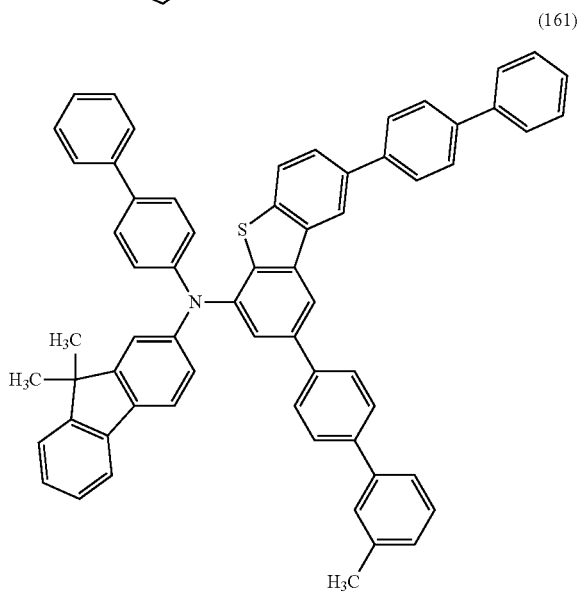

(161)

Note that each of the organic compounds represented by Structural Formulae (100) to (161) is a novel organic compound having a low HOMO level and a hole-transport property. In addition, the organic compounds can each form an exciplex when combined with another organic compound.

Next, an example of a method for synthesizing the organic compound of one embodiment of the present invention is described. A variety of reactions can be applied to a method for synthesizing the organic compound of one embodiment of the present invention. Thus, the method for synthesizing the organic compound of one embodiment of the present invention is not limited to the synthesis methods below.

<<Method for Synthesizing an Organic Compound of One Embodiment of the Present Invention Represented by General Formula (G1)>>

An example of a method for synthesizing the organic compound of one embodiment of the present invention represented by General Formula (G1) is described.

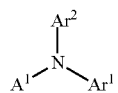

(G1)

In General Formula (G1), $Ar^1$ represents a substituted or unsubstituted fluorenyl group, $Ar^2$ represents a substituted or unsubstituted aryl group having 6 to 13 carbon atoms, and $A^1$ represents any one of a substituted or unsubstituted dibenzofuranyl group and a substituted or unsubstituted dibenzothiophenyl group. Note that when $Ar^1$, $Ar^2$, or $A^1$ has one or more substituents, the substituent is any one of an alkyl group having 1 to 4 carbon atoms and an aryl group having 6 to 13 carbon atoms.

Synthesis Scheme (A) of the organic compound of one embodiment of the present invention represented by General Formula (G1) is shown below.

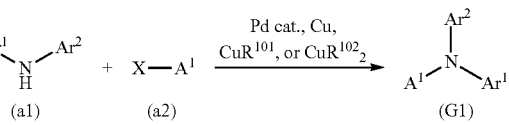

(A)

In Synthesis Scheme (A), $Ar^1$ represents a substituted or unsubstituted fluorenyl group. $Ar^2$ represents a substituted or unsubstituted aryl group having 6 to 13 carbon atoms. $A^1$ represents any one of a substituted or unsubstituted dibenzofuranyl group and a substituted or unsubstituted dibenzothiophenyl group. X represents any one of a halogen and a trifluoromethanesulfonate group, preferably any one of bromine and iodine. Note that when $Ar^1$, $Ar^2$, or $A^1$ has one or more substituents, the substituent is any one of an alkyl group having 1 to 4 carbon atoms and an aryl group having 6 to 13 carbon atoms.

As shown in Synthesis Scheme (A), coupling of a secondary diarylamine (a1) and an aryl halide (a2) is performed in the presence of a base using a metal catalyst, so that the organic compound represented by General Formula (G1) can be obtained.

[Case of Performing Hartwig-Buchwald Reaction]

As a palladium catalyst that can be used in Synthesis Scheme (A), bis(dibenzylideneacetone)palladium(0) and palladium(II) acetate are given, for example. As a ligand of the palladium catalyst, tri(tert-butyl)phosphine, tri(n-hexyl)phosphine, and tricyclohexylphosphine are given, for example. The catalyst and the ligand which can be used are not limited to these examples.

Examples of bases that can be used in Synthesis Scheme (A) include an organic base such as sodium tert-butoxide and an inorganic base such as potassium carbonate. Examples of solvents that can be used in Synthesis Scheme (A) include toluene, xylene, benzene, and tetrahydrofuran. Note that the base and the solvent which can be used are not limited to these examples.

[Case of Performing Ullmann Reaction]

In Synthesis Scheme (A), $R^{101}$ and $R^{102}$ separately represent any one of a halogen, an acetyl group, and the like, and as a halogen, chlorine, bromine, or iodine can be used. Furthermore, it is preferable to use copper(I) iodide in which $R^{101}$ is iodine or copper(II) acetate in which $R^{102}$ is an acetyloxy group. The copper compound used for the reaction is not limited to these examples. Further, copper can be used in addition to the copper compound. Examples of a base that can be used in Synthesis Scheme (A) include, but are not limited to, potassium carbonate Examples of a solvent which can be used in Synthesis Scheme (A) include, but are not limited to, 1,3-dimethyl-3, 4,5,6-tetrahydro-2(1H)pyrimidinone (abbreviation: DMPU), toluene, xylene, benzene. In the Ullmann reaction, when the reaction temperature is 100° C. or higher, an objective substance can be obtained in a shorter time in a higher yield; therefore, it is preferable to use DMPU, xylene, or toluene each having a high boiling point. A reaction temperature of 150° C. or more is further preferred and accordingly DMPU is more preferably used.

Thus, the organic compound of one embodiment of the present invention can be synthesized.

With the use of the organic compound of one embodiment of the present invention, a light-emitting element, a light-emitting device, an electronic device, or a lighting device having high emission efficiency can be obtained. It is also possible to obtain a light-emitting element, a light-emitting device, an electronic device, or a lighting device with low power consumption.

The structure described in this embodiment can be used in combination with any of the structures described in the other embodiments, as appropriate.

Embodiment 2

In this embodiment, a light-emitting element in which the organic compound described in Embodiment 1 as one embodiment of the present invention is used for a light-emitting layer is described with reference to FIG. 1.

In a light-emitting element described in this embodiment, as illustrated in FIG. 1, an EL layer 102 including a light-emitting layer 113 is provided between a pair of electrodes (a first electrode (anode) 101 and a second electrode (cathode) 103), and the EL layer 102 includes a hole-injection layer 111, a hole-transport layer 112, an electron-transport layer 114, an electron-injection layer 115, a charge generation layer (E) 116, and the like in addition to the light-emitting layer 113. Note that the light-emitting layer 113 contains a first organic compound, a second organic compound, and a light-emitting substance (guest material) which converts triplet excitation energy into light emission.

By application of a voltage to such a light-emitting element, holes injected from the first electrode 101 side and electrons injected from the second electrode 103 side recombine in the light-emitting layer 113 and the first organic compound and the second organic compound form an exciplex. Then, owing to energy transfer from the exciplex, the guest material emits light. Note that the organic compound described in Embodiment 1 as one embodiment of the present invention can be used as one of the first organic compound and the second organic compound which form an exciplex.

The hole-injection layer 111 included in the EL layer 102 is a layer containing a substance having a high hole-transport property and an acceptor substance. When electrons are extracted from the substance having a high hole-transport property with the acceptor substance, holes are generated. Thus, holes are injected from the hole-injection layer 111 into the light-emitting layer 113 through the hole-transport layer 112.

The charge generation layer (E) 116 is a layer containing a substance having a high hole-transport property and an acceptor substance. With the acceptor substance, electrons are extracted from the substance having a high hole-transport property and the extracted electrons are injected from the electron-injection layer 115 having an electron-injection property into the light-emitting layer 113 through the electron-transport layer 114.

Specific examples regarding manufacture of the light-emitting element described in this embodiment are described below.

For the first electrode (anode) 101 and the second electrode (cathode) 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The first electrode (anode) 101 and the second electrode (cathode) 103 can be formed by, for example, a sputtering method, an evaporation method (including a vacuum evaporation method), or the like.

As the substance with a high hole-transport property which is used for the hole-injection layer 111, the hole-transport layer 112, and the charge generation layer (E) 116, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. In addition, the following carbazole derivatives and the like can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or higher. Note that any substance other than the above substances may be used as long as the hole-transport property is higher than the electron-transport property. The organic compound in Embodiment 1 that is one embodiment of the present invention can be favorably used in the hole-injection layer 111, the hole-transport layer 112, and the charge generation layer (E) 116 because the organic compound has a high hole-transport property.

Further, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)

methacrylamide](abbreviation: PTPDMA), or poly[N,N'-bis(4-butylphenyl)-N,N'-bis(phenyl)benzidine] (abbreviation: Poly-TPD) can be used.

As examples of the acceptor substance that is used for the hole-injection layer 111 and the charge generation layer (E) 116, an oxide of a metal belonging to any of Group 4 to Group 8 of the periodic table can be given. Specifically, molybdenum oxide is particularly preferable.

The light-emitting layer 113 at least contains a light-emitting substance. It is preferable that the light-emitting layer contain a guest material and an organic compound (host material) for dispersing the guest material.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (a fluorescence spectrum in energy transfer from a singlet excited state, and a phosphorescence spectrum in energy transfer from a triplet excited state) have a large overlap with an absorption spectrum of a guest material (specifically, an absorption band on the longest wavelength (lowest energy) side). However, in general, it is difficult to obtain an overlap between a fluorescence spectrum of a host material and an absorption band on the longest wavelength (lowest energy) side of a guest material. The reason for this is as follows: if the fluorescence spectrum of the host material overlaps with the absorption band on the longest wavelength (lowest energy) side of the guest material, since a phosphorescence spectrum of the host material is located on a longer wavelength (lower energy) side than the fluorescence spectrum, the $T_1$ level of the host material becomes lower than the $T_1$ level of the guest material, which inhibits efficient energy transfer from the host material to the guest material. When the host material is designed so that the $T_1$ level of the host material is higher than the $T_1$ level of the guest material in order to avoid the aforementioned problem, the fluorescence spectrum of the host material is shifted to the shorter wavelength (higher energy) side, and thus the fluorescence spectrum does not have any overlap with the absorption band on the longest wavelength (lowest energy) side of the guest material. For that reason, in general, it is difficult to obtain an overlap between a fluorescence spectrum of a host material and an absorption band on the longest wavelength (lowest energy) side of a guest material so as to maximize energy transfer from a singlet excited state of a host material.

Thus, in this embodiment, it is preferable that a plurality of organic compounds be used as host materials so as to form an exciplex (also referred to as excited complex). In that case, the plurality of organic compounds that are the host materials (e.g., the first organic compound and the second organic compound) form an exciplex upon recombination of carriers (electrons and holes) in the light-emitting layer 113. Thus, in the light-emitting layer 113, fluorescence spectra of the first organic compound and the second organic compound are not observed, but an emission spectrum of the exciplex which is located on a longer wavelength side is obtained. Moreover, when the first organic compound and the second organic compound are selected such that the emission spectrum of the exciplex has a large overlap with the absorption spectrum of the guest material, energy transfer from a singlet excited state can be maximized. Note that as to the triplet excited state, energy transfer from the exciplex can also occur.

As the guest material, a phosphorescent compound (e.g., an organometallic complex), a thermally activated delayed fluorescence (TADF) material, or the like is preferably used.

Specific examples of the organometallic complex include bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $Ir(CF_3$ ppy$)_2$(pic)), bis[2-(4',6'-difluorophenyl)pyridinato-N,$C^{2'}$]iridium(III) acetylacetonate (abbreviation: FIracac), tris(2-phenylpyridinato)iridium(III) (abbreviation: $Ir(ppy)_3$), bis(2-phenylpyridinato)iridium(I) acetylacetonate (abbreviation: $Ir(ppy)_2$(acac)), bis(benzo[h]quinolinato)iridium(III) acetylacetonate (abbreviation: $Ir(bzq)_2$(acac)), bis(2,4-diphenyl-1,3-oxazolato-N,$C^{2'}$)iridium(III) acetylacetonate (abbreviation: $Ir(dpo)_2$(acac)), bis{2-[4'-(perfluorophenyl)phenyl]pyridinato-N,$C^{2'}$}iridium(III) acetylacetonate (abbreviation: $Ir(p-PF-ph)_2$(acac)), bis(2-phenylbenzothiazolato-N,$C^{2'}$)iridium(II) acetylacetonate (abbreviation: $Ir(bt)_2$(acac)), bis[2-(2'-benzo[4,5-α]thienyl)pyridinato-N,$C^{3'}$]iridium(III) acetylacetonate (abbreviation: $Ir(btp)_2$(acac)), bis(1-phenylisoquinolinato-N,$C^{2'}$)iridium(III) acetylacetonate (abbreviation: $Ir(piq)_2$(acac)), (acetylacetonato)bis[2,3-bis(4-fluorophenyl)quinoxalinato]iridium(III) (abbreviation: $Ir(Fdpq)_2$(acac)), (acetylacetonato)bis(2,3,5-triphenylpyrazinato)iridium(III) (abbreviation: $Ir(tppr)_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: $Tb(acac)_3$(Phen)), tris(1,3-diphenyl-1,3-propanedionato)(monophenanthroline)europium(III) (abbreviation: $Eu(DBM)_3$(Phen)), and tris[1-(2-thenoyl)-3,3,3-trifluoroacetonato](monophenanthroline)europium(III) (abbreviation: $Eu(TTA)_3$(Phen)).

The first organic compound and the second organic compound that are the host materials are preferably selected such that a combination thereof forms an exciplex; it is further preferable to combine a compound which easily accepts electrons (a compound having an electron-trapping property) and a compound which easily accepts holes (a compound having a hole-trapping property).

As examples of a compound which easily accepts electrons, the following can be given: 2-[3-(dibenzothiophen-4-yl)phenyl]dibenzo[f,h]quinoxaline (abbreviation: 2mDBTP-DBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As the compound which easily accepts holes, the organic compound described in Embodiment 1 can be used.

The first organic compound and the second organic compound that are the host materials are not limited to the above organic compounds, as long as at least one of the first organic compound and the second organic compound is the organic compound described in Embodiment 1 and the combination thereof can form an exciplex. The first and second organic compounds are selected such that an emission spectrum of the exciplex overlaps with an absorption spectrum of the guest material, and a peak of the emission spectrum of the exciplex has a longer wavelength than a peak of the absorption band of the guest material on the longest wavelength side.

Note that in the case where a compound which easily accepts electrons and a compound which easily accepts holes are used for the first organic compound and the second organic compound, carrier balance can be controlled by the mixture ratio of the compounds. Specifically, the ratio of the first organic compound to the second organic compound is preferably 1:9 to 9:1.

The aforementioned structure allows the light-emitting layer 113 to emit phosphorescence with high emission efficiency.

The electron-transport layer 114 is a layer containing a substance having a high electron-transport property. For the electron-transport layer 114, metal complexes such as tris(8-quinolinolato)aluminum (abbreviation: $Alq_3$), tris(4-methyl-8-quinolinolato)aluminum (abbreviation: $Almq_3$), bis(10-hydroxybenzo[h]quinolinato)beryllium (abbreviation: $BeBq_2$), bis(2-methyl-8-quinolinolato)(4-phenylphenolato)aluminum (abbreviation: BAlq), bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$) can be used. Alternatively, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl)stilbene (abbreviation: BzOs) can be used. Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)] (abbreviation: PF-BPy) can be used. The substances mentioned here are mainly ones that have an electron mobility of $10^{-6}$ cm$^2$/Vs or higher. Note that any substance other than the above substances may be used for the electron-transport layer 114 as long as the electron-transport property is higher than the hole-transport property.

The electron-transport layer 114 is not limited to a single layer, and a stacked layer in which two or more layers containing any of the above-described substances are stacked may be used.

The electron-injection layer 115 is a layer containing a substance having a high electron-injection property. For the electron-injection layer 115, an alkali metal, an alkaline earth metal, or a compound thereof, such as lithium fluoride (LiF), cesium fluoride (CsF), calcium fluoride ($CaF_2$), or lithium oxide ($LiO_x$), can be used. Alternatively, a rare earth metal compound such as erbium fluoride ($ErF_3$) can be used. Further alternatively, the substances for forming the electron-transport layer 114, which are described above, can be used.

Alternatively, a composite material in which an organic compound and an electron donor (donor) are mixed may be used for the electron-injection layer 115. Such a composite material is excellent in an electron-injection property and an electron-transport property because electrons are generated in the organic compound by the electron donor. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. In addition, alkali metal oxide or alkaline earth metal oxide such as lithium oxide, calcium oxide, barium oxide, and the like can be given. A Lewis base such as magnesium oxide can alternatively be used. An organic compound such as tetrathiafulvalene (abbreviation: TTF) can alternatively be used.

Note that each of the above-described hole-injection layer 111, hole-transport layer 112, light-emitting layer 113, electron-transport layer 114, electron-injection layer 115, and charge generation layer (E) 116 can be formed by, for example, an evaporation method (e.g., a vacuum evaporation method), an ink-jet method, or a coating method.

In the above-described light-emitting element, current flows due to a potential difference applied between the first electrode 101 and the second electrode 103 and holes and electrons recombine in the EL layer 102, whereby light is emitted. Then, the emitted light is extracted outside through one or both of the first electrode 101 and the second electrode 103. Therefore, one or both of the first electrode 101 and the second electrode 103 are electrodes having a light-transmitting property.

The light-emitting element described in this embodiment can have higher efficiency than a conventional light-emitting element because in the light-emitting layer described in this embodiment, phosphorescence from the guest material can be obtained through the energy transfer from an exciplex of the organic compound of one embodiment of the present invention.

Note that the structure described in this embodiment can be combined as appropriate with any of the structures described in the other embodiments.

Embodiment 3

In this embodiment, as one embodiment of the present invention, a light-emitting element (hereinafter referred to as tandem light-emitting element) in which a charge generation layer is provided between a plurality of EL layers is described.

Figure 2A:
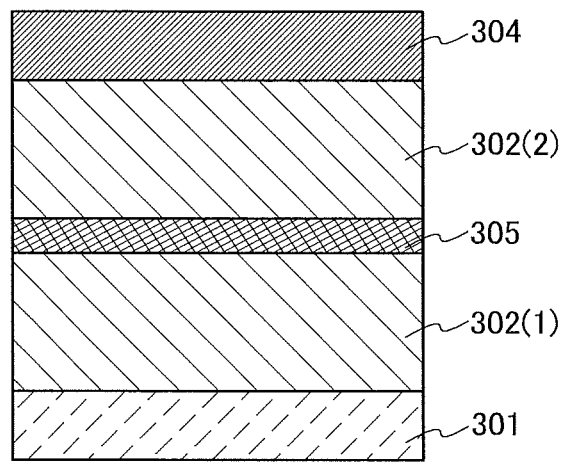
FIGS. 2A and 2B illustrate structures of light-emitting elements.

A light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 2A.

In this embodiment, the first electrode 301 functions as an anode, and the second electrode 304 functions as a cathode. Note that the first electrode 301 and the second electrode 304 can have structures similar to those described in Embodiment 2. Although the plurality of EL layers (the first EL layer 302(1) and the second EL layer 302(2)) may have the same structure as that of the EL layer described in Embodiment 2, any of the EL layers may have the same structure as that of the EL layer described in Embodiment 2. In other words, the structures of the first EL layer 302(1) and the second EL layer 302(2) may be the same or different from each other and can be the same as that of the EL layer described in Embodiment 2.

A charge generation layer (I) 305 is provided between the plurality of EL layers (the first EL layer 302(1) and the second EL layer 302(2)). The charge generation layer (I) 305 has a function of injecting electrons into one of the EL layers and injecting holes into the other of the EL layers when a voltage is applied between the first electrode 301 and the second electrode 304. In this embodiment, when a voltage is applied such that the potential of the first electrode 301 is higher than that of the second electrode 304, the charge generation layer (I) 305 injects electrons into the first EL layer 302(1) and injects holes into the second EL layer 302(2).

Note that in terms of light extraction efficiency, the charge generation layer (I) 305 preferably has a light-transmitting property with respect to visible light (specifically, the charge generation layer (I) 305 has a visible light transmittance of 40% or more). Further, the charge generation layer (I) 305 functions even if it has lower conductivity than the first electrode 301 or the second electrode 304.

The charge generation layer (I) 305 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or BSPB, or the like can be used. The substances mentioned here are mainly ones that have a hole mobility of $10^{-6}$ cm$^2$/Vs or higher. Note that any substance other than the above substances may be used as long as they are organic compounds with a hole-transport property higher than an electron-transport property.

Further, as the electron acceptor, 7,7,8,8-tetracyano-2,3,5,6-tetrafluoroquinodimethane (abbreviation: F$_4$-TCNQ), chloranil, or the like can be used. Alternatively, an oxide of metals that belong to Group 4 to Group 8 of the periodic table can be used. Specifically, it is preferable to use vanadium oxide, niobium oxide, tantalum oxide, chromium oxide, molybdenum oxide, tungsten oxide, manganese oxide, or rhenium oxide because the electron-accepting property is high. Among these, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property, a metal complex having a quinoline skeleton or a benzoquinoline skeleton, such as Alq, Almq$_3$, BeBq$_2$, or BAlq, or the like can be used, for example. Alternatively, it is possible to use a metal complex having an oxazole-based ligand or a thiazole-based ligand, such as Zn(BOX)$_2$ or Zn(BTZ)$_2$. Further alternatively, instead of a metal complex, it is possible to use PBD, OXD-7, TAZ, Bphen, BCP, or the like. The substances mentioned here are mainly ones that have an electron mobility of $10^{-6}$ cm$^2$/Vs or higher. Note that any substance other than the above substances may be used as long as they are organic compounds with an electron-transport property higher than a hole-transport property.

As the electron donor, it is possible to use an alkali metal, an alkaline earth metal, a rare earth metal, a metal belonging to Group 2 or 13 of the periodic table, or an oxide or a carbonate thereof. Specifically, it is preferable to use lithium (Li), cesium (Cs), magnesium (Mg), calcium (Ca), ytterbium (Yb), indium (In), lithium oxide, cesium carbonate, or the like. Alternatively, an organic compound such as tetrathianaphthacene may be used as the electron donor.

Figure 2B:
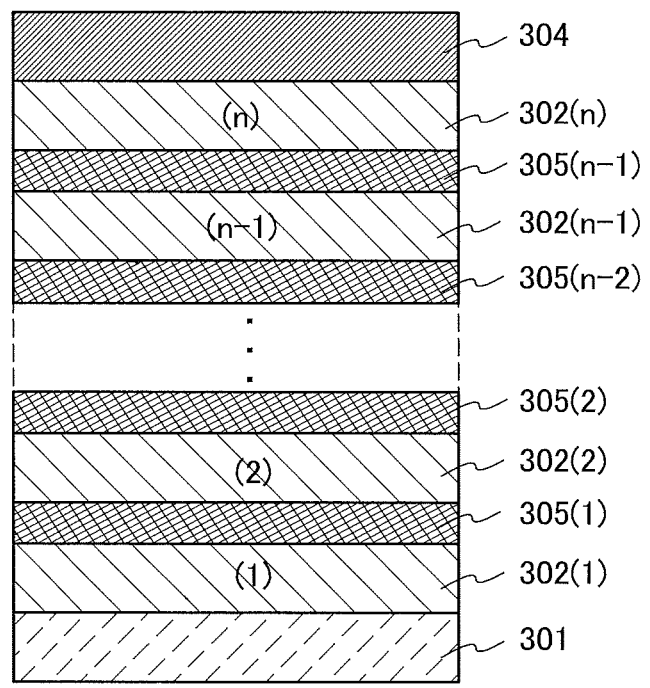

Although this embodiment shows the light-emitting element having two EL layers, the present invention can be similarly applied to a light-emitting element in which n EL layers (302(1) to 302(n)) (n is three or more) are stacked as illustrated in FIG. 2B. In the case where a plurality of EL layers are included between a pair of electrodes as in the light-emitting element according to this embodiment, by provision of charge generation layers (I) (305(1) to 305(n−1)) between the EL layers, light emission in a high luminance region can be obtained with current density kept low. Since the current density can be kept low, the element can have a long lifetime. Further, in application to light-emitting devices, electronic devices, and lighting devices each having a large light-emitting area, a voltage drop due to resistance of an electrode material can be reduced and accordingly homogeneous light emission in a large area is possible.

When the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, when lights which are complementary to each other are mixed, white emission can be obtained.

The same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

Embodiment 4

In this embodiment, a light-emitting device in which the light-emitting element of one embodiment of the present invention is used will be described.

The light-emitting device can be either a passive matrix light-emitting device or an active matrix light-emitting device. Note that any of the light-emitting elements described in other embodiments can be applied to the light-emitting device described in this embodiment.

In this embodiment, an active matrix light-emitting device is described with reference to FIGS. 3A and 3B.

Figure 3A:
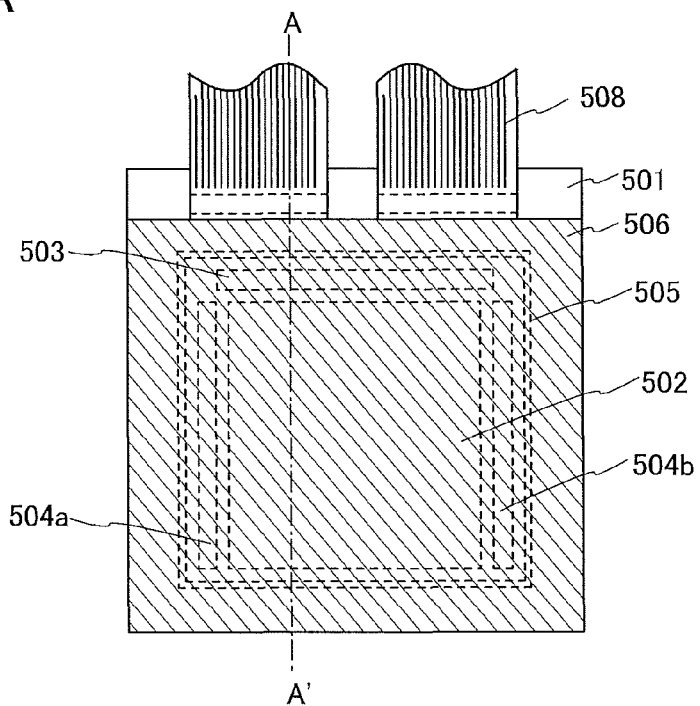
FIGS. 3A and 3B illustrate a light-emitting device.
Figure 3B:
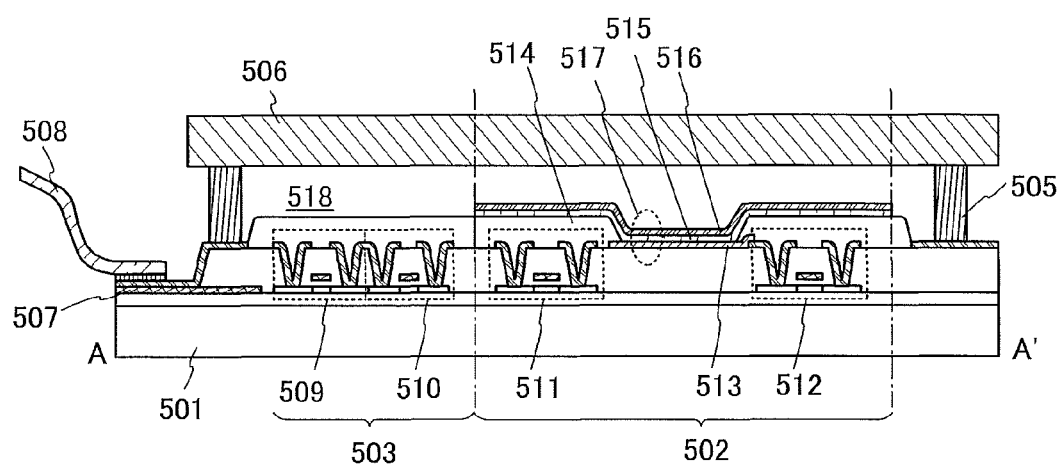

Note that FIG. 3A is a top view illustrating a light-emitting device and FIG. 3B is a cross-sectional view taken along the chain line A-A' in FIG. 3A. The active matrix light-emitting device according to this embodiment includes a pixel portion 502 provided over an element substrate 501, a driver circuit portion (a source line driver circuit) 503, and driver circuit portions (gate line driver circuits) 504 (504a and 504b). The pixel portion 502, the driver circuit portion 503, and the driver circuit portions 504 are sealed between the element substrate 501 and a sealing substrate 506 with a sealant 505.

A lead wiring 507 is provided over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portions 504. Here is shown an example in which a flexible printed circuit (FPC) 508 is provided as the external input terminal. Although the FPC 508 is illustrated alone, this FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 3B. The driver circuit portion and the pixel portion are formed over the element substrate 501; here are illustrated the driver circuit portion 503 which is the source line driver circuit and the pixel portion 502.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits. Any of a staggered type FET and a reverse-staggered type FET can be used. Further, the crystallinity of a semiconductor film used in the FET is not limited and can be amorphous or crystalline. Examples of a semiconductor material include Group IV semiconductors (e.g., silicon and gallium), compound semiconductors (including oxide semiconductors), and organic semiconductors. Although this embodiment shows a driver integrated type in which the driver circuit is formed over the substrate, the driver circuit is not necessarily formed over the substrate, and may be formed outside the substrate.

The pixel portion 502 is formed of a plurality of pixels each of which includes a switching FET 511, a current control FET 512, and a first electrode (anode) 513 which is electrically connected to a wiring (a source electrode or a drain electrode) of the current control FET 512. An insulator 514 is formed to cover end portions of the first electrode (anode) 513.

The insulator 514 preferably has a curved surface with curvature at an upper end portion or a lower end portion thereof in order to obtain favorable coverage by a film which is to be stacked over the insulator 514. For example, the insulator 514 can be formed using either a negative photosensitive resin or a positive photosensitive resin. The material of the insulator 514 is not limited to an organic compound and an inorganic compound such as silicon oxide or silicon oxynitride can also be used.

An EL layer 515 and a second electrode (cathode) 516 are stacked over the first electrode (anode) 513. In the EL layer 515, at least a light-emitting layer is provided. Further, in the EL layer 515, a hole-injection layer, a hole-transport layer, an electron-transport layer, an electron-injection layer, a charge generation layer, and the like can be provided as appropriate in addition to the light-emitting layer.

A light-emitting element 517 is formed of a stacked structure of the first electrode (anode) 513, the EL layer 515, and the second electrode (cathode) 516. For the first electrode (anode) 513, the EL layer 515, and the second electrode (cathode) 516, the materials described in Embodiment 2 can be used. Although not illustrated, the second electrode (cathode) 516 is electrically connected to the FPC 508 which is an external input terminal.

Although the cross-sectional view of FIG. 3B illustrates only one light-emitting element 517, a plurality of light-emitting elements are arranged in matrix in the pixel portion 502. Light-emitting elements which provide three kinds of light emission (R, G, and B) are selectively formed in the pixel portion 502, whereby a light-emitting device capable of full color display can be fabricated. Alternatively, a light-emitting device which is capable of full color display may be fabricated by a combination with color filters.

The sealing substrate 506 is attached to the element substrate 501 with the sealant 505, whereby the light-emitting element 517 is provided in a space 518 surrounded by the element substrate 501, the sealing substrate 506, and the sealant 505. The space 518 may be filled with an inert gas (such as nitrogen or argon), or the sealant 505.

An epoxy-based resin or glass frit is preferably used for the sealant 505. It is preferable that such a material do not transmit moisture or oxygen as much as possible. As the sealing substrate 506, a glass substrate, a quartz substrate, or a plastic substrate formed of fiber-reinforced plastic (FRP), poly(vinyl fluoride) (PVF), a polyester, an acrylic resin, or the like can be used. In the case where glass frit is used as the sealant, the element substrate 501 and the sealing substrate 506 are preferably glass substrates in terms of adhesion.

As described above, an active matrix light-emitting device can be obtained.

Note that the structure described in this embodiment can be combined as appropriate with any of the structures described in the other embodiments.

Embodiment 5

In this embodiment, examples of a variety of electronic devices which are completed using a light-emitting device are described with reference to FIGS. 4A to 4D and FIGS. 5A to 5C. The light-emitting device is fabricated using the light-emitting element of one embodiment of the present invention.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices are illustrated in FIGS. 4A to 4D.

Figure 4A:
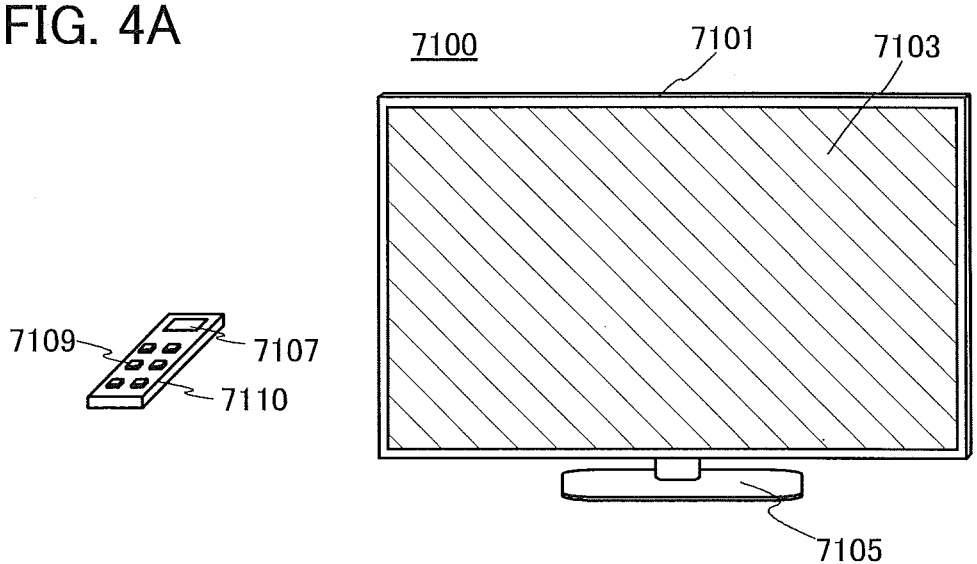
FIGS. 4A to 4D illustrate electronic devices.

FIG. 4A illustrates an example of a television set. In a television set 7100, a display portion 7103 is incorporated in a housing 7101. Images can be displayed on the display portion 7103, and the light-emitting device can be used for the display portion 7103. In addition, here, the housing 7101 is supported by a stand 7105.

Operation of the television set 7100 can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

Figure 4B:
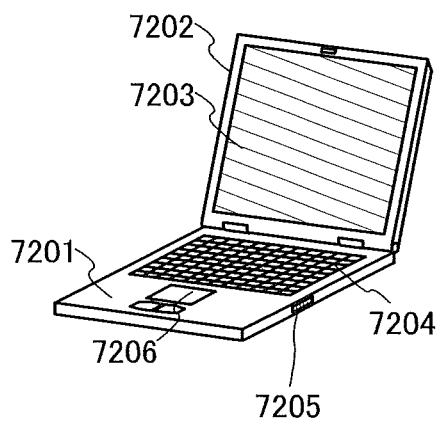

FIG. 4B illustrates a computer having a main body 7201, a housing 7202, a display portion 7203, a keyboard 7204, an external connection port 7205, a pointing device 7206, and the like. Note that this computer can be manufactured using the light-emitting device for the display portion 7203.

Figure 4C:
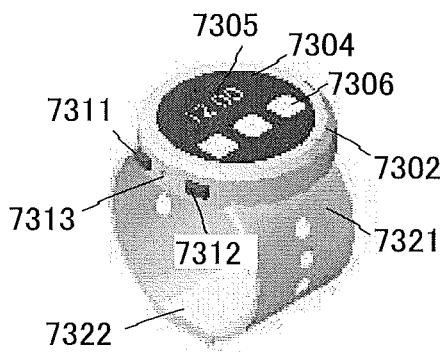

FIG. 4C illustrates a smart watch. The smart watch includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch in FIG. 4C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 4D:
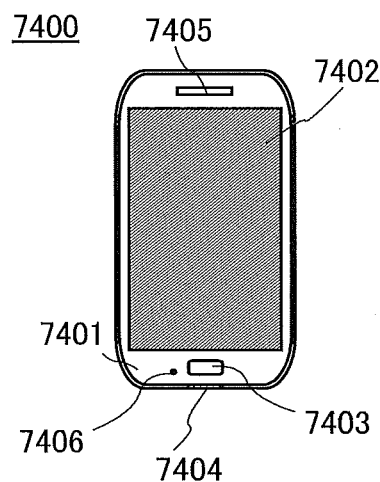

FIG. 4D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 4D is touched with a finger or the like, data can be input to the mobile phone 7400. Further, operations such as making a call and composing e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing e-mail, a text input mode mainly for inputting text is selected for the display portion 7402 so that text displayed on the screen can be input. In this case, it is preferable to display a keyboard or number buttons on almost the entire screen of the display portion 7402.

When a detection device such as a gyro sensor or an acceleration sensor is provided inside the mobile phone 7400, display on the screen of the display portion 7402 can be automatically changed by determining the orientation of the mobile phone 7400 (whether the mobile phone is placed horizontally or vertically).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touching the display portion 7402 is not performed within a specified period on the basis of a signal detected by an optical sensor in the display portion 7402, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a sensing light source which emits near-infrared light in the display portion, an image of a finger vein, a palm vein, or the like can be taken.

Figure 5A:
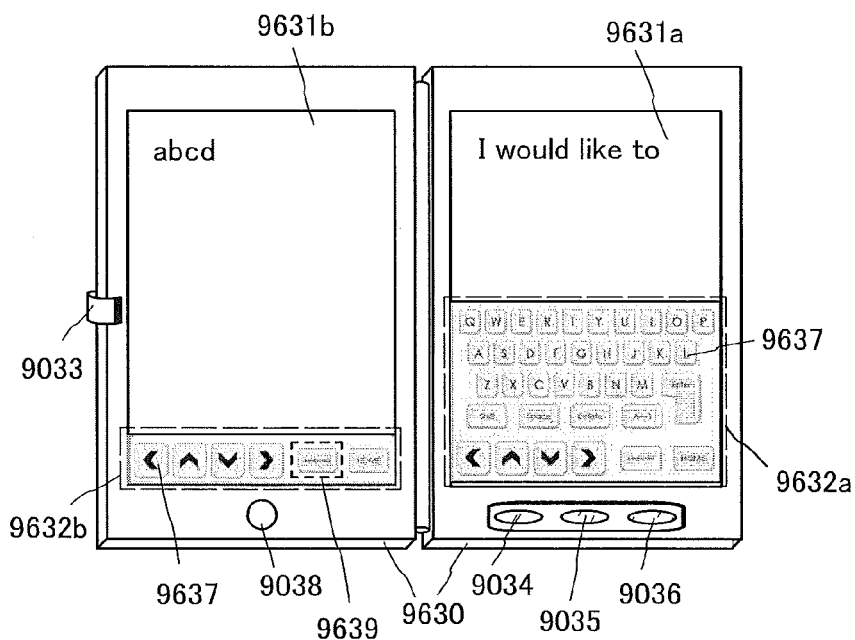
FIGS. 5A to 5C illustrate an electronic device.
Figure 5B:
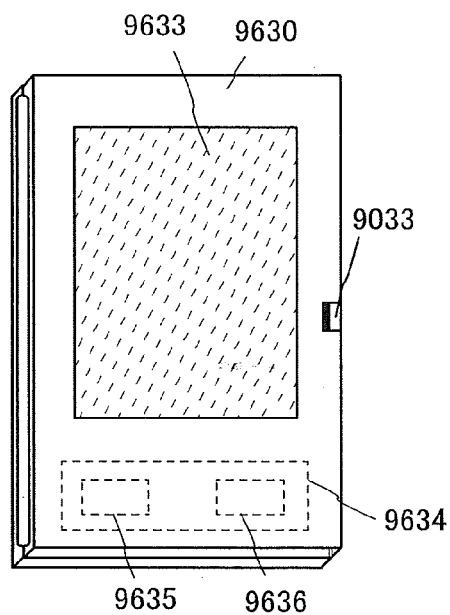

FIGS. 5A and 5B illustrate a foldable tablet terminal. The tablet terminal is opened in FIG. 5A. The tablet terminal includes a housing 9630, a display portion 9631*a*, a display portion 9631*b*, a display mode switch 9034, a power switch 9035, a power saver switch 9036, a clasp 9033, and an operation switch 9038. The tablet terminal is manufactured using the light-emitting device for either the display portion 9631*a* or the display portion 9631*b* or both.

Part of the display portion 9631*a* can be a touch panel region 9632*a* and data can be input when a displayed operation key 9637 is touched. Although a structure in which a half region in the display portion 9631*a* has only a display function and the other half region also has a touch panel function is shown as an example, the display portion 9631*a* is not limited to the structure. The whole region in the display portion 9631*a* may have a touch panel function. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The power saver switch 9036 can control display luminance in accordance with the amount of external light in use of the tablet terminal that is measured with an optical sensor incorporated in the tablet terminal. The tablet terminal may include another detection device such as a gyro sensor or an acceleration sensor in addition to the optical sensor.

Note that FIG. 5A shows an example in which the display portion 9631*a* and the display portion 9631*b* have the same display area; however, without limitation thereon, one of the display portions may be different from the other display portion in size and display quality. For example, higher definition images may be displayed on one of the display portions 9631*a* and 9631*b*.

The tablet terminal is closed in FIG. 5B. The tablet terminal includes the housing 9630, a solar cell 9633, a charge and discharge control circuit 9634, a battery 9635, and a DCDC converter 9636.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

The tablet terminal illustrated in FIGS. 5A and 5B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge and discharge control circuit 9634 illustrated in FIG. 5B will be described with reference to a block diagram in FIG. 5C. The solar cell 9633, the battery 9635, the DCDC converter 9636, a converter 9638, switches SW1 to SW3, and the display portion 9631 are illustrated in FIG. 5C, and the battery 9635, the DCDC converter 9636, the converter 9638, and the switches SW1 to SW3 correspond to the charge and discharge control circuit 9634 illustrated in FIG. 5B.

An example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9638 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

Figure 5C:
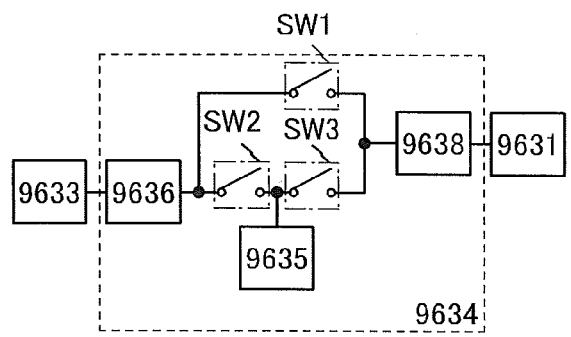

It is needless to say that one embodiment of the present invention is not limited to the electronic device illustrated in FIGS. 5A to 5C as long as the display portion described in this embodiment is included.

As described above, the electronic devices can be obtained by application of the light-emitting device of one embodiment of the present invention. The light-emitting device has a remarkably wide application range, and can be applied to electronic devices in a variety of fields.

Note that the structure described in this embodiment can be combined as appropriate with any of the structures described in the other embodiments.

Embodiment 6

In this embodiment, examples of lighting devices will be described with reference to FIG. 6. A light-emitting device including a light-emitting element which is one embodiment of the present invention is applied to the lighting devices.

Figure 6:
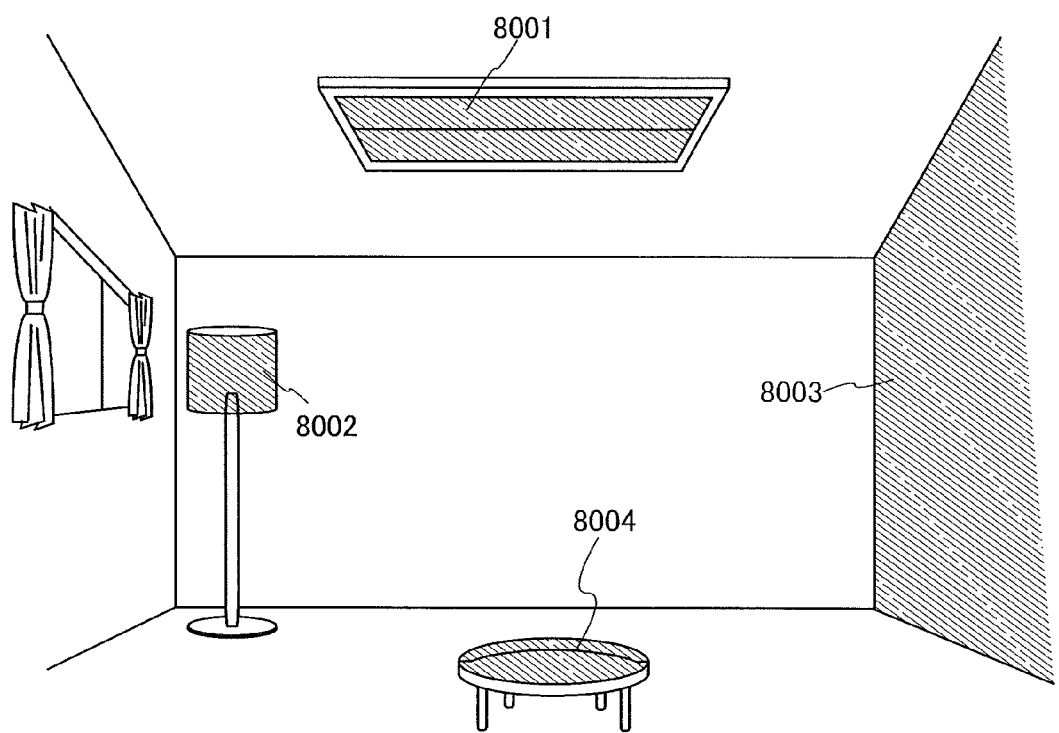
FIG. 6 illustrates lighting devices.

FIG. 6 illustrates an example in which the light-emitting device is used as an indoor lighting device 8001. Since the light-emitting device can have a large area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

EXAMPLE 1

Synthesis Example 1

In this example, description will be given of a method for synthesizing N-(4-biphenyl)-N-(9,9-dimethyl-9H-fluoren-2-yl)dibenzofuran-4-amine (abbreviation: FrBiF), which is the organic compound of one embodiment of the present invention represented by Structural Formula (100) in Embodiment 1. The structure of FrBiF is shown below.

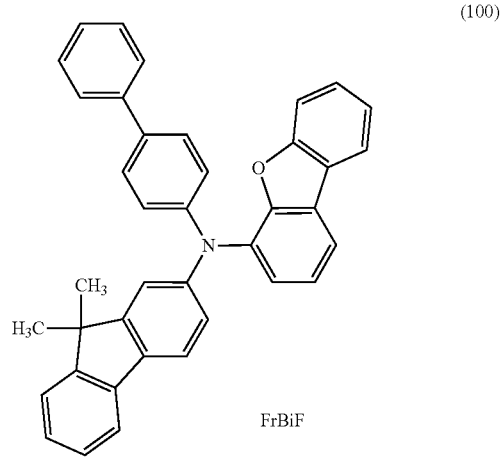 [SMILES: CC1(C)c2ccccc2-c2ccc(N(c3ccc(-c4ccccc4)cc3)c3cccc4c3oc3ccccc34)cc21 ; "FrBiF"]

(100)

<Synthesis of FrBiF>

Into a 200-mL three-neck flask were put 2.3 g (6.4 mmol) of N-(4-biphenyl)-9,9-dimethyl-9H-fluoren-2-amine, 1.9 g (6.4 mmol) of 4-iododibenzofuran, and 1.9 g (19 mmol) of sodium tert-butoxide. To the mixture was added 35 mL of toluene and 0.2 mL of tri(tert-butyl)phosphine (a 10% hexane solution), and the mixture was degassed by being stirred while the pressure was being reduced.

To the mixture was added 37 mg (0.064 mmol) of bis(dibenzylideneacetone)palladium(0), and the mixture was heated and stirred under a nitrogen stream at 110° C. for 8.5 hours. After the stirring, toluene was added to this mixture and the resulting mixture was suction-filtered through Florisil, Celite, and alumina to give a filtrate. The obtained filtrate was washed with water and then with a saturated aqueous solution of sodium chloride, and the organic layer was dried over magnesium sulfate. This mixture was separated by gravity filtration, and the filtrate was concentrated to give a solid. This solid was purified by silica gel column chromatography. The silica gel column chromatography was conducted using a developing solvent of toluene and hexane (toluene:hexane=1:2). The obtained fraction was concentrated to give a solid. The obtained solid was recrystallized from hexane to give 2.6 g of a white solid which was a target substance in a yield of 76%.

Then, the obtained white solid was purified by sublimation using a train sublimation method. In the purification by sublimation, the white solid was heated at 210° C. under a pressure of 3.1 Pa with a flow rate of argon of 5 mL/min. After the purification by sublimation, 1.1 g of a pale yellow solid was obtained at a collection rate of 52%. Synthesis Scheme (A-1) of the above synthesis method is shown below.

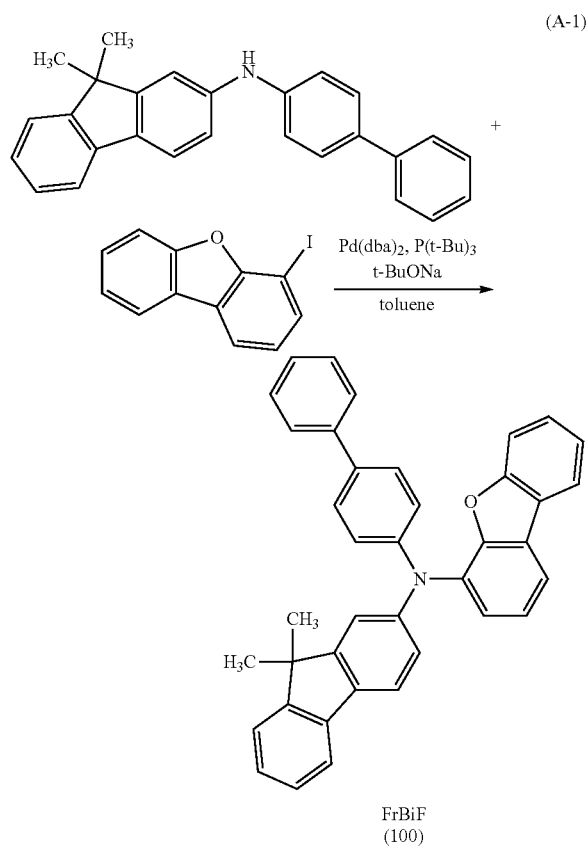

Figure 7:
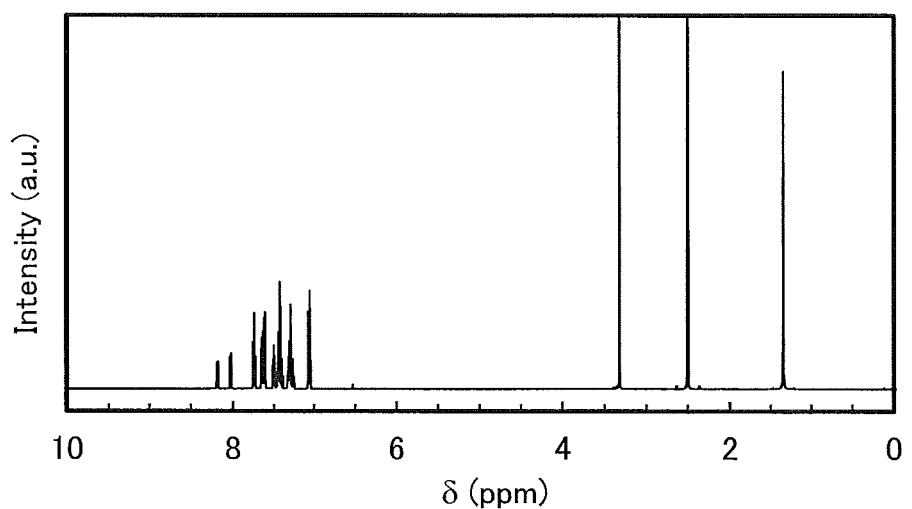
FIG. 7 shows a $^1$H NMR chart of an organic compound represented by Structural Formula (100).

The following shows analysis results by nuclear magnetic resonance ($^1$H-NMR) spectroscopy of the pale yellow solid obtained by the above-described synthesis method. The $^1$H-NMR chart is shown in FIG. 7. From the $^1$H-NMR chart, it was found that FrBiF, the organic compound of one embodiment of the present invention represented by Structural Formula (100), was obtained in Synthesis Example 1.

$^1$H-NMR (DMSO-$d_6$, 500 MHz): δ=1.34 (s, 6H), 7.04-7.07 (m, 3H), 7.25-7.33 (m, 5H), 7.39-7.52 (m, 7H), 7.62 (d, J1=8.5 Hz, 2H), 7.65 (d, J1=7.5 Hz, 2H), 7.75 (t, J1=7.5 Hz, 2H), 8.03 (dd, J1=7.5 Hz, J2=1.5 Hz, 1H), 7.71 (d, J1=7.0 Hz, 1H).

Next, ultraviolet-visible absorption spectra (hereinafter, simply referred to as "absorption spectra") and emission spectra of a solution and a thin film of FrBiF were measured. The measurements of the absorption spectra were conducted at room temperature, for which an ultraviolet-visible light spectrophotometer (V550 type manufactured by JASCO Corporation) was used. For the measurements, a toluene solution of FrBiF was put in a quartz cell, and a thin film of FrBiF was formed by depositing FrBiF by evaporation on a quartz substrate. The measurements of the emission spectra were conducted at room temperature, for which a fluorescence spectrophotometer (FS920 manufactured by Hamamatsu Photonics K. K.) was used. For the measurements, a toluene solution of FrBiF was put in a quartz cell, and a thin film of FrBiF was formed by depositing FrBiF by evaporation on a quartz substrate.

Figure 8A:
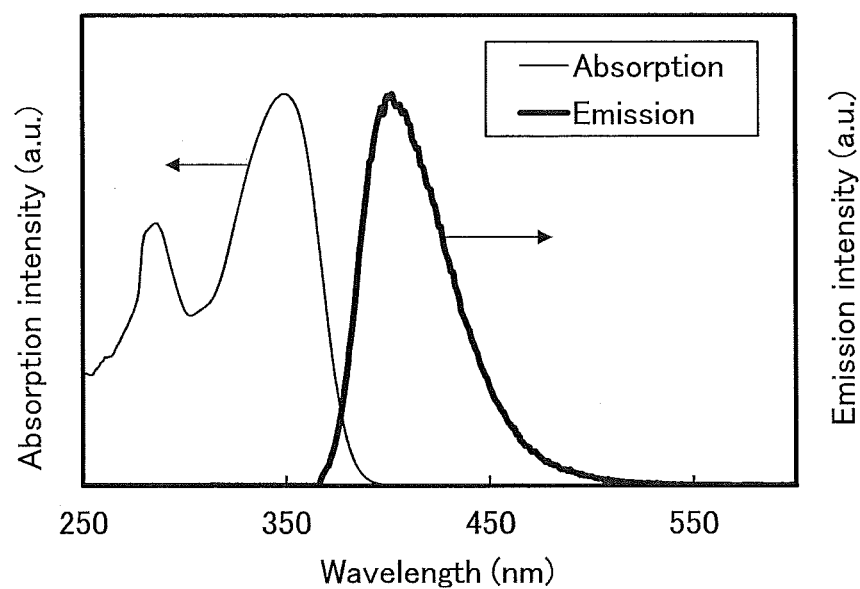
FIGS. 8A and 8B show ultraviolet-visible absorption spectra and emission spectra of an organic compound represented by Structural Formula (100).
Figure 8B:
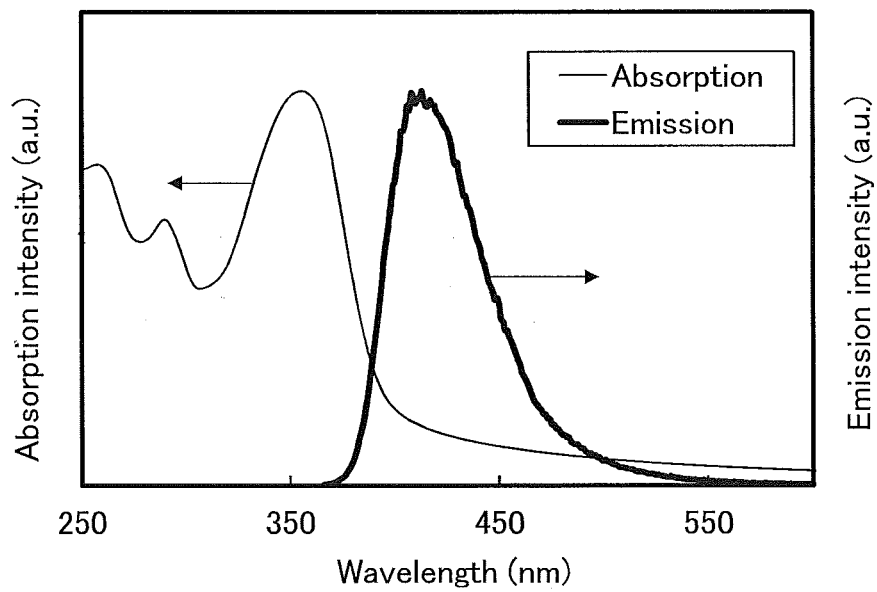

FIG. 8A shows the absorption spectrum and emission spectrum of the solution. FIG. 8B shows the absorption spectrum and emission spectrum of the thin film. In each of FIGS. 8A and 8B, the horizontal axis represents wavelength and the vertical axes represent absorption intensity and emission intensity. In each of FIGS. 8A and 8B, two solid lines are shown; a thin line represents the absorption spectrum, and a thick line represents the emission spectrum. The absorption spectrum of the solution in FIG. 8A was obtained by subtraction of an absorption spectrum of toluene from a raw spectrum. The absorption spectrum of the thin film in FIG. 8B was obtained by subtraction of an absorption spectrum of the quartz substrate from a raw spectrum.

As shown in FIGS. 8A and 8B, the solution of FrBiF shows absorption peaks at 286 nm and 349 nm and an emission peak at 401 nm. In the case of the thin film, absorption peaks were observed at 259 nm, 291 nm, and 356 nm and an emission peak was observed at 413 nm.

Next, FrBiF obtained in this example was subjected to a MS analysis by liquid chromatography mass spectrometry (LC/MS).

In the LC/MS, liquid chromatography (LC) separation was carried out with ACQUITY UPLC (manufactured by Waters Corporation) and mass spectrometry (MS) was carried out with Xevo G2 T of MS (manufactured by Waters Corporation). ACQUITY UPLC BEH C8 (2.1×100 mm, 1.7 µm) was used as a column for the LC separation, and the column temperature was 40° C. Acetonitrile was used for Mobile Phase A and a 0.1% aqueous solution of formic acid was used for Mobile Phase B. A sample was prepared in such a manner that FrBiF was dissolved in toluene at a given concentration and the solution was diluted with acetonitrile. The injection amount was 5.0 µL.

Figure 9A:
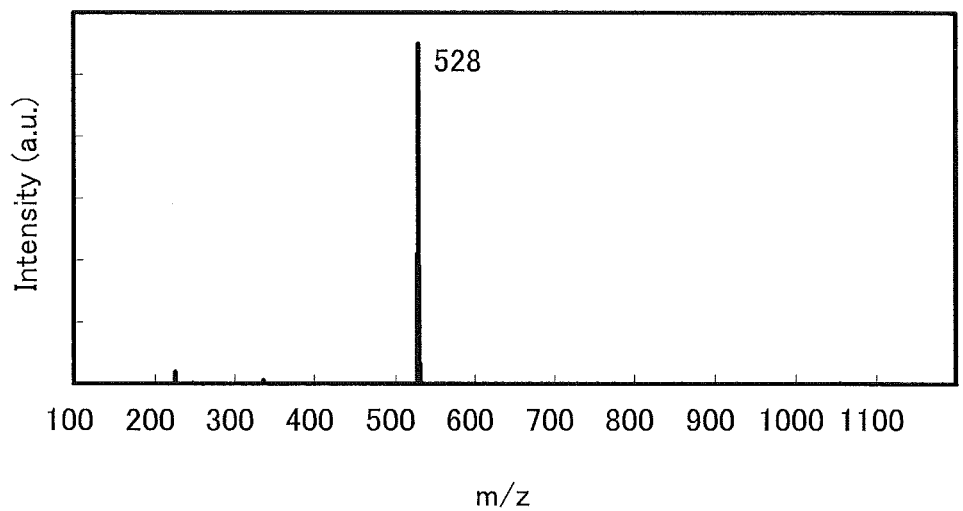
FIGS. 9A and 9B show results of LC/MS analysis of an organic compound represented by Structural Formula (100).
Figure 9B:
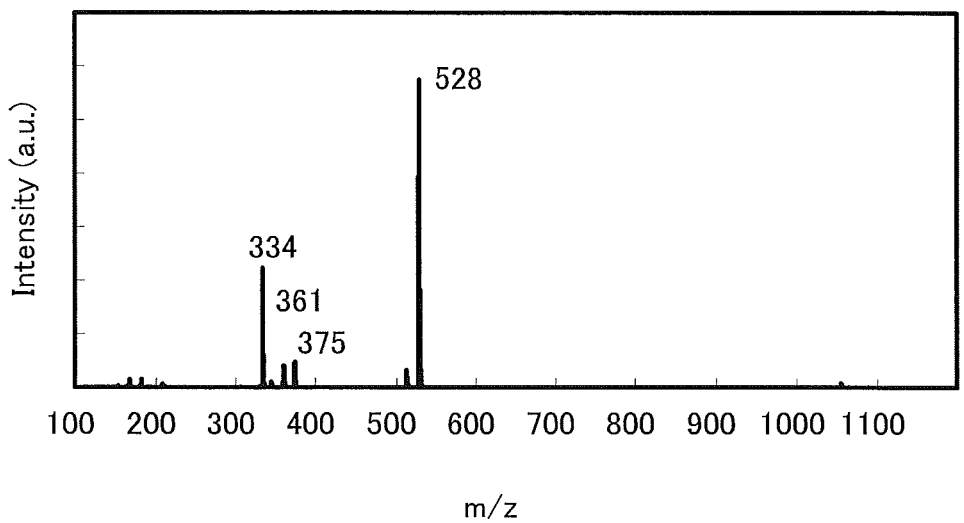

In the MS analysis, ionization was carried out by an electrospray ionization (abbreviation: ESI) method. At this time, the capillary voltage and the sample cone voltage were set to 3.0 kV and 30 V, respectively, and detection was performed in a positive mode. All the components that were ionized under the above conditions were collided with an argon gas in a collision cell to dissociate into product ions. Energy (collision energy) for the collision with argon was 6 eV and 30 eV. A mass range for the measurement was m/z=100-1120. The detection results of the generated product ions by time-of-flight (TOF) MS are shown in FIGS. 9A and 9B. FIG. 9A shows the measurement results in the case of a collision energy of 6 eV. FIG. 9B shows the measurement results in the case of a collision energy of 30 eV.

As shown in FIG. 9A, owing to the hydrogen ions and isotopes, a plurality of ions of FrBiF were detected mainly around m/z=528 when the collision energy was 6 eV. The results in FIG. 9A can be regarded as important data in identification of FrBiF.

As shown in FIG. 9B, when the collision energy was 30 eV, ions that were not detected when the collision energy was 6 eV were detected. Owing to the hydrogen ions and isotopes, precursor ions of FrBiF were detected mainly around m/z=528 and a plurality of product ions thereof were detected around m/z=375, m/z=361, and m/z=334 when the collision energy was 30 eV. Note that the results in FIGS. 9A and 9B show that the plurality of product ions detected around m/z=375, m/z=361, and m/z=334 were derived from FrBiF, and the results can be regarded as important data in identification of FrBiF contained in a mixture.

Note that the product ion around m/z=375 is presumed to be a cation in the state where a biphenyl group was eliminated from FrBiF, which suggests that FrBiF has a biphenyl group.

The product ion around m/z=361 is presumed to be a cation in the state where a dibenzofuranyl group was eliminated from FrBiF, which suggests that FrBiF has a dibenzofuranyl group.

The product ion around m/z=334 is presumed to be a cation in the state where a dimethylfluorenyl group was eliminated from FrBiF, which suggests that FrBiF has a dimethylfluorenyl group.

EXAMPLE 2

Figure 10:
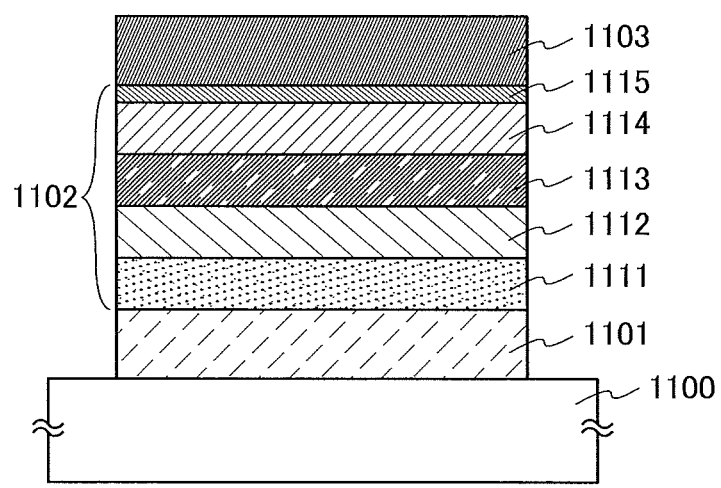
FIG. 10 illustrates a light-emitting element of Examples.

In this example, a light-emitting element 1 (Element 1) using N-(4-biphenyl)-N-(9,9-dimethyl-9H-fluoren-2-yl)dibenzofuran-4-amine (abbreviation: FrBiF, Structural Formula (100), which is the organic compound of one embodiment of the present invention, in a light-emitting layer will be described with reference to FIG. 10. Chemical formulae of materials used in this example are shown below.

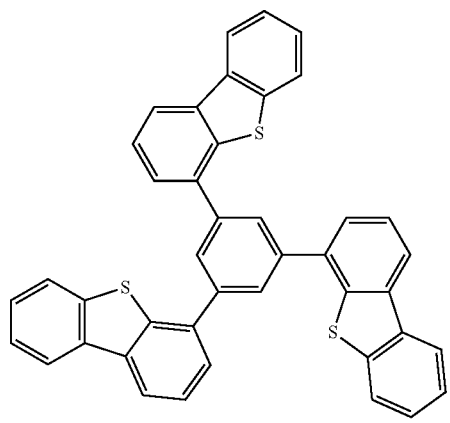

DBT3P-II

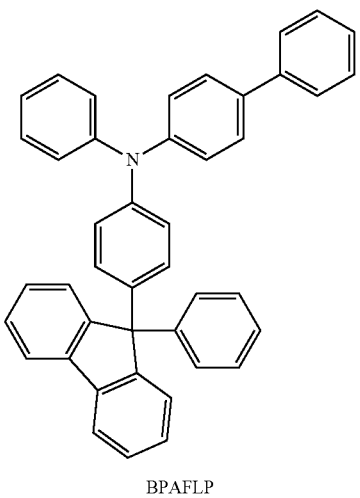

BPAFLP

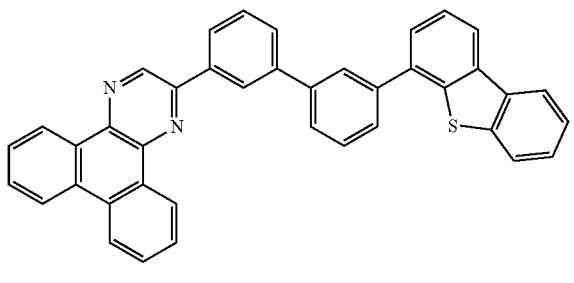

2mDBTBPDBq-II

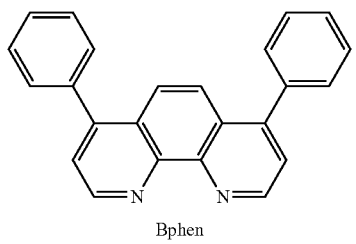

Bphen

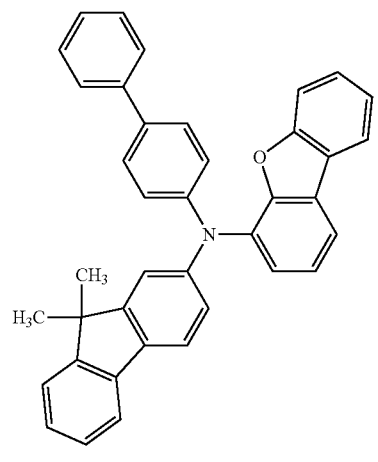

FrBiF (100)

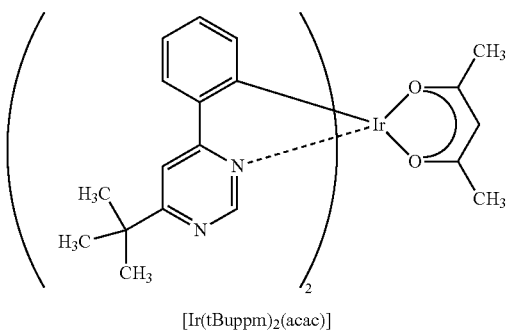

[Ir(tBuppm)₂(acac)]

<<Fabrication of Light-Emitting Element 1>>

First, indium tin oxide containing silicon oxide (ITSO) was deposited over a glass substrate 1100 by a sputtering method, so that a first electrode 1101 which functions as an anode was formed. The thickness was 110 nm and the electrode area was 2 mm×2 mm.

Then, as pretreatment for forming the light-emitting element 1 over the substrate 1100, UV ozone treatment was performed for 370 seconds after washing a surface of the substrate with water and baking the substrate at 200° C. for 1 hour.

After that, the substrate was transferred into a vacuum evaporation apparatus where the pressure was reduced to approximately $10^{-4}$ Pa, and was subjected to vacuum baking at 170° C. for 30 minutes in a heating chamber of the vacuum evaporation apparatus, and then the substrate 1100 was cooled down for approximately 30 minutes.

Next, the substrate 1100 was fixed to a holder provided in the vacuum evaporation apparatus so that a surface of the substrate 1100 over which the first electrode 1101 was formed faced downward. In this example, a case will be described in which a hole-injection layer 1111, a hole-transport layer 1112, a light-emitting layer 1113, an electron-transport layer 1114, and an electron-injection layer 1115 which are included in an EL layer 1102 are sequentially formed by a vacuum evaporation method.

After reducing the pressure of the vacuum evaporation apparatus to $10^{-4}$ Pa, 1,3,5-tri(dibenzothiophen-4-yl)benzene (abbreviation: DBT3P-II) and molybdenum(VI) oxide were co-deposited by evaporation with a mass ratio of DBT3P-II to molybdenum oxide being 4:2, whereby the hole-injection layer 1111 was formed over the first electrode 1101. The thickness of the hole-injection layer 1111 was 20 nm. Note that the co-deposition is a deposition method in which some different substances are evaporated from some different evaporation sources at the same time.

Then, 4-phenyl-4'-(9-phenylfluoren-9-yl)triphenylamine (abbreviation: BPAFLP) was deposited by evaporation to a thickness of 20 nm, so that the hole-transport layer 1112 was formed.

Next, the light-emitting layer 1113 was formed over the hole-transport layer 1112 in the following manner: 2-[3'-(dibenzothiophen-4-yl)biphenyl-3-yl]dibenzo[f,h]quinoxaline (abbreviation: 2mDBTBPDBq-II), FrBiF, and (acetylacetonato)bis(6-tert-butyl-4-phenylpyrimidinato)iridium (III) (abbreviation: [Ir(tBuppm)₂(acac)]) were co-deposited by evaporation to a thickness of 20 nm with a mass ratio of 2mDBTBPDBq-II to FrBiF and [Ir(tBuppm)₂(acac)] being 0.7:0.3:0.05; then, 2mDBTBPDBq-II, FrBiF, and [Ir(tBuppm)₂(acac)] were co-deposited by evaporation to a thickness of 20 nm with a mass ratio of 2mDBTBPDBq-II to FrBiF and [Ir(tBuppm)₂(acac)] being 0.8:0.2:0.05.

Then, over the light-emitting layer 1113, 2mDBTBPDBq-II was deposited by evaporation to a thickness of 10 nm and then bathophenanthroline (abbreviation: Bphen) was deposited by evaporation to a thickness of 15 nm, whereby the electron-transport layer 1114 was formed. Furthermore, lithium fluoride was deposited by evaporation to a thickness of 1 nm over the electron-transport layer 1114, whereby the electron-injection layer 1115 was formed.

Finally, aluminum was deposited by evaporation to a thickness of 200 nm over the electron-injection layer 1115 to form a second electrode 1103 serving as a cathode; thus, the light-emitting element 1 was obtained. Note that in all the above evaporation steps, evaporation was performed by a resistance-heating method.

The element structure of the light-emitting element 1 obtained as described above is shown in Table 1.

TABLE 1

| Structure of Light-emitting Element 1 (Element 1) | | | | | | | | |
|---|---|---|---|---|---|---|---|---|
| First Electrode | HIL[a] | HTL[b] | LEL[c] | | ETL[d] | | EIL[e] | Second Electrode |
| | | | 1st | 2nd | 1st | 2nd | | |
| ITSO (110 nm) | DBT3P-II:MoO$_x$ (4:2 20 nm) | BPAFLP (20 nm) | [f] | [g] | 2mDBTBPDBq-II (10 nm) | Bphen (15 nm) | LiF (1 nm) | Al (200 nm) |

[a]Hole-injection layer.
[b]Hole-transport layer.
[c]Light-emitting layer.
[d]Electron-transport layer.
[e]Electron-injection layer.
[f]2mDBTBPDBq-II:FrBiF:[Ir(tBuppm)₂(acac)] = 0.7:0.3:0.05 (20 nm).
[g]2mDBTBPDBq-II:FrBiF:[Ir(tBuppm)₂(acac)] = 0.8:0.2:0.05 (20 nm).

The fabricated light-emitting element 1 was sealed in a glove box containing a nitrogen atmosphere so as not to be exposed to the air (specifically, a sealant was applied onto an outer edge of the element and heat treatment was performed at 80° C. for 1 hour at the time of sealing).

<<Operation Characteristics of Light-Emitting Element 1>>

Operation characteristics of the light-emitting element 1 were measured. Note that the measurement was carried out at room temperature (under an atmosphere in which the temperature was kept at 25° C.).

Figure 11:
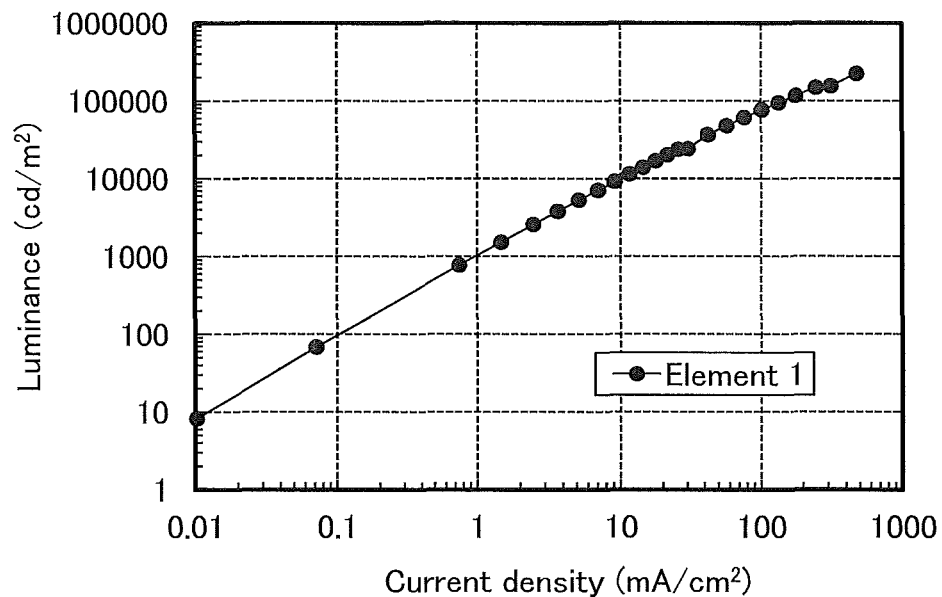
FIG. 11 shows current density-luminance characteristics of a light-emitting element 1 (Element 1).
Figure 12:
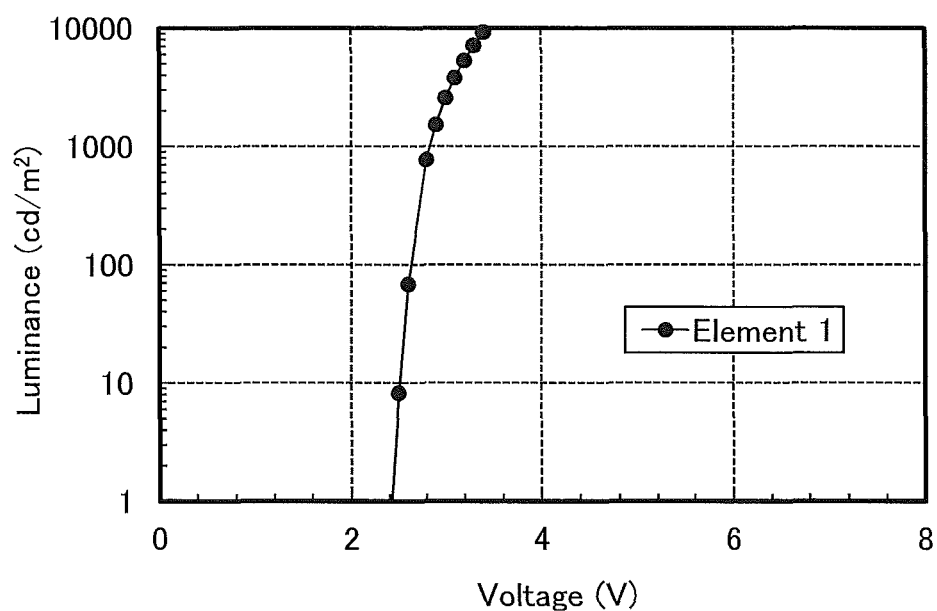
FIG. 12 shows voltage-luminance characteristics of a light-emitting element 1.
Figure 13:
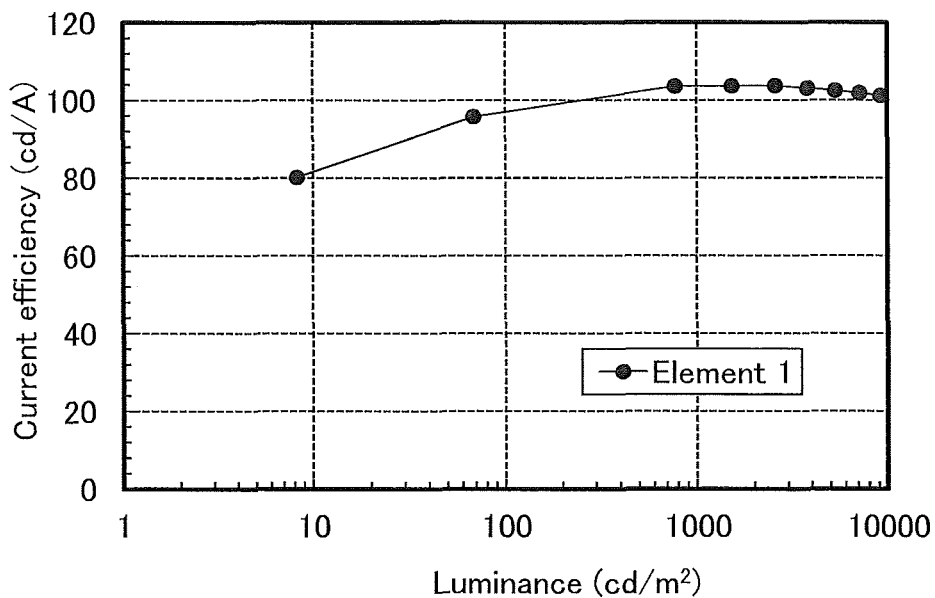
FIG. 13 shows luminance-current efficiency characteristics of a light-emitting element 1.
Figure 14:
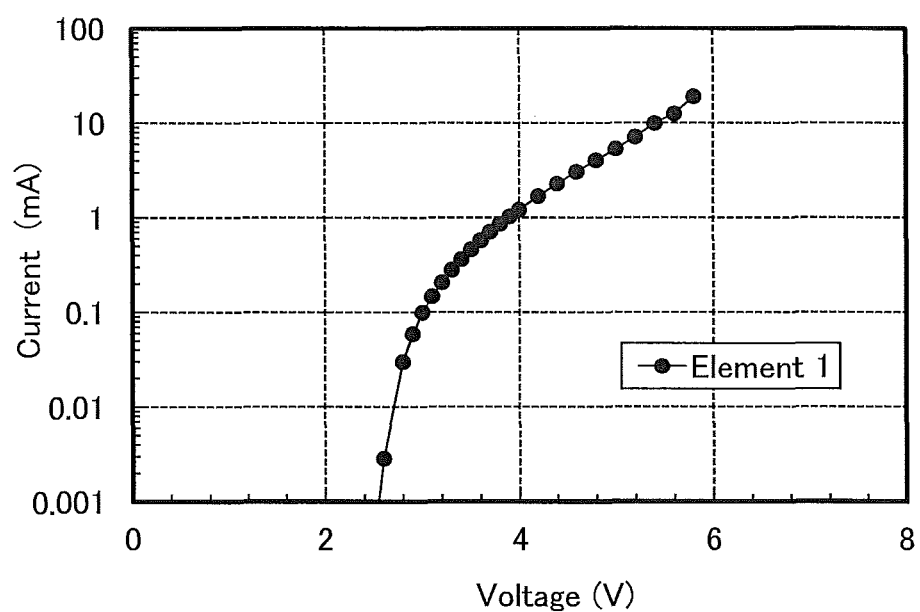
FIG. 14 shows voltage-current characteristics of a light-emitting element 1.

FIG. 11 shows current density-luminance characteristics of the light-emitting element 1. In FIG. 11, the vertical axis represents luminance (cd/m$^2$) and the horizontal axis represents current density (mA/cm$^2$). FIG. 12 shows voltage-luminance characteristics of the light-emitting element 1. In FIG. 12, the vertical axis represents luminance (cd/m$^2$) and the horizontal axis represents voltage (V). FIG. 13 shows luminance-current efficiency characteristics of the light-emitting element 1. In FIG. 13, the vertical axis represents current efficiency (cd/A) and the horizontal axis represents luminance (cd/m$^2$). FIG. 14 shows voltage-current characteristics of the light-emitting element 1. In FIG. 14, the vertical axis represents current (mA) and the horizontal axis represents voltage (V).

FIG. 13 reveals that the light-emitting element 1 of one embodiment of the present invention has high efficiency. Table 2 shows initial main characteristics of the light-emitting element 1 at a luminance of approximately 800 cd/m$^2$.

TABLE 2

Initial main characteristics of Light-emitting Element 1 (Element 1)

| Voltage (V) | Current (mA) | Current Density (mA/cm$^2$) | Chromaticity (x, y) | Luminance (cd/m$^2$) | Current Efficiency (cd/A) | Power Efficiency (lm/W) | External Quantum Efficiency (%) |
|---|---|---|---|---|---|---|---|
| 2.8 | 0.03 | 0.75 | (0.41, 0.58) | 780 | 100 | 120 | 27 |

The above results show that the light-emitting element 1 fabricated in this example is a light-emitting element having high current efficiency. Moreover, it was found that the light-emitting element exhibits yellowish green light emission with excellent color purity.

Figure 15:
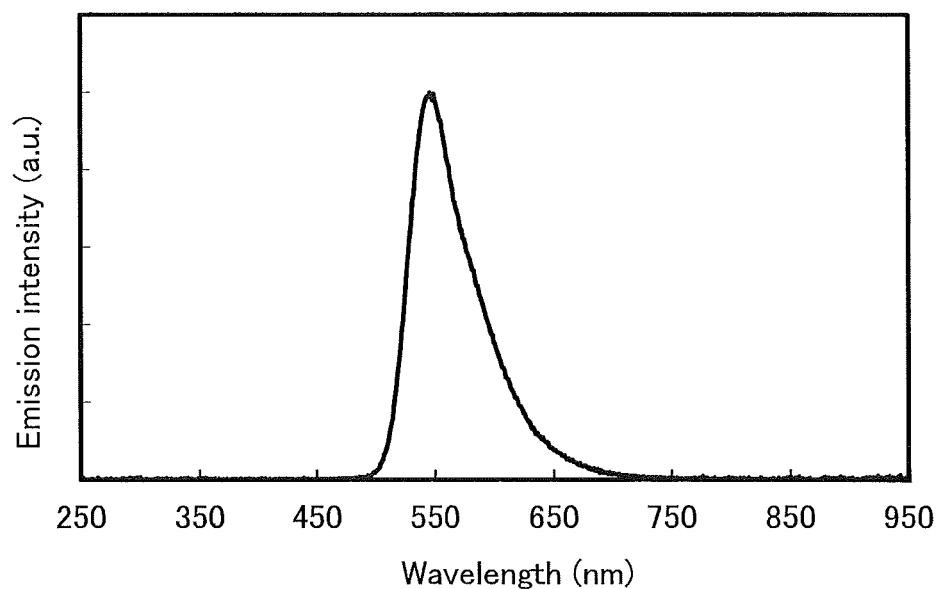
FIG. 15 shows an emission spectrum of a light-emitting element 1.

FIG. 15 shows an emission spectrum at a current density of 25 mA/cm$^2$. As shown in FIG. 15, the emission spectrum of the light-emitting element 1 has a peak at 550 nm and it is suggested that the peak is derived from emission of the organometallic complex [Ir(tBuppm)$_2$(acac)].

Figure 16:
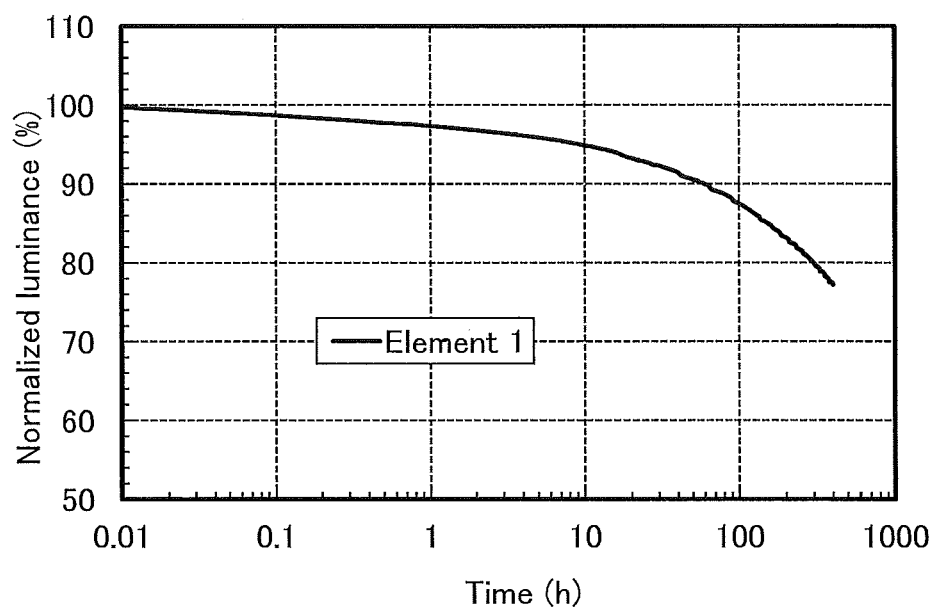
FIG. 16 shows reliability of a light-emitting element 1.

The light-emitting element 1 was subjected to a reliability test. Results of the reliability test are shown in FIG. 16. In FIG. 16, the vertical axis represents normalized luminance (%) with an initial luminance of 100% and the horizontal axis represents driving time (h) of the element. Note that in the reliability test, the light-emitting element 1 was driven under the conditions where the initial luminance was set to 5000 cd/m$^2$ and the current density was constant. The light-emitting element 1 kept approximately 87% of the initial luminance after 100 hours elapsed.

Thus, the reliability test showed that the light-emitting element 1 is highly reliable. In addition, it was confirmed that with the use of the organic compound of one embodiment of the present invention, a light-emitting element which has a long lifetime in addition to high efficiency can be obtained.

EXAMPLE 3

In this example, a mixed film (A) contains 2mDBTBPDBq-II as one of two kinds of organic compounds forming an exciplex and FrBiF (HOMO=−5.48 (eV)), which is the organic compound of one embodiment of the present invention, as the other of the two kinds of organic compounds forming an exciplex. An emission spectrum of this mixed film (A) was measured. The measurement of the emission spectrum was conducted at room temperature with a fluorescence spectrophotometer (FS920 manufactured by Hamamatsu Photonics K. K.). For the measurement, the mixed film (A) and a mixed film (B) were each deposited on a quartz substrate.

The mixed film (A) was formed by co-evaporating 2mDBTBPDBq-II and FrBiF on a quartz substrate to a thickness of 50 nm in a vacuum evaporation apparatus in which the pressure was reduced to 10$^{-4}$ Pa, such that a mass ratio of 2mDBTBPDBq-II to FrBiF was 0.8:0.2.

As a comparative example, the mixed film (B) was formed by the same method as that used for forming the mixed film (A) by using an organic compound N-(1,1'-biphenyl-4-yl)-9,9-dimethyl-N-[4-(9-phenyl-9H-carbazol-3-yl)phenyl]-9H-fluor en-2-amine (abbreviation: PCBBiF), whose HOMO level (−5.36 (eV)) is higher than that of FrBiF, instead of FrBiF and subjected to measurement of an emission spectrum.

Figure 17A:
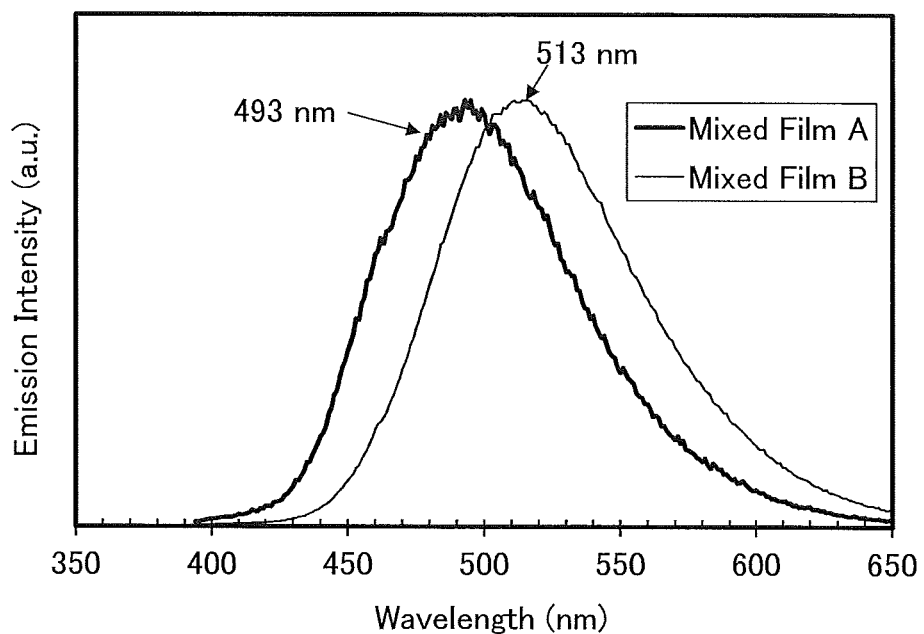
FIG. 17A shows emission spectra of a mixed film (A) and a mixed film (B)
Figure 17B:
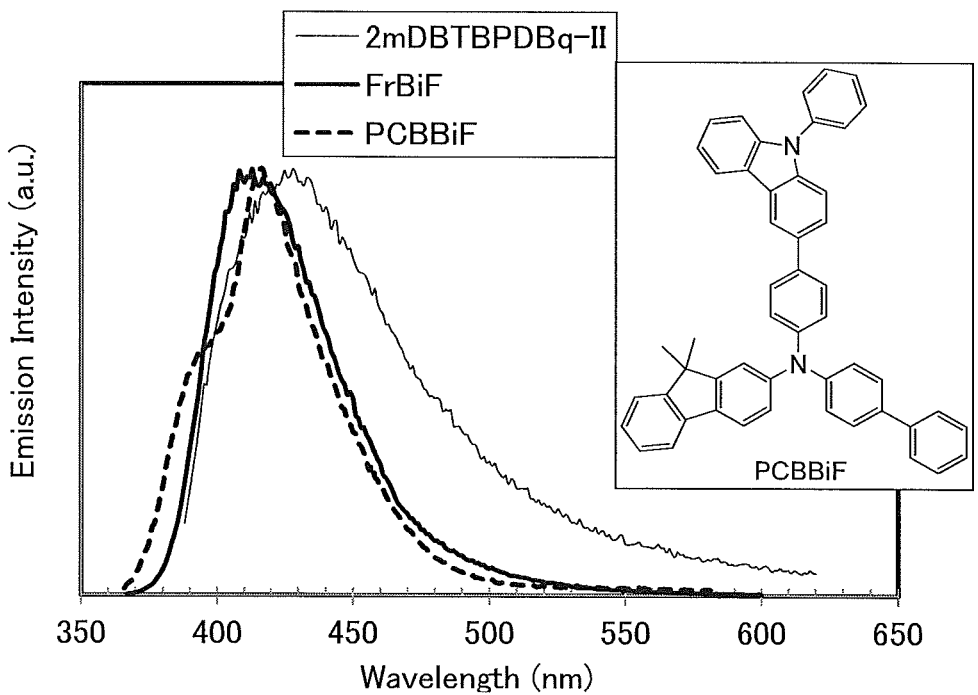
FIG. 17B shows emission spectra of a film of an organic compound represented by Structural Formula (100) (FrBiF), a film of 2-[3'-(dibenzothiophen-4-yl)biphenyl-3-yl]dibenzo[f,h]quinoxaline (2mDBTBPDBq-II), and a film of N-(1,1'-biphenyl-4-yl)-9,9-dimethyl-N-[4-(9-phenyl-9H-carbazol-3-yl)phenyl]-9H-fluor en-2-amine (PCBBiF).

FIG. 17A shows measurement results. Here, emission spectra of single films of FrBiF, PCBBiF, and 2mDBTBPDBq-II are shown in FIG. 17B. As shown in FIG. 17A, the emissions of the single films of FrBiF, PCBBiF, and 2mDBTBPDBq-II were not observed, while a broad emission was obtained in a long-wavelength region, which means that each of the mixed films (A) and (B) provides an exciplex. Note that the emission spectrum of the mixed film (A) is located on a shorter wavelength side than the emission spectrum of the mixed film (B). Hence, the mixed film (A) has an advantage in exciting a material giving an emission with a shorter wavelength.

Consequently, the use of the organic compound of one embodiment of the present invention in a light-emitting layer of a light-emitting element enables formation of an exciplex, and by utilizing the exciplex, light emission can be obtained from a guest material that has a short emission wavelength (e.g., approximately 450 nm to 550 nm). Owing to this, the emission efficiency of the light-emitting element can be effectively enhanced.

EXAMPLE 4

Synthesis Example 2

In this example, description will be given of a method for synthesizing N-(4-biphenyl)-N-(9,9-dimethyl-9H-fluoren-2-yl)dibenzofuran-2-amine (abbreviation: FrBiF-02), which is the organic compound of one embodiment of the present invention represented by Structural Formula (103) in Embodiment 1. The structure of FrBiF-02 is shown below.

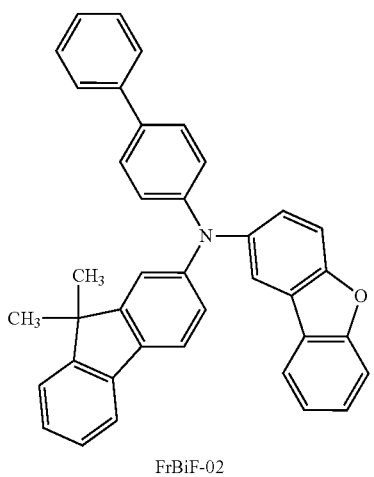

FrBiF-02
(103)

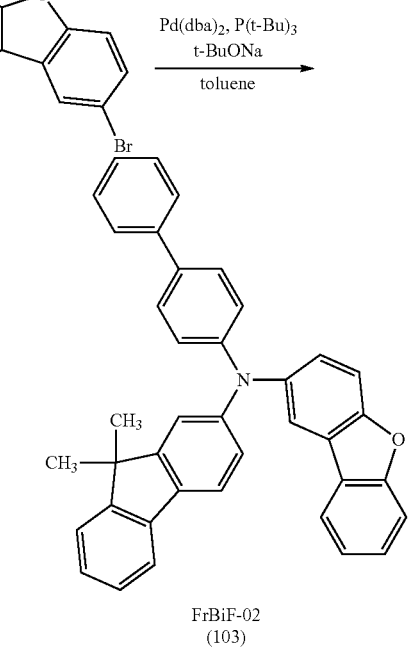

FrBiF-02
(103)

<Synthesis of FrBiF-02>

Into a 200-mL three-neck flask were put 2.1 g (5.7 mmol) of N-(4-biphenyl)-9,9-dimethyl-9H-fluoren-2-amine, 1.4 g (5.7 mmol) of 2-bromodibenzofuran, and 1.6 g (17 mmol) of sodium tert-butoxide. To the mixture was added 30 mL of toluene and 0.2 mL of tri(tert-butyl)phosphine (a 10% hexane solution), and the mixture was degassed by being stirred while the pressure was being reduced. To the mixture was added 33 mg (0.057 mmol) of bis(dibenzylideneacetone)palladium(0), and the mixture was heated and stirred under a nitrogen stream at 110° C. for 19.5 hours.

After the stirring, toluene was added to this mixture and the resulting mixture was suction-filtered through Florisil, Celite, and alumina to give a filtrate. The obtained filtrate was washed with water and then with a saturated aqueous solution of sodium chloride, and the organic layer was dried over magnesium sulfate. This mixture was separated by gravity filtration, and the filtrate was concentrated to give an oily substance.

This oily substance was purified by silica gel column chromatography. The silica gel column chromatography was conducted using a developing solvent of toluene and hexane (toluene:hexane=1:2). The obtained fraction was concentrated to give 1.5 g of a white solid which was a target substance in a yield of 49%.

Then, 1.3 g of the obtained white solid was purified by sublimation using a train sublimation method. In the purification by sublimation, the white solid was heated at 220° C. under a pressure of 2.8 Pa with a flow rate of argon of 5 mL/min. After the purification by sublimation, 1.1 g of a pale yellow solid was obtained at a collection rate of 90%. Synthesis Scheme (B-1) of the above synthesis method is shown below.

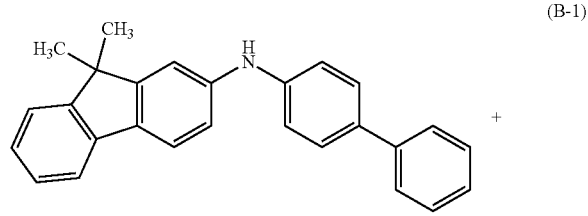

(B-1)

Figure 18A:
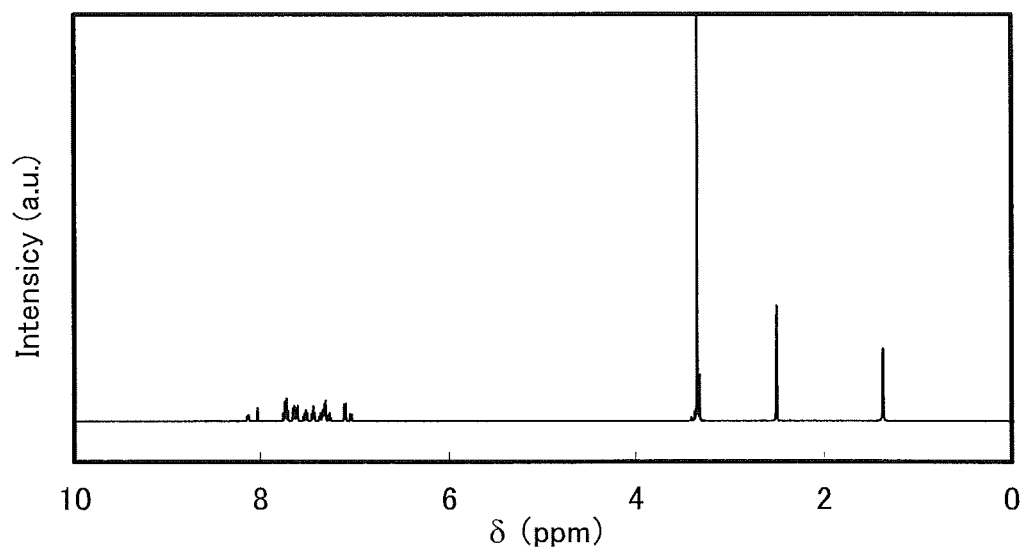
FIGS. 18A and 18B are $^1$H NMR charts of an organic compound represented by Structural Formula (103).
Figure 18B:
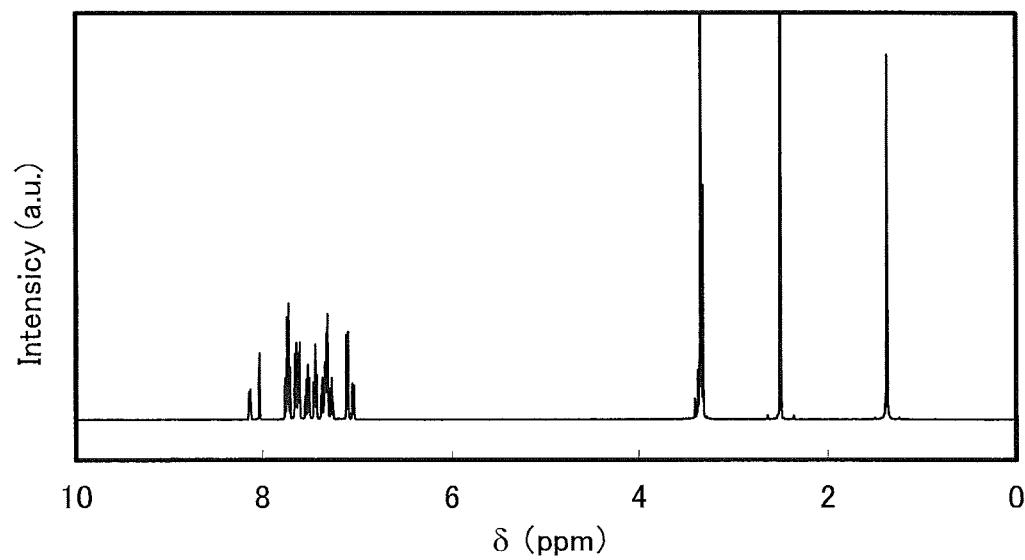

The following shows analysis results by nuclear magnetic resonance ($^1$H-NMR) spectroscopy of the pale yellow solid obtained by the above-described synthesis method. The $^1$H-NMR charts are shown in FIGS. 18A and 18B. From the $^1$H-NMR charts, it was found that FrBiF-02, the organic compound of one embodiment of the present invention represented by Structural Formula (103), was obtained in Synthesis Example 2.

$^1$H-NMR (DMSO-$d_6$, 500 MHz): δ=1.37 (s, 6H), 7.04 (dd, J1=8.0 Hz, J2=2.0 Hz, 1H), 7.10 (d, J1=8.5 Hz, 2H), 7.26 (t, J1=7.5 Hz, 1H), 7.27-7.37 (m, 5H), 7.43 (d, J1=7.5 Hz, 2H), 7.49-7.54 (m, 2H), 7.61 (d, J1=8.5 Hz, 2H), 7.64 (d, J1=8.0 Hz, 2H), 7.70-7.76 (m, 4H), 8.03 (d, J1=1.5 Hz, 1H), 8.13 (d, J1=7.5 Hz, 1H).

Next, an absorption spectra and emission spectra of a solution and a thin film of FrBiF-02 were measured. The measurements of the absorption spectra were conducted at room temperature, for which an ultraviolet-visible light spectrophotometer (V550 type manufactured by JASCO Corporation) was used. For the measurements, a toluene solution of FrBiF-02 was put in a quartz cell, and a thin film of FrBiF-02 was formed by depositing FrBiF-02 by evaporation on a quartz substrate. The measurements of the emission spectra were conducted at room temperature, for which a fluorescence spectrophotometer (FS920 manufactured by Hamamatsu Photonics K. K.) was used. For the measurements, a toluene solution of FrBiF-02 was put in a quartz cell, and a thin film of FrBiF-02 was formed by depositing FrBiF-02 by evaporation on a quartz substrate.

Figure 19A:
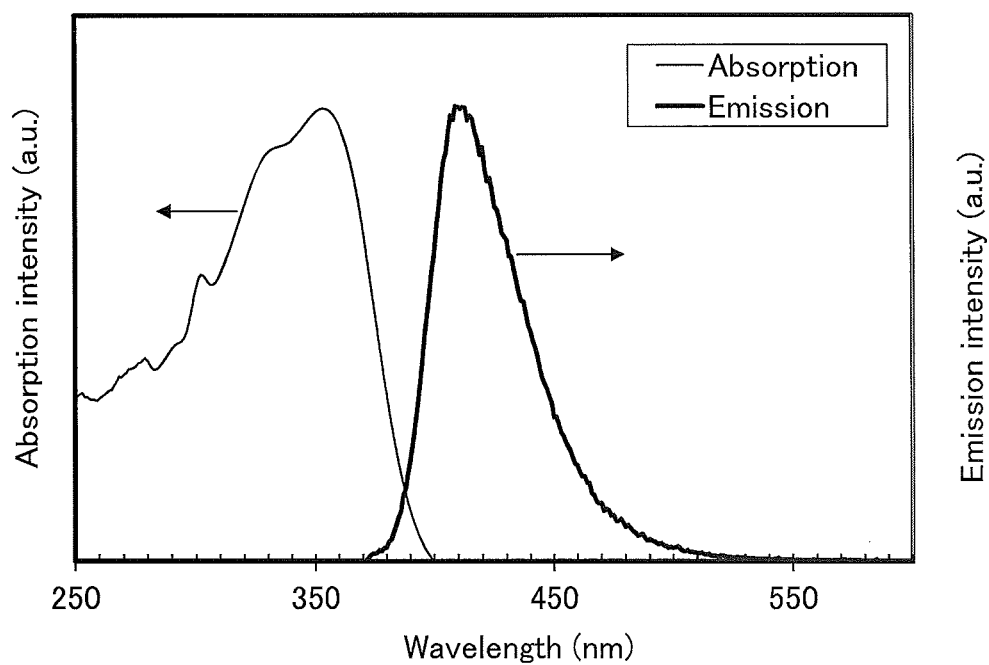
FIGS. 19A and 19B show ultraviolet-visible absorption spectra and emission spectra of an organic compound represented by Structural Formula (103).
Figure 19B:
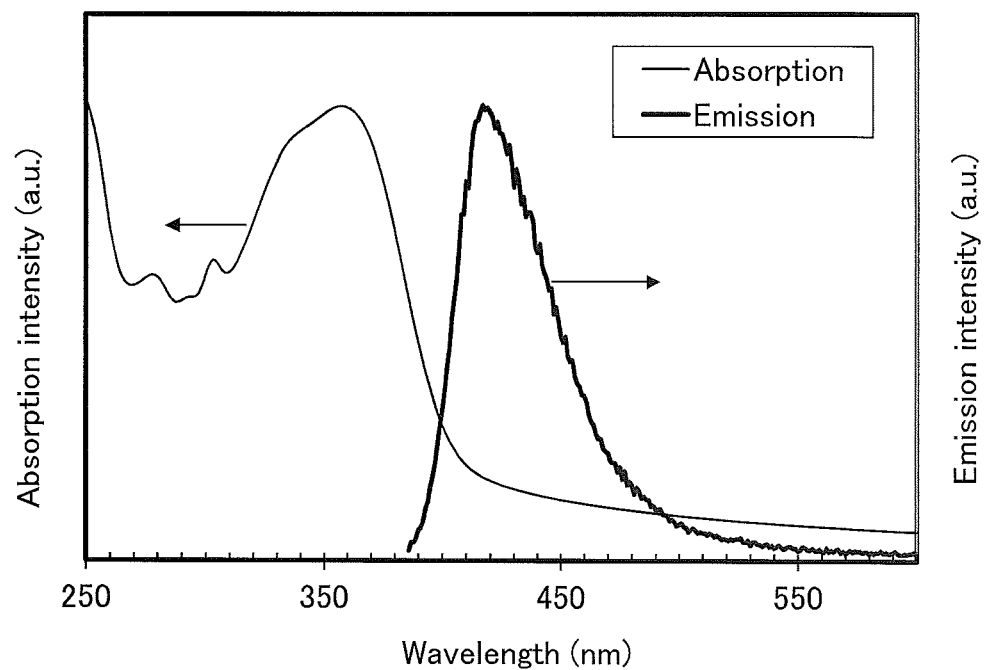

FIG. 19A shows the absorption spectrum and emission spectrum of the solution. FIG. 19B shows the absorption spectrum and emission spectrum of the thin film. In each of FIGS. 19A and 19B, the horizontal axis represents wavelength and the vertical axes represent absorption intensity and emission intensity. In each of FIGS. 19A and 19B, two solid lines are shown; a thin line represents the absorption spectrum, and a thick line represents the emission spectrum. The absorption spectrum of the solution in FIG. 19A was obtained by subtraction of an absorption spectrum of toluene from a raw absorption spectrum. The absorption spectrum of the thin film in FIG. 19B was obtained by subtraction of an absorption spectrum of the quartz substrate from a raw absorption spectrum.

As shown in FIGS. 19A and 19B, in the case of the solution of FrBiF-02, which is the organic compound of one embodiment of the present invention, absorption peaks were observed at 279 nm, 302 nm, 331 nm, and 354 nm and an emission peak was observed at 411 nm (at an excitation wavelength of 362 nm). In the case of the thin film, absorption peaks were observed at 278 nm, 292 nm, 303 nm, 333 nm, and 353 nm and an emission peak was observed at 418 nm (at an excitation wavelength of 375 nm).

Next, FrBiF-02 obtained in this example was subjected to a MS analysis by LC/MS.

The LC/MS, liquid chromatography (LC) separation was carried out with ACQUITY UPLC (manufactured by Waters Corporation) and mass spectrometry (MS) was carried out with Xevo G2 T of MS (manufactured by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% aqueous solution of formic acid was used for Mobile Phase B. A sample was prepared in such a manner that FrBiF-02 was dissolved in toluene at a given concentration and the solution was diluted with acetonitrile. The injection amount was 5.0 μL.

Figure 20A:
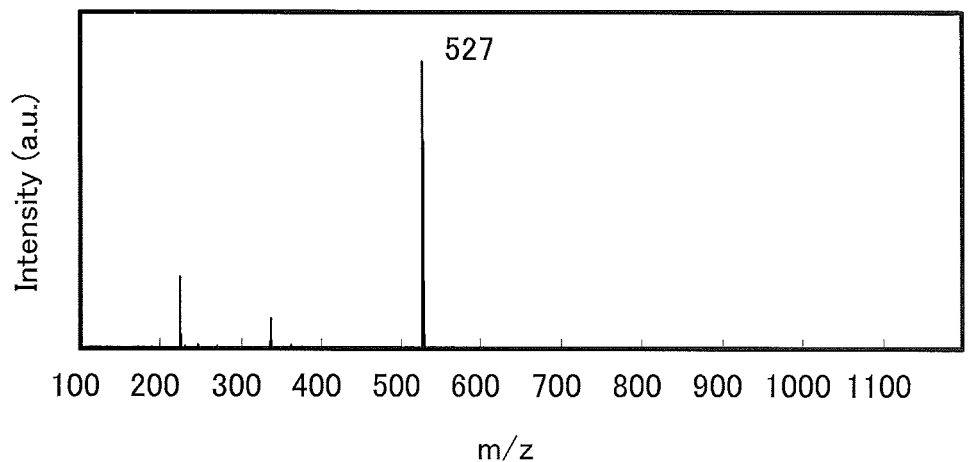
FIGS. 20A and 20B show results of LC/MS analysis of an organic compound represented by Structural Formula (103).
Figure 20B:
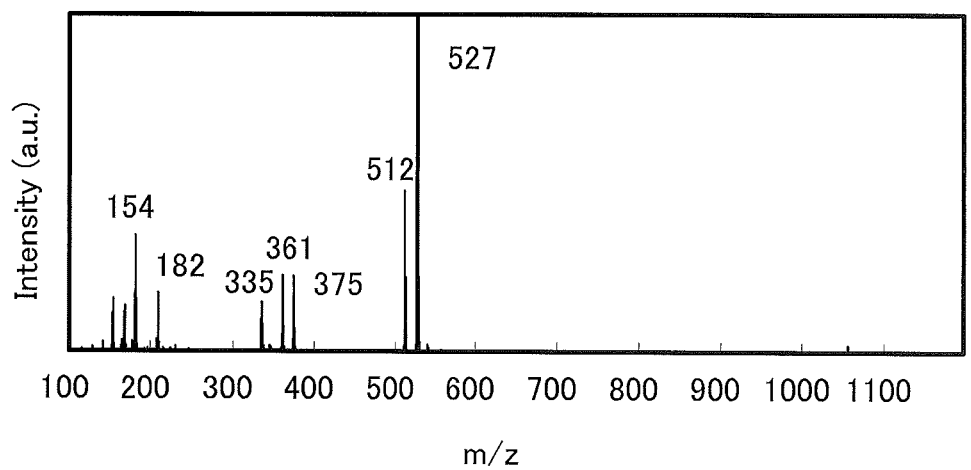

In the MS analysis, ionization was carried out by an electrospray ionization (abbreviation: ESI) method and ions were detected with a time-of-flight (TOF) detector. The capillary voltage and the sample cone voltage for the ionization were set to 3.0 kV and 30 V, respectively, and detection was performed in a positive mode. A component with m/z of 527 which underwent the ionization under the above-described conditions was collided with an argon gas in a collision cell to dissociate into product ions. Energy (collision energy) for the collision with argon was 6 eV and 30 eV. A mass range for the measurement was m/z=100-1120. FIGS. 20A and 20B show results of the LC/MS analysis. FIG. 20A shows the measurement results in the case of a collision energy of 6 eV. FIG. 20B shows the measurement results in the case of a collision energy of 30 eV.

As shown in FIG. 20A, owing to the hydrogen ions and isotopes, a plurality of molecular ions of FrBiF-02 were detected mainly around m/z=527 when the collision energy was 6 eV. The results in FIG. 20A can be regarded as important data in identification of FrBiF-02.

As shown in FIG. 20B, when the collision energy was 30 eV, ions that were not detected when the collision energy was 6 eV were detected. Owing to the hydrogen ions and isotopes, the precursor ions of FrBiF-02 were detected mainly around m/z=527 and a plurality of product ions thereof were detected around m/z=512, m/z=375, m/z=361, and m/z=335 when the collision energy was 30 eV. Note that the results in FIGS. 20A and 20B show that the plurality of product ions detected around m/z=512, m/z=375, m/z=361, and m/z=335 were derived from FrBiF-02, and the results can be regarded as important data in identification of FrBiF-02 contained in a mixture.

The product ion around m/z=512 is presumed to be a cation in the state where a methyl group was eliminated from FrBiF-02, which suggests that FrBiF-02 has a methyl group.

The product ion around m/z=375 is presumed to be a cation in the state where a biphenyl group was eliminated from FrBiF-02, which suggests that FrBiF-02 has a biphenyl group.

The product ion around m/z=361 is presumed to be a cation in the state where a dibenzofuranyl group was eliminated from FrBiF-02, which suggests that FrBiF-02 has a dibenzofuranyl group.

The product ion around m/z=335 is presumed to be a cation in the state where a dimethylfluorenyl group was eliminated from FrBiF-02, which suggests that FrBiF-02 has a dimethylfluorenyl group.

EXAMPLE 5

In this example, description will be given of a light-emitting element 2 (Element 2) using N-(4-biphenyl)-N-(9,9-dimethyl-9H-fluoren-2-yl)dibenzofuran-2-amine (abbreviation: FrBiF-02 (Structural Formula (103)), which is the organic compound of one embodiment of the present invention, in a hole-transport layer and a light-emitting layer with reference to FIG. 10 as in Example 2. Chemical formulae of materials used in this example are shown below.

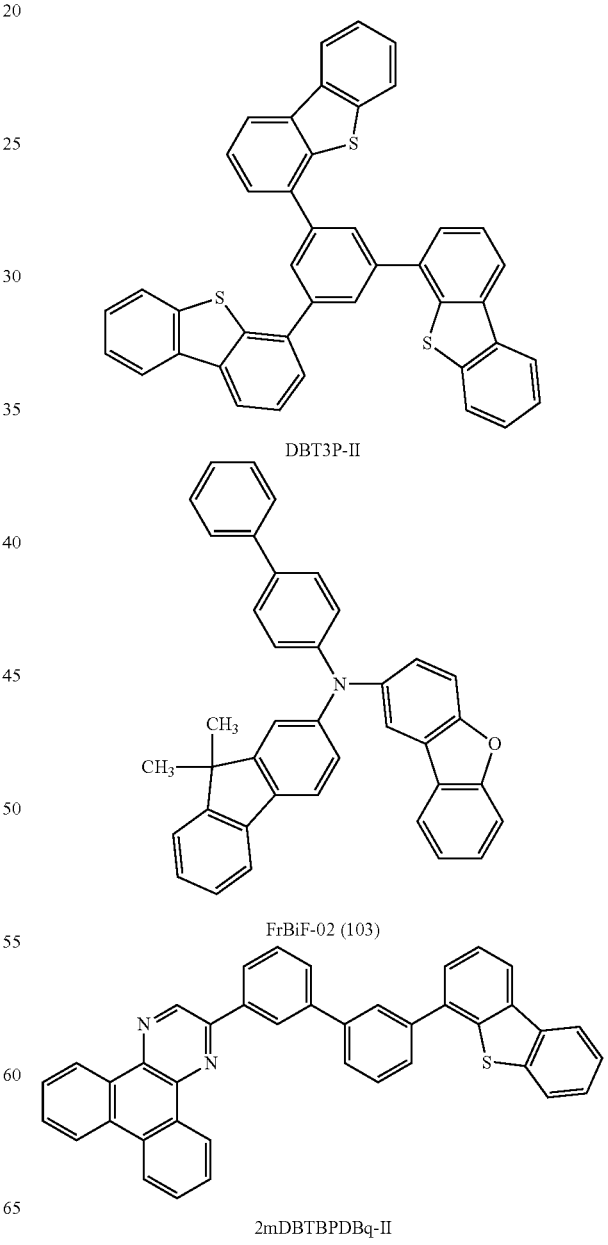

DBT3P-II

FrBiF-02 (103)

2mDBTBPDBq-II

-continued

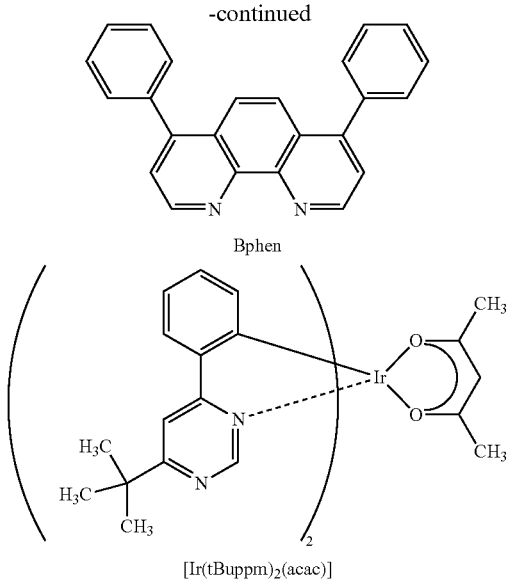

Bphen

[Ir(tBuppm)₂(acac)]

<<Fabrication of Light-Emitting Element 2>>

First, indium tin oxide containing silicon oxide (ITSO) was deposited over the glass substrate 1100 by a sputtering method, so that the first electrode 1101 which functions as an anode was formed. The thickness was 110 nm and the electrode area was 2 mm×2 mm.

Then, as pretreatment for forming the light-emitting element 2 over the substrate 1100, UV ozone treatment was performed for 370 seconds after washing a surface of the substrate with water and baking the substrate at 200° C. for 1 hour.

After that, the substrate was transferred into a vacuum evaporation apparatus where the pressure was reduced to approximately $10^{-4}$ Pa, and was subjected to vacuum baking at 170° C. for 30 minutes in a heating chamber of the vacuum evaporation apparatus, and then the substrate 1100 was cooled down for approximately 30 minutes.

Next, the substrate 1100 was fixed to a holder provided in the vacuum evaporation apparatus so that a surface of the substrate 1100 over which the first electrode 1101 was formed faced downward. In this example, a case will be described in which the hole-injection layer 1111, the hole-transport layer 1112, the light-emitting layer 1113, the electron-transport layer 1114, and the electron-injection layer 1115 which are included in the EL layer 1102 are sequentially formed by a vacuum evaporation method.

After reducing the pressure of the vacuum evaporation apparatus to $10^{-4}$ Pa, 1,3,5-tri(dibenzothiophen-4-yl)benzene (abbreviation: DBT3P-II) and molybdenum(VI) oxide were co-deposited by evaporation with a mass ratio of DBT3P-II to molybdenum oxide being 4:2, whereby the hole-injection layer 1111 was formed over the first electrode 1101. The thickness of the hole-injection layer 1111 was 20 nm.

Then, FrBiF-02 was deposited by evaporation to a thickness of 20 nm, so that the hole-transport layer 1112 was formed.

Next, the light-emitting layer 1113 was formed over the hole-transport layer 1112 in the following manner: 2-[3′-(dibenzothiophen-4-yl)biphenyl-3-yl]dibenzo[f,h]quinoxaline (abbreviation: 2mDBTBPDBq-II), FrBiF-02, and (acetylacetonato)bis(6-tert-butyl-4-phenylpyrimidinato)iridium(III) (abbreviation: [Ir(tBuppm)₂(acac)]) were co-deposited by evaporation to a thickness of 20 nm with a mass ratio of 2mDBTBPDBq-II to FrBiF-02 and [Ir(tBuppm)₂(acac)] being 0.7:0.3:0.05; then, 2mDBTBPDBq-II, FrBiF-02, and [Ir(tBuppm)₂(acac)] were co-deposited by evaporation to a thickness of 20 nm with a mass ratio of 2mDBTBPDBq-II to FrBiF-02 and [Ir(tBuppm)₂(acac)] being 0.8:0.2:0.05.

Then, over the light-emitting layer 1113, 2mDBTBPDBq-II was deposited by evaporation to a thickness of 20 nm and then bathophenanthroline (abbreviation: Bphen) was deposited by evaporation to a thickness of 10 nm, whereby the electron-transport layer 1114 was formed. Furthermore, lithium fluoride was deposited by evaporation to a thickness of 1 nm over the electron-transport layer 1114, whereby the electron-injection layer 1115 was formed.

Finally, aluminum was deposited by evaporation to a thickness of 200 nm over the electron-injection layer 1115 to form a second electrode 1103 serving as a cathode; thus, the light-emitting element 2 was obtained. Note that in all the above evaporation steps, evaporation was performed by a resistance-heating method.

The element structure of the light-emitting element 2 obtained as described above is shown in Table 3.

TABLE 3

Structure of Light-emitting Element 2 (Element 2)

| First Electrode | HIL[a] | HTL[b] | LEL[c] | | ETL[d] | | EIL[e] | Second Electrode |
|---|---|---|---|---|---|---|---|---|
| | | | 1st | 2nd | 1st | 2nd | | |
| ITSO (110 nm) | DBT3P-II:MoO$_x$ (4:2 20 nm) | FrBiF-02 (20 nm) | [f] | [g] | 2mDBTBPDBq-II (20 nm) | Bphen (10 nm) | LiF (1 nm) | Al (200 nm) |

[a]Hole-injection layer.
[b]Hole-transport layer.
[c]Light-emitting layer.
[d]Electron-transport layer.
[e]Electron-injection layer.
[f]2mDBTBPDBq-II:FrBiF-02:[Ir(tBuppm)₂(acac)] = 0.7:0.3:0.05 (20 nm).
[g]2mDBTBPDBq-II:FrBiF-02:[Ir(tBuppm)₂(acac)] = 0.8:0.2:0.05 (20 nm).

Further, the fabricated light-emitting element 2 was sealed in a glove box containing a nitrogen atmosphere so as not to be exposed to the air (specifically, a sealant was applied onto an outer edge of the element and heat treatment was performed at 80° C. for 1 hour at the time of sealing).

<<Operation Characteristics of Light-Emitting Element 2>>

Operation characteristics of the light-emitting element 2 were measured. Note that the measurement was carried out at room temperature (under an atmosphere in which the temperature was kept at 25° C.).

Figure 21:
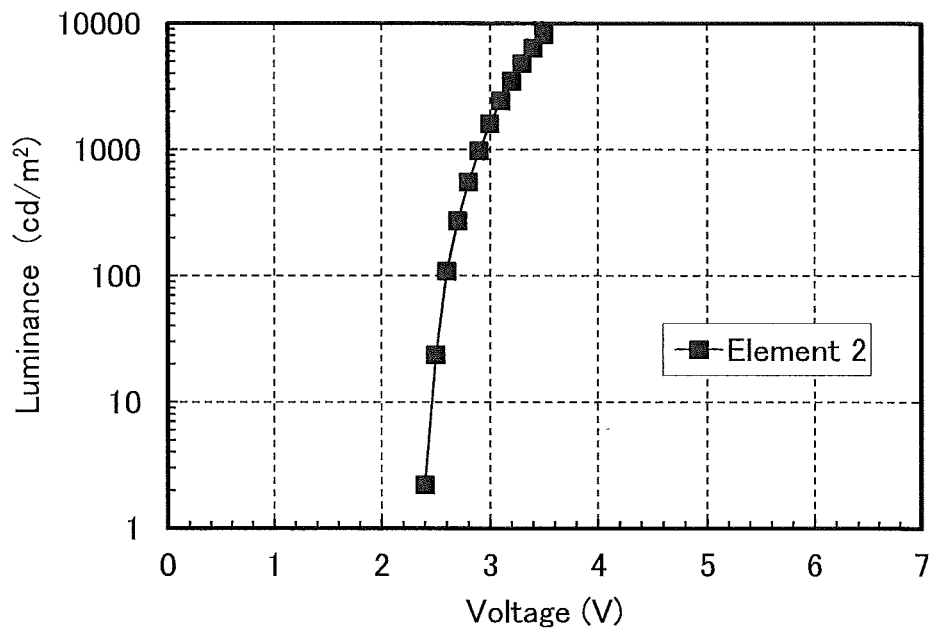
FIG. 21 shows voltage-luminance characteristics of a light-emitting element 2 (Element 2).
Figure 22:
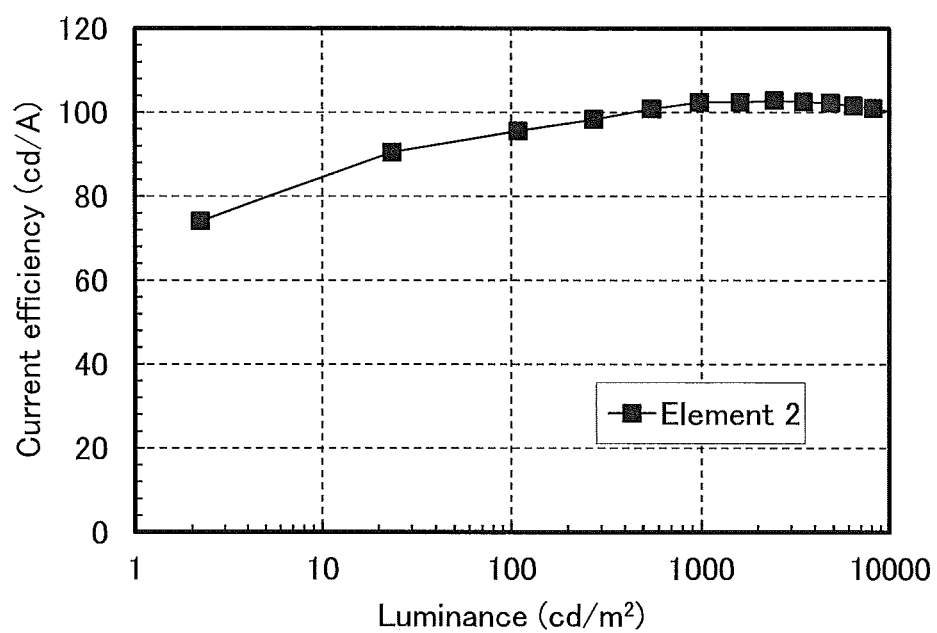
FIG. 22 shows luminance-current efficiency characteristics of a light-emitting element 2.
Figure 23:
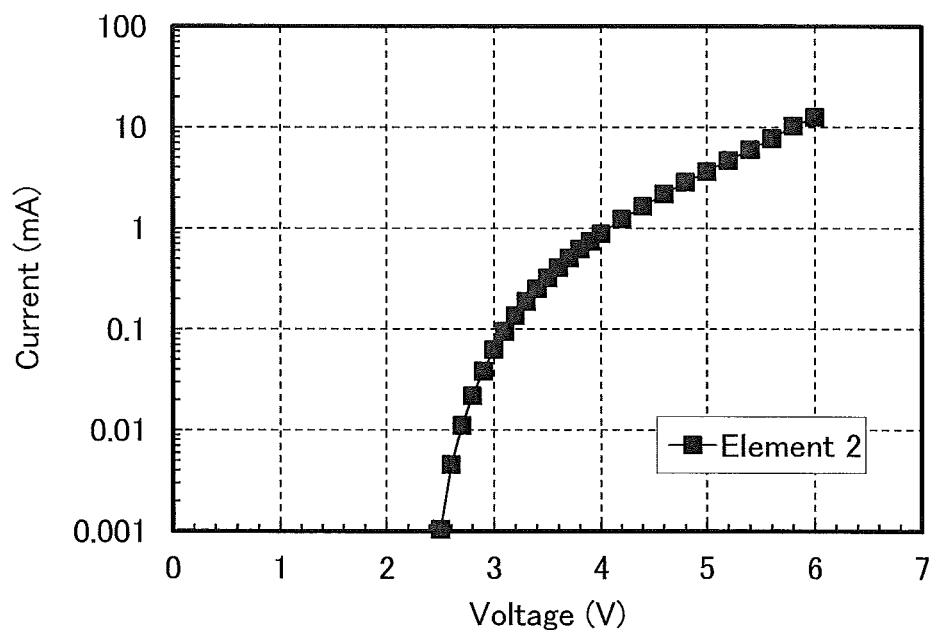
FIG. 23 shows voltage-current characteristics of a light-emitting element 2.

FIG. 21 shows voltage-luminance characteristics of the light-emitting element 2. In FIG. 21, the vertical axis represents luminance (cd/m²) and the horizontal axis represents voltage (V). Further, FIG. 22 shows luminance-current efficiency characteristics of the light-emitting element 2. In FIG. 22, the vertical axis represents current efficiency (cd/A) and the horizontal axis represents luminance (cd/m²). FIG. 23 shows voltage-current characteristics of the light-emitting element 2. In FIG. 23, the vertical axis represents current (mA) and the horizontal axis represents voltage (V).

FIG. 22 reveals that the light-emitting element 2 of one embodiment of the present invention has high efficiency. Table 4 shows initial main characteristics of the light-emitting element 2 at a luminance of approximately 1000 cd/m².

TABLE 4

Initial main characteristics of Light-emitting Element 2 (Element 2)

| Voltage (V) | Current (mA) | Current Density (mA/cm²) | Chromaticity (x, y) | Luminance (cd/m²) | Current Efficiency (cd/A) | Power Efficiency (lm/W) | External Quantum Efficiency (%) |
|---|---|---|---|---|---|---|---|
| 2.9 | 0.04 | 0.96 | (0.41, 0.58) | 980 | 100 | 110 | 27 |

The above results show that the light-emitting element 2 fabricated in this example is a light-emitting element having high current efficiency. Moreover, it can be found that the light-emitting element exhibits yellowish green light emission with excellent color purity.

Figure 24:
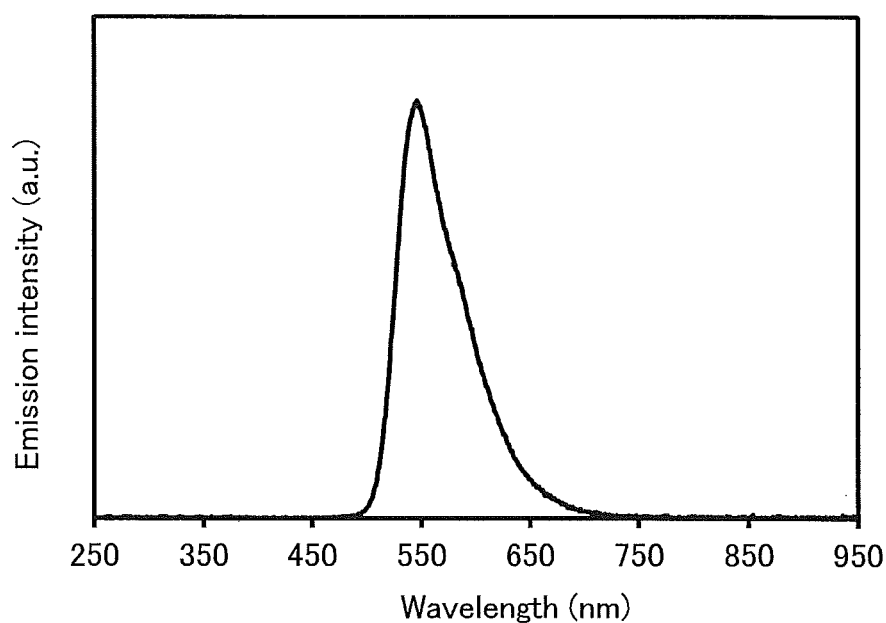
FIG. 24 shows an emission spectrum of a light-emitting element 2.

FIG. 24 shows an emission spectrum when a current at a current density of 25 mA/cm² was supplied to the light-emitting element 2. As shown in FIG. 24, the emission spectrum of the light-emitting element 2 has a peak at 550 nm and it is suggested that the peak is derived from emission of the organometallic complex [Ir(tBuppm)₂(acac)].

This application is based on Japanese Patent Application serial no. 2013-062142 filed with Japan Patent Office on Mar. 25, 2013, the entire contents of which are hereby incorporated by reference.

What is claimed is:

1. An organic compound represented by Formula (G1):

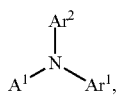

(G1)

wherein:
Ar¹ represents a substituted or unsubstituted fluorenyl group;
Ar² represents a substituted or unsubstituted aryl group having 6 to 13 carbon atoms;
A¹ represents any one of a substituted or unsubstituted dibenzofuranyl group and a substituted or unsubstituted dibenzothiophenyl group; and
a substituent on the substituted fluorenyl group, the substituted aryl group, the substituted dibenzofuranyl group, or the substituted dibenzothiophenyl group is selected from an alkyl group having 1 to 4 carbon atoms and an aryl group having 6 to 13 carbon atoms except a heteroaryl group.

2. The organic compound according to claim 1, wherein:
the organic compound is represented by Formula (G2):

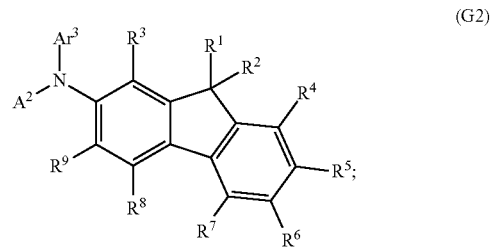

(G2)

Ar³ represents a substituted or unsubstituted aryl group having 6 to 13 carbon atoms;
A² represents any one of a substituted or unsubstituted dibenzofuranyl group and a substituted or unsubstituted dibenzothiophenyl group;
R¹ to R⁹ separately represent any one of hydrogen, an alkyl group having 1 to 4 carbon atoms, and an aryl group having 6 to 13 carbon atoms; and
a substituent on the substituted aryl group, the substituted dibenzofuranyl group, or the substituted dibenzothiophenyl group is selected from an alkyl group having 1 to 4 carbon atoms and an aryl group having 6 to 13 carbon atoms except a heteroaryl group.

3. The organic compound according to claim 1, wherein:
the organic compound is represented by Formula (G3):

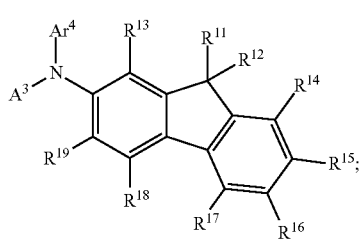

(G3)

Ar⁴ represents a substituted or unsubstituted biphenyl group;
A³ represents any one of a substituted or unsubstituted dibenzofuranyl group and a substituted or unsubstituted dibenzothiophenyl group;
R¹¹ to R¹⁹ separately represent any one of hydrogen, an alkyl group having 1 to 4 carbon atoms, and an aryl group having 6 to 13 carbon atoms; and
a substituent on the substituted biphenyl group, the substituted dibenzofuranyl group, or the substituted dibenzothiophenyl group is selected from an alkyl group having 1 to 4 carbon atoms and an aryl group having 6 to 13 carbon atoms except a heteroaryl group.

4. The organic compound according to claim 1, wherein:
the organic compound is represented by Formula (G4):

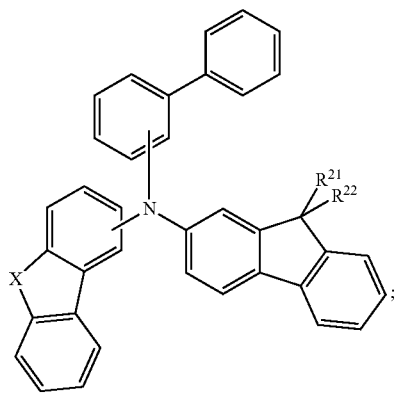

(G4)

X represents any one of oxygen and sulfur; and
$R^{21}$ and $R^{22}$ separately represent any one of hydrogen, an alkyl group having 1 to 4 carbon atoms, and an aryl group having 6 to 13 carbon atoms.

5. The organic compound according to claim 1, wherein $Ar^2$ is selected from substituents represented by Formulae (1-1) to (1-11):

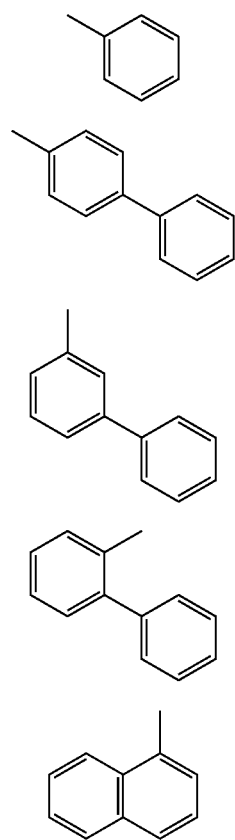

(1-1)
(1-2)
(1-3)
(1-4)
(1-5)

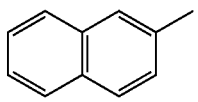

(1-6)

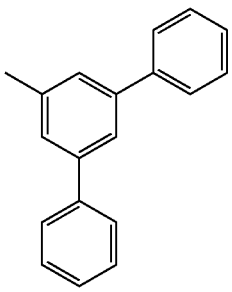

(1-7)

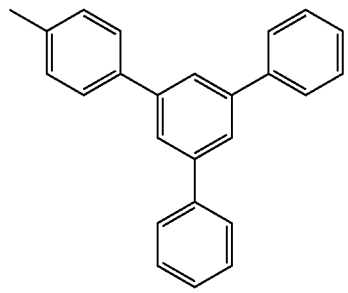

(1-8)

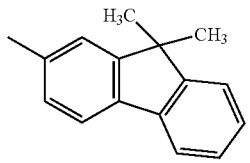

(1-9)

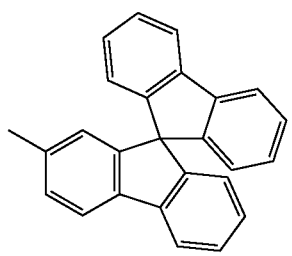

(1-10)

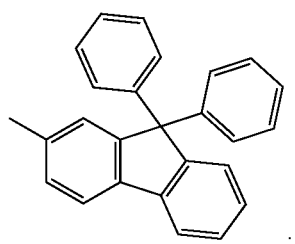

(1-11)

6. The organic compound according to claim 2, wherein Ar³ is selected from substituents represented by Formulae (1-1) to (1-11):
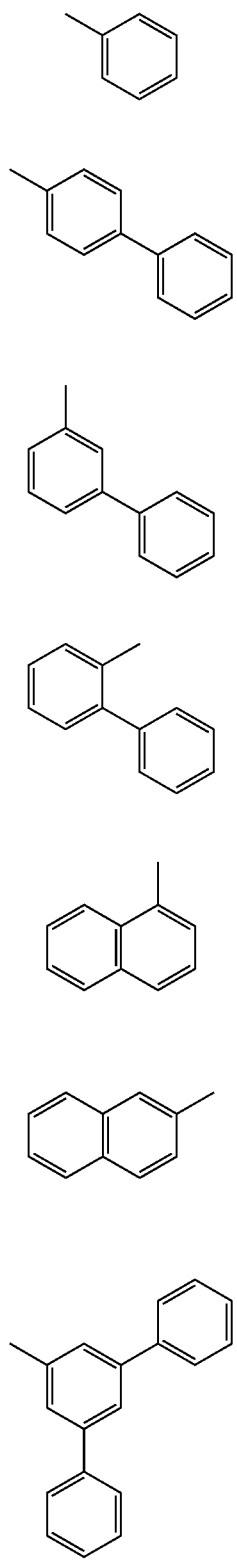
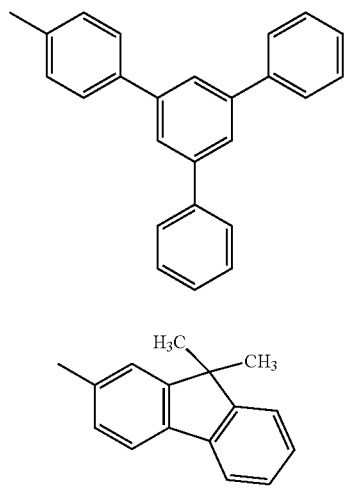
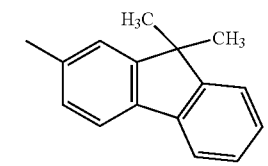
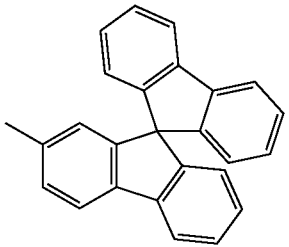
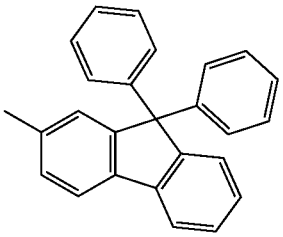
7. The organic compound according to claim 1, wherein the organic compound is represented by any one of Formulae (100) and (103):
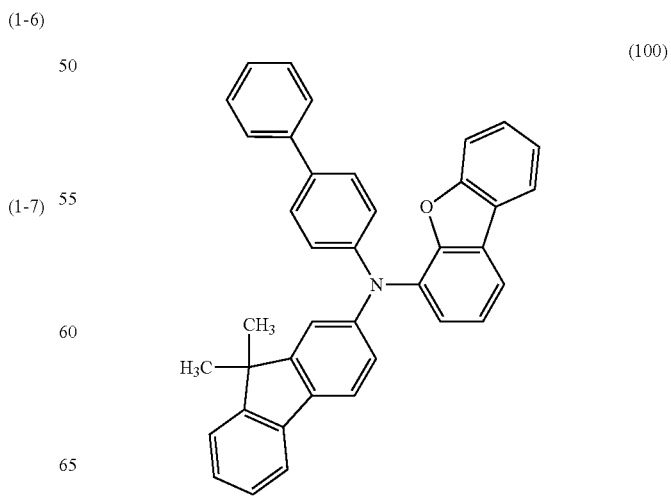

(103)

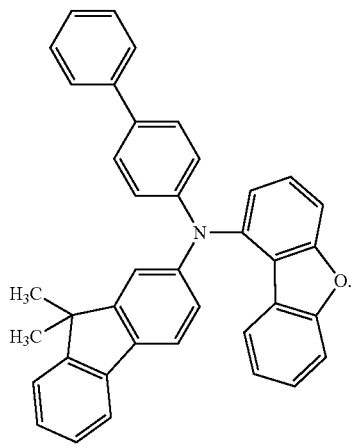

8. A light-emitting device comprising:
a first electrode and a second electrode; and
a layer between the first electrode and the second electrode, the layer including an organic compound,
wherein:
the organic compound is represented by Formula (G1):

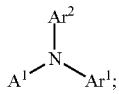

(G1)

$Ar^1$ represents a substituted or unsubstituted fluorenyl group;
$Ar^2$ represents a substituted or unsubstituted aryl group having 6 to 13 carbon atoms;
$A^1$ represents any one of a substituted or unsubstituted dibenzofuranyl group and a substituted or unsubstituted dibenzothiophenyl group; and
a substituent on the substituted fluorenyl group, the substituted aryl group, the substituted dibenzofuranyl group, and the substituted dibenzothiophenyl group is selected from an alkyl group having 1 to 4 carbon atoms and an aryl group having 6 to 13 carbon atoms except a heteroaryl group.

9. The light-emitting device according to claim 8,
wherein:
the organic compound is represented by Formula (G2):

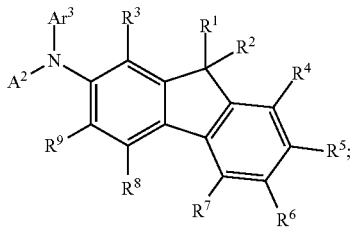

(G2)

$Ar^3$ represents a substituted or unsubstituted aryl group having 6 to 13 carbon atoms;
$A^2$ represents any one of a substituted or unsubstituted dibenzofuranyl group and a substituted or unsubstituted dibenzothiophenyl group;
$R^1$ to $R^9$ separately represent any one of hydrogen, an alkyl group having 1 to 4 carbon atoms, and an aryl group having 6 to 13 carbon atoms; and
a substituent on the substituted aryl group, the substituted dibenzofuranyl group, and the substituted dibenzothiophenyl group is selected from an alkyl group having 1 to 4 carbon atoms and an aryl group having 6 to 13 carbon atoms except a heteroaryl group.

10. The light-emitting device according to claim 8,
wherein:
the organic compound is represented by Formula (G3):

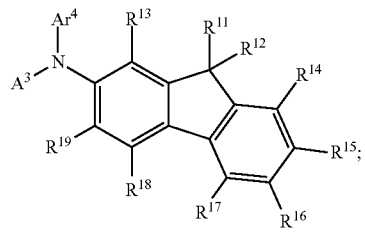

(G3)

$Ar^4$ represents a substituted or unsubstituted biphenyl group;
$A^3$ represents any one of a substituted or unsubstituted dibenzofuranyl group and a substituted or unsubstituted dibenzothiophenyl group;
$R^{11}$ to $R^{19}$ separately represent any one of hydrogen, an alkyl group having 1 to 4 carbon atoms, and an aryl group having 6 to 13 carbon atoms; and
a substituent on the substituted biphenyl group, the substituted dibenzofuranyl group, and the substituted dibenzothiophenyl group is selected from an alkyl group having 1 to 4 carbon atoms and an aryl group having 6 to 13 carbon atoms except a heteroaryl group.

11. The light-emitting device according to claim 8,
wherein:
the organic compound is represented by Formula (G4):

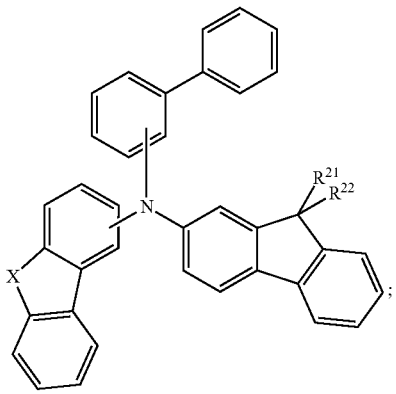

(G4)

X represents any one of oxygen and sulfur; and
$R^{21}$ and $R^{22}$ separately represent any one of hydrogen, an alkyl group having 1 to 4 carbon atoms, and an aryl group having 6 to 13 carbon atoms.

12. The light-emitting device according to claim 8, wherein Ar² is selected from substituents represented by Formulae (1-1) to (1-11):
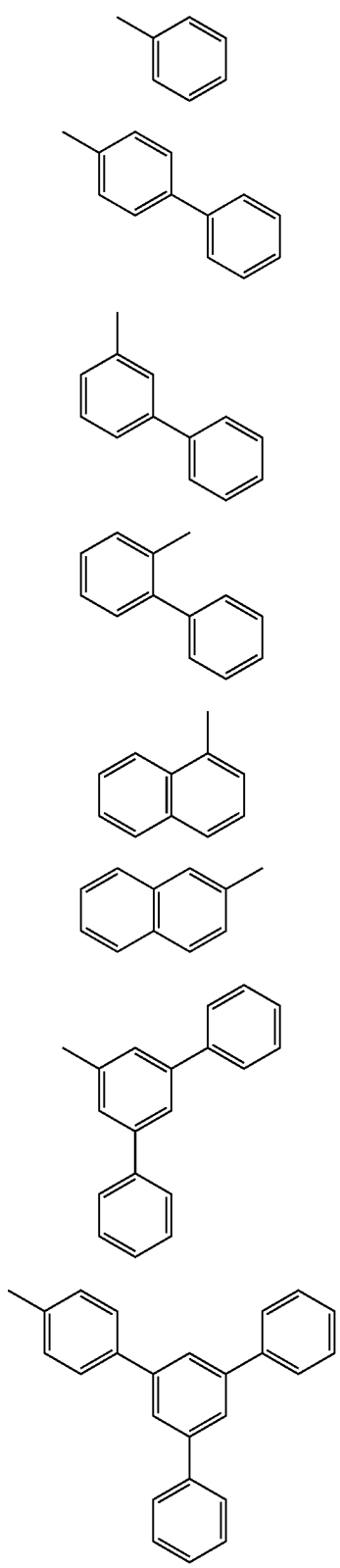
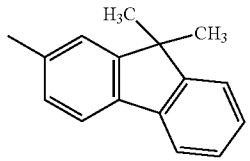
(1-9)
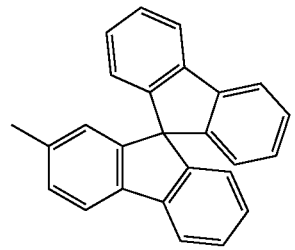
(1-10)
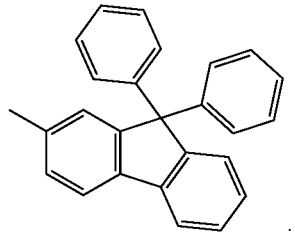
(1-11)
13. The light-emitting device according to claim 9, wherein Ar³ is selected from any of substituents represented by Formulae (1-1) to (1-11):
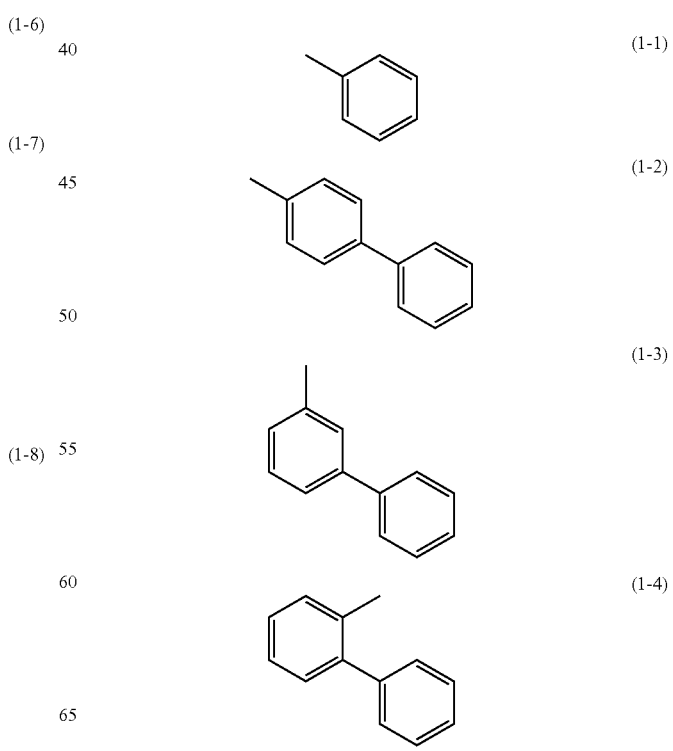

-continued

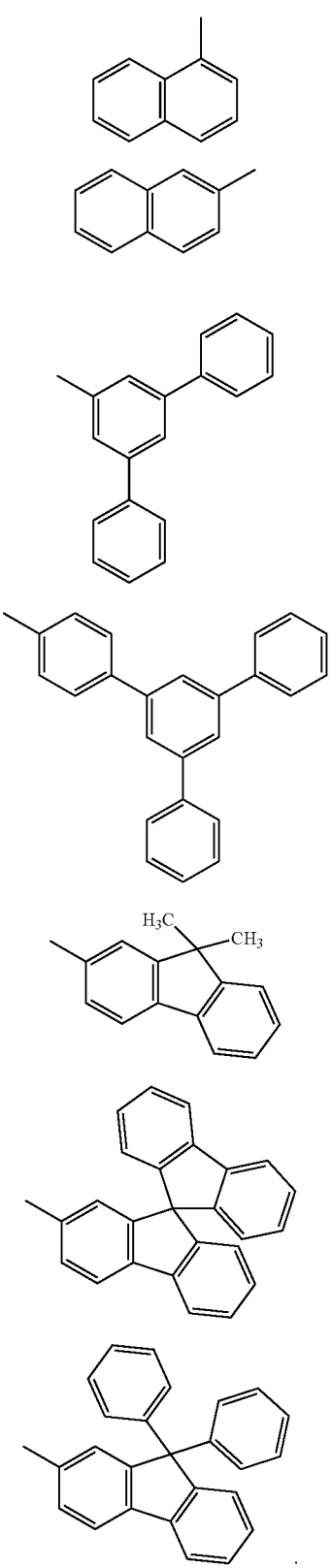

(1-5)
(1-6)
(1-7)
(1-8)
(1-9)
(1-10)
(1-11)

14. The light-emitting device according to claim 8, wherein the organic compound is represented by any one of Formulae (100) and (103):

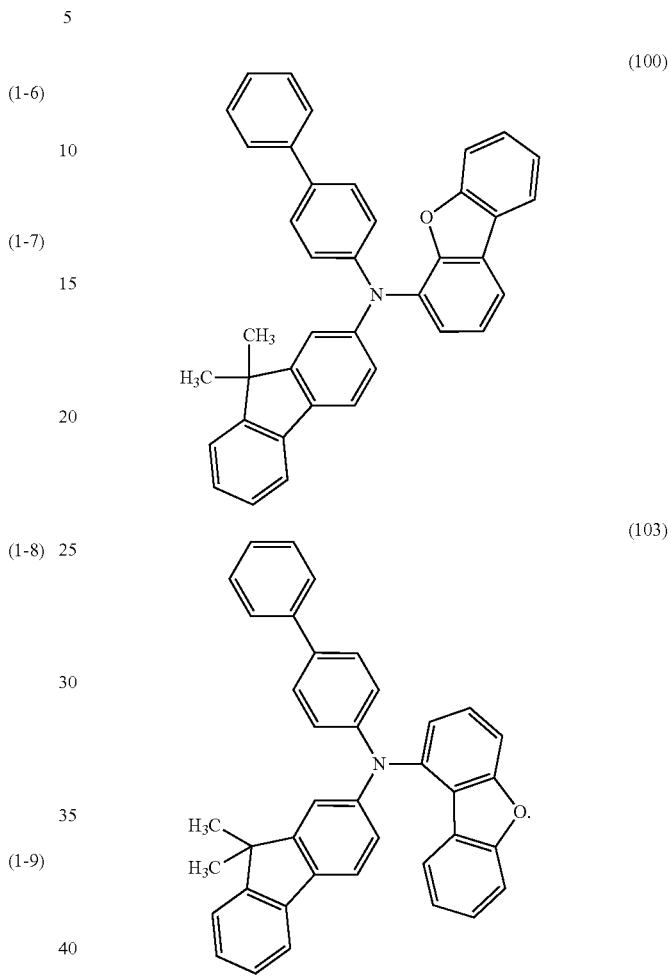

15. The light-emitting device according to claim 8, wherein the layer further comprises a phosphorescent compound.

16. The light-emitting device according to claim 8, wherein the layer further comprises a second organic compound and a phosphorescent compound, and wherein the second organic compound forms an exciplex with the organic compound.

17. The light-emitting device according to claim 16, wherein emission of the exciplex overlaps with an absorption band of the phosphorescent compound, which is located on the longest wavelength side.

18. An electronic device comprising the light-emitting device according to claim 8.

19. A lighting device comprising the light-emitting device according to claim 8.

* * * * *

(12) EX PARTE REEXAMINATION CERTIFICATE (12312th)
United States Patent
Takeda et al.

(10) Number: US 9,496,503 C1
(45) Certificate Issued: Jun. 7, 2023

(54) ORGANIC COMPOUND, LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Kyoko Takeda, Kanagawa (JP); Satoshi Seo, Kanagawa (JP); Hiromi Seo, Kanagawa (JP); Tatsuyoshi Takahashi, Kanagawa (JP)

(73) Assignee: Semiconductor Energy Laboratory Co., Ltd.

Reexamination Request:
No. 90/014,782, Jun. 24, 2021

Reexamination Certificate for:
Patent No.: 9,496,503
Issued: Nov. 15, 2016
Appl. No.: 14/220,398
Filed: Mar. 20, 2014

(30) Foreign Application Priority Data

Mar. 25, 2013 (JP) ................. 2013-062142

(51) Int. Cl.
*H10K 85/60* (2023.01)
*H10K 101/10* (2023.01)
*H10K 50/11* (2023.01)

(52) U.S. Cl.
CPC ......... *H10K 85/633* (2023.02); *H10K 85/615* (2023.02); *H10K 85/636* (2023.02); *H10K 85/6574* (2023.02); *H10K 50/11* (2023.02); *H10K 85/6576* (2023.02); *H10K 2101/10* (2023.02)

(58) Field of Classification Search
None
See application file for complete search history.

(56) References Cited

To view the complete listing of prior art documents cited during the proceeding for Reexamination Control Number 90/014,782, please refer to the USPTO's Patent Electronic System.

*Primary Examiner* — Alan D Diamond

(57) ABSTRACT

An organic compound having a low HOMO level and a high hole-transport property is provided. The organic compound is represented by Formula (G1), where $Ar^1$ represents a substituted or unsubstituted fluorenyl group, $Ar^2$ represents a substituted or unsubstituted aryl group having 6 to 13 carbon atoms, and $A^1$ represents any one of a substituted or unsubstituted dibenzofuranyl group and a substituted or unsubstituted dibenzothiophenyl group. The low HOMO level and the high hole-transport property of the organic compound allow the formation of an exciplex with another organic compound, which leads to a highly efficient light-emitting element in the presence of a phosphorescent compound due to the effective overlapping between the emission of the exciplex and the longest absorption band of the phosphorescent compound.

(G1)

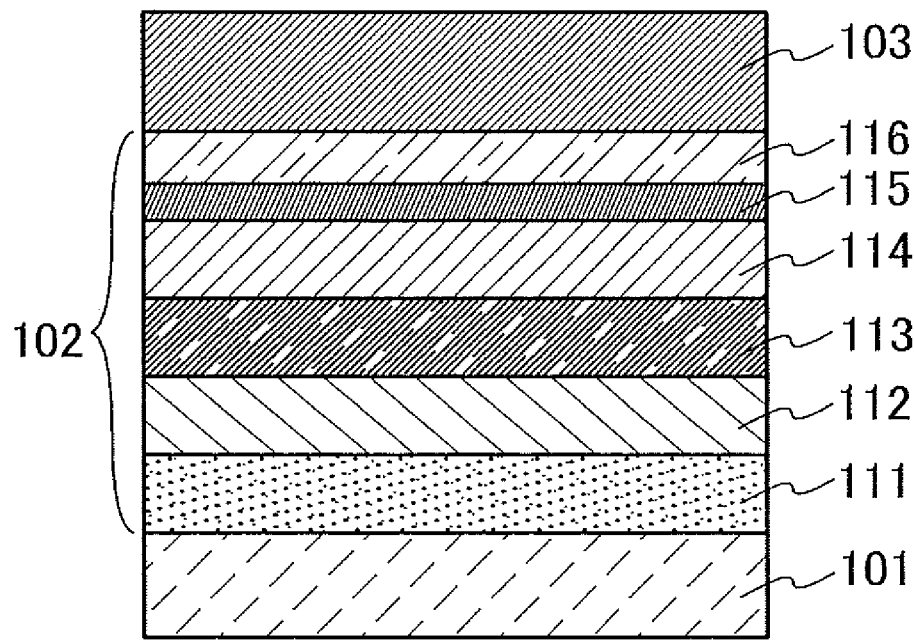

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-19 are cancelled.

New claims 20-28 are added and determined to be patentable.

20. *A light-emitting device comprising:*
*a first electrode and a second electrode;*
*a first light-emitting layer, a second light-emitting layer, and a third light-emitting layer, all between the first electrode and the second electrode;*
*a charge generation layer between the first light-emitting layer and the second light-emitting layer; and*
*a layer between the first electrode and the second electrode, the layer including an organic compound,*
*wherein:*
*the organic compound is represented by Formula (G1):*

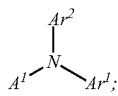

(G1)

*$Ar^1$ represents a substituted or unsubstituted fluorenyl group;*
*$Ar^2$ represents a substituted or unsubstituted aryl group having 6 to 13 carbon atoms;*
*$A^1$ represents any one of a substituted or unsubstituted dibenzofuranyl group and a substituted or unsubstituted dibenzothiophenyl group; and*
*a substituent on the substituted fluorenyl group, the substituted aryl group, the substituted dibenzofuranyl group, and the substituted dibenzothiophenyl group is selected from an alkyl group having 1 to 4 carbon atoms and an aryl group having 6 to 13 carbon atoms, wherein the aryl group is not a heteroaryl group,*
*wherein the second light-emitting layer and the third light-emitting layer are in direct contact with each other.*

21. *The light-emitting device according to claim 20, wherein:*
*the organic compound is represented by Formula (G2):*

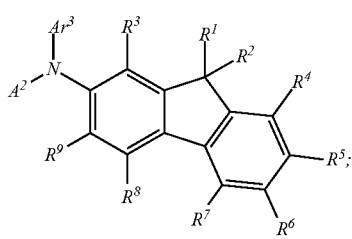

(G2)

*$Ar^3$ represents a substituted or unsubstituted aryl group having 6 to 13 carbon atoms;*
*$A^2$ represents any one of a substituted or unsubstituted dibenzofuranyl group and a substituted or unsubstituted dibenzothiophenyl group;*
*$R^1$ to $R^9$ separately represent any one of hydrogen, an alkyl group having 1 to 4 carbon atoms, and an aryl group having 6 to 13 carbon atoms; and*
*a substituent on the substituted aryl group, the substituted dibenzofuranyl group, and the substituted dibenzothiophenyl group is selected from an alkyl group having 1 to 4 carbon atoms and an aryl group having 6 to 13 carbon atoms, wherein the aryl group is not a heteroaryl group.*

22. *The light-emitting device according to claim 20, wherein:*
*the organic compound is represented by Formula (G3):*

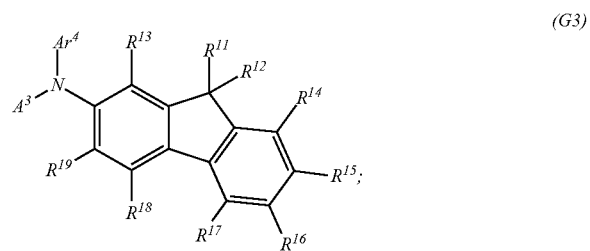

(G3)

*$Ar^4$ represents a substituted or unsubstituted biphenyl group;*
*$A^3$ represents any one of a substituted or unsubstituted dibenzofuranyl group and a substituted or unsubstituted dibenzothiophenyl group;*
*$R^{11}$ to $R^{19}$ separately represent any one of hydrogen, an alkyl group having 1 to 4 carbon atoms, and an aryl group having 6 to 13 carbon atoms; and*
*a substituent on the substituted biphenyl group, the substituted dibenzofuranyl group, and the substituted dibenzothiophenyl group is selected from an alkyl group having 1 to 4 carbon atoms and an aryl group having 6 to 13 carbon atoms, wherein the aryl group is not a heteroaryl group.*

23. *The light-emitting device according to claim 20, wherein:*
*the organic compound is represented by Formula (G4):*

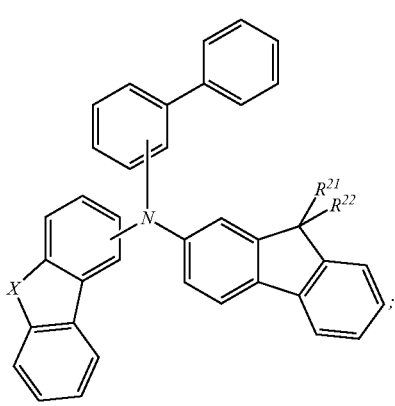

(G4)

$X$ represents any one of oxygen and sulfur; and $R^{21}$ and $R^{22}$ separately represent any one of hydrogen, an alkyl group having 1 to 4 carbon atoms, and an aryl group having 6 to 13 carbon atoms.

24. The light-emitting device according to claim 20, wherein $Ar^2$ is selected from substituents represented by Formulae (1-1) to (1-11):

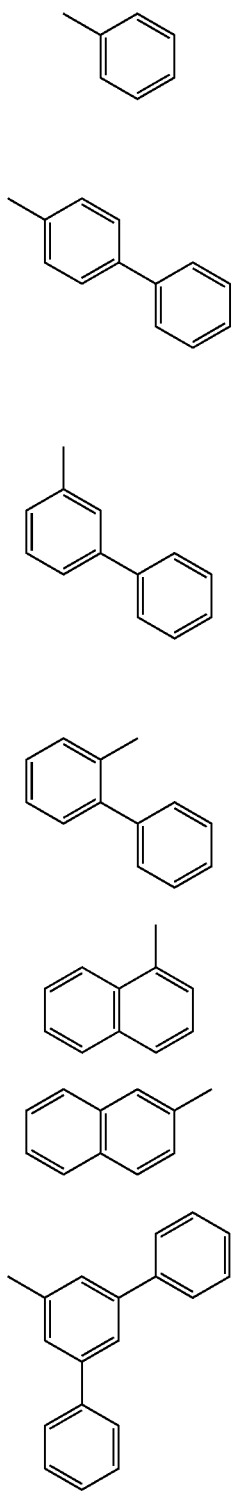

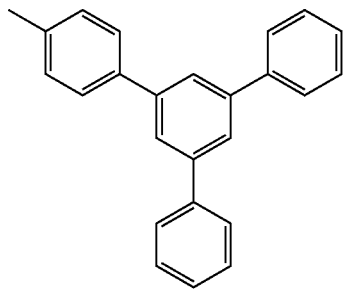

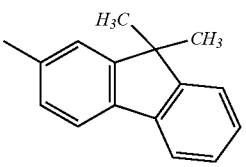

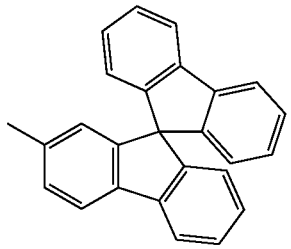

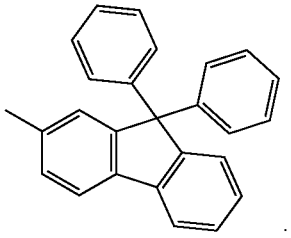

25. The light-emitting device according to claim 21, wherein $Ar^3$ is selected from any of substituents represented by Formulae (1-1) to (1-11):

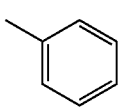

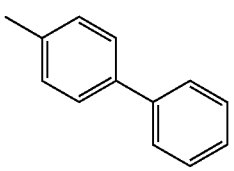

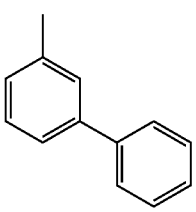

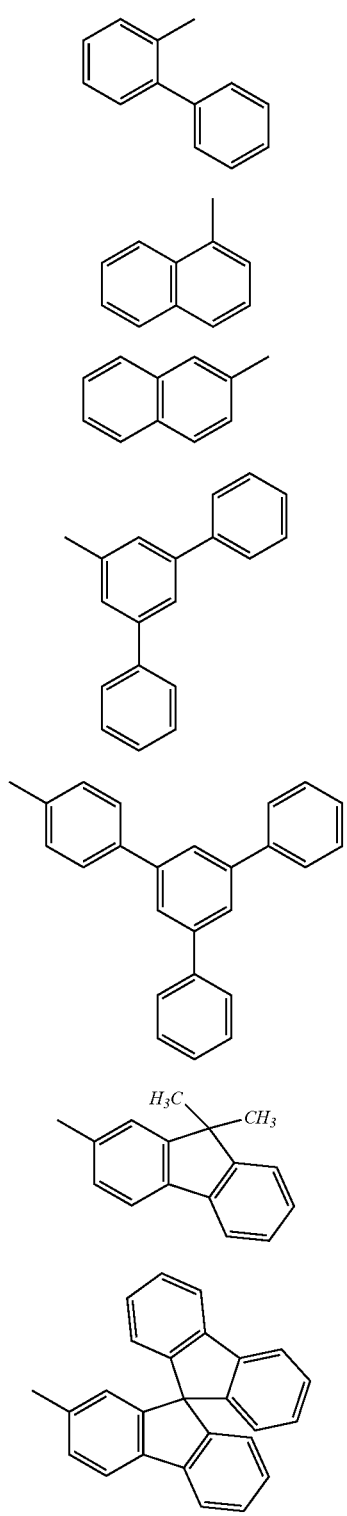
(1-4)
(1-5)
(1-6)
(1-7)
(1-8)
(1-9)
(1-10)
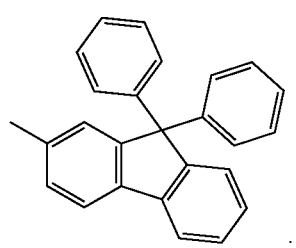
(1-11)
26. The light-emitting device according to claim 20, wherein the organic compound is represented by any one of Formulae (100) and (103):
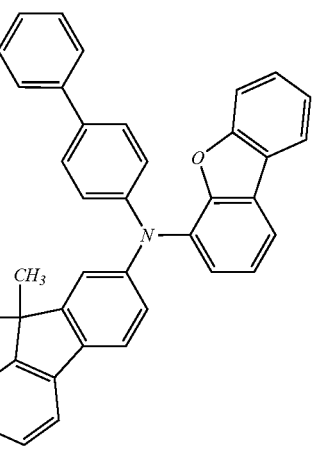
(100)
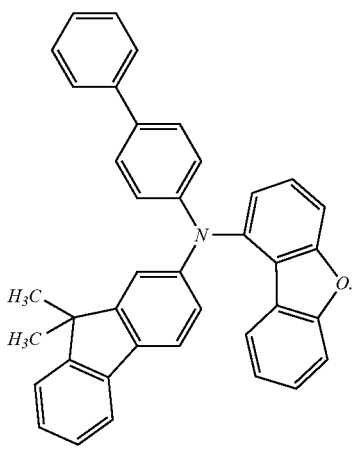
(103)
27. An electronic device comprising the light-emitting device according to claim 20.
28. A lighting device comprising the light-emitting device according to claim 20.
* * * * *